(12) United States Patent
Wang et al.

(10) Patent No.: US 10,044,327 B2
(45) Date of Patent: Aug. 7, 2018

(54) FAST SETTLING CAPACITIVE GAIN AMPLIFIER CIRCUIT

(71) Applicant: Analog Devices Global, Hamilton (BM)

(72) Inventors: Hanqing Wang, Beijing (CN); Gerard Mora-Puchalt, Catarroja (ES)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/600,484

(22) Filed: May 19, 2017

(65) Prior Publication Data
US 2018/0076779 A1 Mar. 15, 2018

Related U.S. Application Data

(60) Provisional application No. 62/385,761, filed on Sep. 9, 2016.

(51) Int. Cl.
*H03F 3/00* (2006.01)
*H03F 1/02* (2006.01)
(Continued)

(52) U.S. Cl.
CPC ............. *H03F 3/005* (2013.01); *H03F 1/02* (2013.01); *H03F 1/14* (2013.01); *H03F 1/3211* (2013.01);
(Continued)

(58) Field of Classification Search
CPC .................................................. H03F 3/45892
(Continued)

(56) References Cited

U.S. PATENT DOCUMENTS 5,847,600 A * 12/1998 Brooks ................... H03F 3/005
330/253
7,092,980 B1 8/2006 Mar et al.
(Continued)

FOREIGN PATENT DOCUMENTS

| CN | 102611399 A | 7/2012 |
| EP | 2192687 B1 | 3/2014 |
| EP | 2367285 B1 | 5/2016 |

OTHER PUBLICATIONS

"4-Channel, Low Noise, Low Power, 24-Bit, Sigma-Delta ADC with PGA and Reference", Analog Devices Data Sheet AD7124-4, (2016), 91 pgs.
(Continued)

*Primary Examiner* — Henry Choe
(74) *Attorney, Agent, or Firm* — Schwegman Lundberg & Woessner, P.A.

(57) ABSTRACT

A capacitive gain amplifier circuit includes two sets of Miller capacitors and two output stage differential amplifier circuits. A first set of Miller capacitors is used to compensate the first output stage differential amplifier circuit during a first phase that resets the first output stage differential amplifier circuit. The second set of Miller capacitors is used to compensate the first output stage differential amplifier circuit during a second phase that chops a signal being amplified. The second set of Miller capacitors is swapped from one polarity to an opposite polarity of the first output stage differential amplifier circuit during successive second phases. The second output stage differential amplifier circuit includes a set of inputs selectively coupled with the inputs of the first output stage differential amplifier circuit and a set of outputs selectively coupled with the outputs of the first output stage differential amplifier circuit during the second phase.

20 Claims, 32 Drawing Sheets

(51) Int. Cl.
*H03F 1/32* (2006.01)
*H03F 1/56* (2006.01)
*H03F 3/393* (2006.01)
*H03F 3/42* (2006.01)
*H03F 3/45* (2006.01)
*H03F 1/14* (2006.01)
*H03F 3/387* (2006.01)
*H03M 3/00* (2006.01)

(52) U.S. Cl.
CPC ............... *H03F 1/56* (2013.01); *H03F 3/387* (2013.01); *H03F 3/393* (2013.01); *H03F 3/426* (2013.01); *H03F 3/45071* (2013.01); *H03F 3/45475* (2013.01); *H03M 3/00* (2013.01); *H03F 2200/213* (2013.01); *H03F 2200/267* (2013.01); *H03F 2200/271* (2013.01); *H03F 2200/378* (2013.01); *H03F 2203/45458* (2013.01); *H03F 2203/45514* (2013.01)

(58) Field of Classification Search
USPC ...................................................... 330/9, 252
See application file for complete search history.

(56) References Cited

U.S. PATENT DOCUMENTS

| | | | | |
|---|---|---|---|---|
| 7,132,883 | B2* | 11/2006 | Huijsing | H03F 3/005 330/9 |
| 7,233,198 | B2* | 6/2007 | Niederkorn | H03F 1/02 330/311 |
| 8,390,372 | B2* | 3/2013 | Buter | H03F 3/005 330/9 |
| 8,395,448 | B2 | 3/2013 | Ivanov et al. | |
| 8,791,754 | B2 | 7/2014 | Lyden et al. | |
| 2012/0104228 | A1 | 5/2012 | Souchkov | |
| 2014/0232456 | A1 | 8/2014 | Huijsing et al. | |
| 2018/0076780 | A1 | 3/2018 | Wang et al. | |

OTHER PUBLICATIONS

"8-Channel, 24-Bit, Simultaneous Sampling ADC", Analog Devices Data Sheet AD7770, (2016), 95 pgs.

"8-Channel, Low Noise, Low Power, 24-bit, Sigma-Delta ADC with PGA and Reference", Analog Devices Data Sheet AD7124-8, (2016), 93 pgs.

Akita, Ippei, et al., "A 0.06rnm 14nVCheck Hz Chopper Instrumentation Amplifier with Automatic Diffential-Pair Matching", 2013 IEEE International Solid-State Circuits Conference, (2013), 178-179.

Birk, Christian, et al., "A 60V Capacitive Gain 27nV/CheckHz 137dB CMRR PGA with +10V Inputs", 2012 IEEE International Solid-State Circuits Conference, (2012), 376-377.

Fan, Qinwen, et al., "A Multi-Path Chopper-Stabilized Capacitively Coupled Operational Amplifier with 20V-input-Common-Mode Range and 3pV Offset", 2013 IEEE International Solid-State Circuits Conference, (2013), 3 pgs.

Michel, Fridolin, et al., "On-Chip Gain Reconfigurable 1.2V 24pW Chopping Instrumentation Amplifier with Automatic Resistor Matching in 0.13pm CMOS", 2012 IEEE International Solid-State Circuits Conference, (2012), 372-373.

Sebastiano, Fabio, et al., "A 0.07mm 2-Channel Instrumentation Amplifier with 0.1% Gain Matching in 0.16um CMOS", 2014 IEEE International Solid-State Circuits Conference, (2014), 294-295.

Wang, Hanqing, et al., "A 19nV/vHz Noise 2µV Offset 75µA Low Drift Capacitive Gain Amplifier with Switched Capacitor ADC Driving Capability", 2017 ISSCC Conference, (Sep. 12, 2016), 12 pgs.

Wang, Hanqing, et al., "A 19nV/vHz-Noise 2µV-Offset 75µA Low-Drift Capacitive-Gain Amplifier with Switched-Capacitor ADC Driving Capability", 2017 IEEE International Solid-State Circuits Conference, presentation slides 5.7, (Feb. 6, 2017), 29 pgs.

Wu, Kong, et al., "A Current-Feedback Instrumentation Amplifier with a Gain Error Reduction Loop and 0.06 Untrimmed Gain Error", 2011 IEEE International Solid-State Circuits Conference, (2011), 244-245.

"U.S. Appl. No. 15/600,542, Non Final Office Action dated Dec. 15, 2017", 7 pgs.

* cited by examiner

FAST SETTLING CAPACITIVE GAIN AMPLIFIER CIRCUIT

RELATED APPLICATION

This application claims priority to U.S. Provisional Patent Application No. 62/385,761, filed Sep. 9, 2016, which is hereby incorporated by reference herein in its entirety.

FIELD OF THE DISCLOSURE

The present disclosure relates to the field of capacitive gain amplifier circuits.

BACKGROUND

A typical capacitive gain amplifier chops an input signal by alternating between two chopping (CHP) amplify phases with the second CHP phase having a polarity of the amplified signal inverted compared to the first CHP phase. The output of the capacitive gain amplifier circuit may be input to an analog to digital converter (ADC) circuit to be converted from analog to digital. Accuracy of conversion improves when the final voltage of the output from the capacitive gain amplifier circuit is well settled to the correct final value before the ADC circuit takes a sample for conversion. It is thus desirable for high frequency periodic sampling of signals that the capacitive gain amplifier circuit settle its output voltage to an accurate final value rapidly. A maximum sampling rate or frequency of the capacitive gain amplifier circuit is limited by how quickly the amplified sample values settle to an accurate final value.

Miller capacitors are placed across the differential amplifiers of a capacitive gain amplifier circuit from the input to the output in order to stabilize the amplifiers. A Miller capacitor's capacitance value is recognized as a different value of capacitance at the amplifier's input and output nodes than the face value of the capacitor according to the Miller effect. The Miller capacitor adds a dominant left-half plane pole to the frequency response of the amplifier according to its Miller capacitance to stabilize or compensate the amplifier. However, slewing of the Miller capacitor during chopping between the two CHP phases in a conventional capacitive gain amplifier may limit its speed of operation.

SUMMARY OF THE DISCLOSURE

This overview is intended to provide an overview of subject matter of the present patent application. It is not intended to provide an exclusive or exhaustive explanation of the invention. The detailed description is included to provide further information about the present patent application.

According to an embodiment, a capacitive gain amplifier circuit includes two sets of Miller capacitors. A first set of Miller capacitors is used to compensate a differential amplifier circuit during a first phase that resets the differential amplifier circuit. The second set of Miller capacitors is used to compensate the differential amplifier circuit during a second phase that chops a signal being amplified by the differential amplifier circuit. The second set of Miller capacitors is swapped from one polarity of the differential amplifier circuit to an opposite polarity of the differential amplifier circuit during successive second phases.

According to an embodiment, a capacitive gain amplifier circuit includes two sets of Miller capacitors and two output stage differential amplifier circuits. A first set of Miller capacitors is used to compensate the first output stage differential amplifier circuit during a first phase that resets the first output stage differential amplifier circuit. The second set of Miller capacitors is used to compensate the first output stage differential amplifier circuit during a second phase that chops a signal being amplified. The second set of Miller capacitors is swapped from one polarity to an opposite polarity of the first output stage differential amplifier circuit during successive second phases. A second output stage differential amplifier circuit includes a set of inputs respectively coupled with an input side of the second set of Miller capacitors and a set of outputs respectively coupled with a corresponding output side of the second set of Miller capacitors.

According to an embodiment, a capacitive gain amplifier circuit is to amplify an input signal by a pair of differential amplifier circuits coupled in parallel. The capacitive gain amplifier circuit includes a first output stage differential amplifier circuit and a second output stage differential amplifier circuit. The first output stage differential amplifier circuit includes a set of inputs and a set of outputs. The capacitive gain amplifier circuit also includes a first set of Miller capacitors selectively switched in between respective outputs and respective inputs of the first output stage differential amplifier circuit during a first phase that resets the first output stage differential amplifier circuit, and a second set of Miller capacitors selectively switched in between respective outputs and respective inputs of the first output stage differential amplifier circuit during a second phase that chops a signal being amplified by the first output stage differential amplifier circuit. The second set of Miller capacitors is selectively switched in to alternating inputs of the first output stage differential amplifier circuit during successive second phases. The second output stage differential amplifier circuit includes a set of inputs selectively coupled with the inputs of the first output stage differential amplifier circuit and a set of outputs selectively coupled with the outputs of the first output stage differential amplifier circuit during the second phase.

According to an embodiment, a capacitive gain amplifier circuit includes a differential amplifier circuit, including a set of inputs and a set of outputs. The capacitive gain amplifier circuit also includes a first set and a second set of Miller capacitors. The first set of Miller capacitors is selectively switched in between respective outputs and respective inputs of the differential amplifier circuit during a first phase that resets the differential amplifier circuit. The second set of Miller capacitors is selectively switched in between respective outputs and respective inputs of the differential amplifier circuit during a separate second phase that chops a signal being amplified by the differential amplifier circuit. The second set of Miller capacitors is selectively switched in to alternating inputs of the differential amplifier circuit during successive second phases.

According to an embodiment, a method of capacitive gain amplification is to amplify an input signal by a pair of differential amplifier circuits coupled in parallel. The method includes switching in a first set of Miller capacitors between respective outputs and respective inputs of the first output stage differential amplifier circuit during a first phase that resets the first output stage differential amplifier circuit, and switching in a second set of Miller capacitors between respective outputs and respective inputs of the first output stage differential amplifier circuit during a second phase that chops a signal being amplified by the first output stage differential amplifier circuit. The switching in of the second set of Miller capacitors is to alternating inputs of the first output stage differential amplifier circuit during successive second phases. The method also includes operating both the first output stage differential amplifier circuit and the second output stage differential amplifier circuit during the second phase, the second output stage differential amplifier circuit having inputs selectively coupled with the inputs of the first output stage differential amplifier circuit and a set of outputs selectively coupled with the outputs of the first output stage differential amplifier circuit during the second phase.

According to an embodiment, a method of capacitive gain amplification using a differential amplifier circuit includes switching in a first set of Miller capacitors between respective outputs and respective inputs of the differential amplifier circuit during a first phase that resets the differential amplifier circuit, and switching in a second set of Miller capacitors between respective outputs and respective inputs of the differential amplifier circuit during a separate second phase that chops a signal being amplified by the differential amplifier circuit. The switching in of the second set of Miller capacitors is to alternating inputs of the differential amplifier circuit during successive second phases.

According to an embodiment, a capacitive gain amplifier circuit amplifies an input signal by a pair of differential amplifier circuits coupled in series. The capacitive gain amplifier includes a first differential amplifier circuit having a set of inputs and a set of outputs, and a second differential amplifier circuit having a set of inputs and a set of outputs. The capacitive gain amplifier circuit also includes a first set of switches to selectively disconnect the second differential amplifier circuit from the first differential amplifier circuit during a first phase that resets the first differential amplifier circuit, and selectively connect the second differential amplifier circuit with the first differential amplifier circuit in series during a second phase that amplifies a signal by the first differential amplifier circuit and the second differential amplifier circuit together in series. The capacitive gain amplifier circuit also includes a set of feedback capacitors, selectively switched in between respective outputs of the second differential amplifier circuit and respective inputs of the first differential amplifier circuit during the second phase.

According to an embodiment, a method of capacitive gain amplification uses a first differential amplifier circuit selectively coupled in series with a second differential amplifier circuit. The method includes selectively disconnecting the second differential amplifier circuit from the first differential amplifier circuit by a first set of switches during a first phase that resets the first differential amplifier circuit, selectively connecting the second differential amplifier circuit with the first differential amplifier circuit in series by the first set of switches during a second phase that amplifies a signal by the first differential amplifier circuit and the second differential amplifier circuit together in series, and selectively switching in a set of feedback capacitors between respective outputs of the second differential amplifier circuit and respective inputs of the first differential amplifier circuit during the second phase.

According to an embodiment, a capacitive gain amplifier circuit amplifies an input signal by a pair of differential amplifier circuits coupled in series. The capacitive gain amplifier circuit includes a first differential amplifier circuit having a set of inputs and a set of outputs, a second differential amplifier circuit having a set of inputs and a set of outputs, and a set of input capacitors coupled with respective inputs of the first differential amplifier circuit. The set of input capacitors have inputs selectively switched to provide a common mode input voltage to the set of inputs of the first differential amplifier circuit during a first phase that resets the first differential amplifier circuit, and to provide a differential input voltage from respective inputs of the capacitive gain amplifier circuit to the set of inputs of the first differential amplifier circuit during a second phase that amplifies a signal by the first differential amplifier circuit and the second differential amplifier circuit together in series. The capacitive gain amplifier circuit also includes a set of feedback capacitors selectively switched in between respective outputs of the second differential amplifier circuit and respective inputs of the first differential amplifier circuit during the second phase, and a set of Miller capacitors configured to couple between respective outputs and respective inputs of the second differential amplifier circuit. The capacitive gain amplifier circuit also includes a first chopper circuit coupled between the set of outputs of the first differential amplifier circuit and an input side of the set of Miller capacitors to selectively disconnect the set of inputs of the second differential amplifier circuit from the set of outputs of the first differential amplifier circuit during the first phase, selectively connect the set of inputs of the second differential amplifier circuit with the set of outputs of the first differential amplifier circuit during the second phase, and swap the set of Miller capacitors relative to a differential signal polarity of the first differential amplifier circuit during alternating second phases. The capacitive gain amplifier circuit also includes a second chopper circuit coupled between an output side of the set of Miller capacitors and respective output sides of the set of feedback capacitors to selectively disconnect the set of outputs of the second differential amplifier circuit from the respective output sides of the set of feedback capacitors during the first phase, selectively connect the set of outputs of the second differential amplifier circuit with the respective output sides of the set of feedback capacitors during the second phase, and swap the set of Miller capacitors relative to a differential signal polarity of the first differential amplifier circuit during alternating second phases. The capacitive gain amplifier circuit also includes a set of first switches to couple the set of outputs of the second differential amplifier circuit with a set of inputs of an analog to digital converter (ADC) circuit to at least partially charge the set of inputs of the ADC circuit during the first phase.

Figure 1:
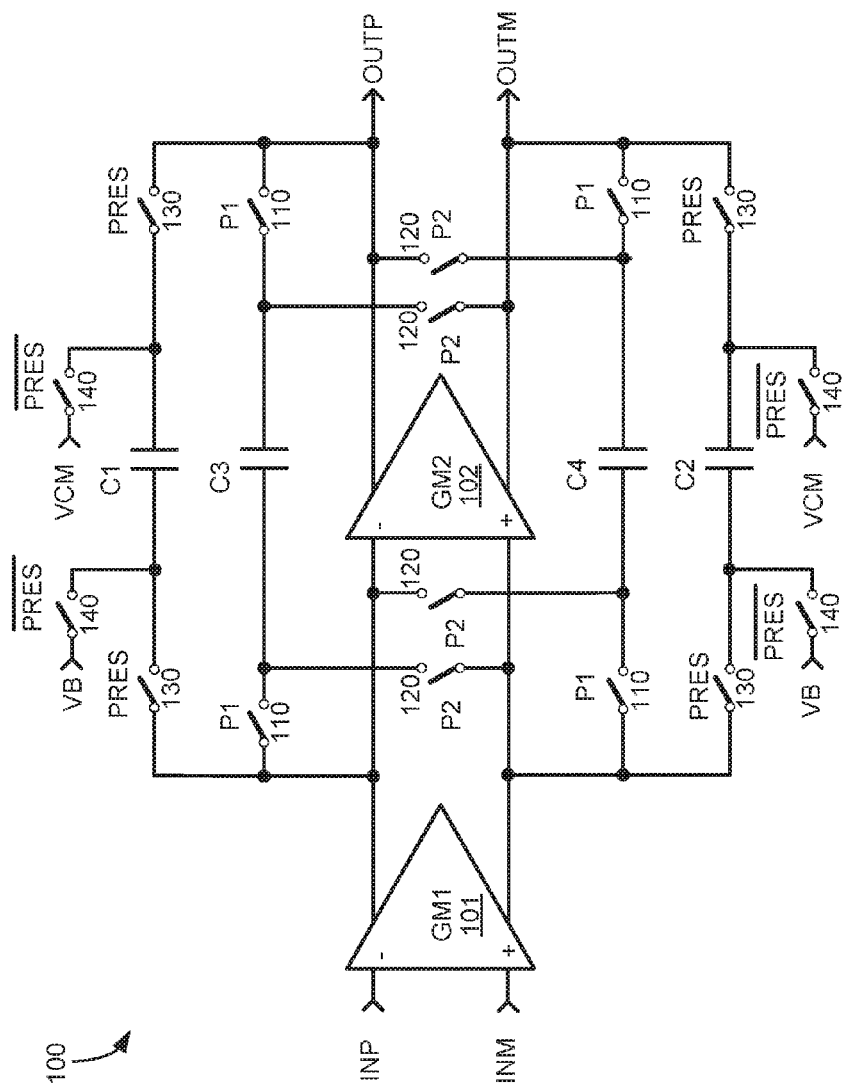
FIG. 1 is a circuit schematic that illustrates a two-stage Miller compensated amplifier circuit having two cascaded differential amplifier circuits and two groups of output stage Miller capacitors, according to an embodiment.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that problems arise when a capacitive gain amplifier switches between voltage values that are significantly different from one another, for example, when the difference is as much as one voltage rail to the other voltage rail of a circuit. The speed of the capacitive gain amplifier is limited by the time it takes to slew the Miller capacitor(s) of the capacitive gain amplifier when switching between these significantly different voltage values at the output of the capacitive gain amplifier. Voltage offsets due to input pre-charge buffers used to reduce input current added to signal voltage values may also cause the capacitive gain amplifier to saturate, further slowing down settling at the output. In addition, due to a long settling time of the capacitive gain amplifier output voltage value especially just after chopping, an analog to digital converter (ADC) converting an analog signal from a typical capacitive gain amplifier may need to discard a first sample data value after each chopping of the analog signal to improve accuracy. Furthermore, the slow settling of the capacitive gain amplifier may lead to significant distortion when using the capacitive gain amplifier with an AC input signal. Therefore, the present inventors have recognized that there is a need for a capacitive gain amplifier that reduces the amount of slewing of Miller capacitors that is required in order to increase the speed at which the capacitive gain amplifier reaches a final settled steady-state value at its output in an amplification/chop (CHP) phase.

Embodiments discussed herein may employ two different groups of Miller capacitors in an output stage of the capacitive gain amplifier: CMS Miller capacitors and CHP Miller capacitors. When the capacitive gain amplifier is used to drive an ADC directly, the output stage of the capacitive gain amplifier may be split into two branches, and thus the output stage may be known as a split output stage. In a common mode sample (CMS) phase, one branch including the group of CMS Miller capacitors may be used to set the common mode voltage.

During this CMS phase, the other branch including the group of CHP Miller capacitors may be disconnected from the differential amplifier circuit performing the primary amplification for the capacitive gain amplifier (a.k.a. the main amplifier). The branch having the group of CHP Miller capacitors may include a fast single-stage buffer circuit having a substantially correct DC output voltage for the capacitive gain amplifier stored on a Miller capacitor. The branch having the group of CHP Miller capacitors may pre-charge the ADC at the output of the capacitive gain amplifier to a rough value for the output voltage during the CMS phase so that during the CHP phase, the main amplifier only needs to charge a small residual error at the input of the ADC.

The CHP phase may be split into a non-inverting chop phase CHP1 and an inverting chop phase CHP2. During the CHP1 and CHP2 phases, the two branches of the split output stage may be shorted together in parallel with the CHP Miller capacitor to drive the ADC. At the start of each sampling period of the ADC, the branch having the group of CHP Miller capacitors that pre-charges the ADC may be connected to the input to the ADC to pre-charge the ADC while an input stage of the capacitive gain amplifier may be disconnected from the split output stage. Then, the branch having the group of CHP Miller capacitors that pre-charges the ADC may be disconnected from the input to the ADC while the input stage of the capacitive gain amplifier may be reconnected to the split output stage for accurate settling of the output voltage of the capacitive gain amplifier during the remainder of the ADC sampling period, e.g., during the same one of the CHP1 and CHP2 phases.

An extra pre-charge buffer may be provided at each input of the capacitive gain amplifier to reduce input current. Because the embodiments of the capacitive gain amplifier may be directly coupled with inputs to an ADC, the ADC may not require input buffers, thereby saving power and area on the semiconductor chip in which the capacitive gain amplifier and/or the ADC is fabricated. The fast settling time of the embodiments of the capacitive gain amplifier may be extended to AC applications as well, due to the fast settling times of the output from the capacitive gain amplifier.

Figure 2:
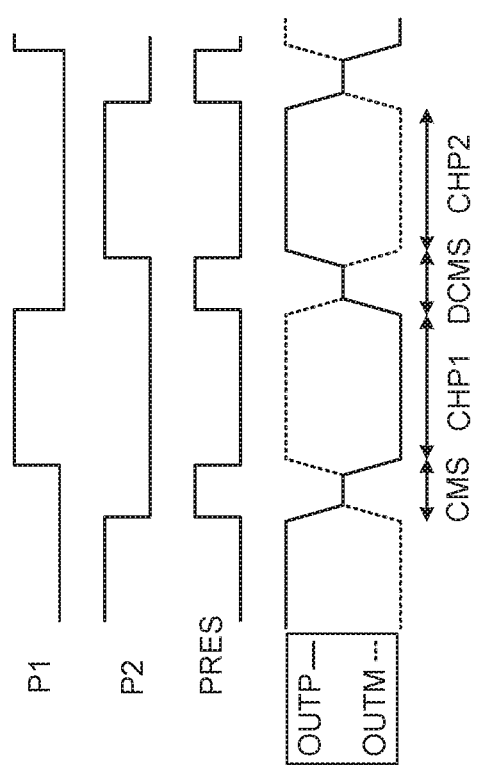
FIG. 2 is a timing diagram showing signal values vs. time during different phases of the two-stage Miller compensated amplifier circuit shown in FIG. 1, according to an embodiment.

FIG. 1 is a circuit schematic that illustrates a two-stage Miller compensated amplifier circuit 100 having two cascaded differential amplifier circuits GM1 101 and GM2 102 and two groups of output stage Miller capacitors, according to an embodiment. FIG. 2 is a timing diagram showing signal values vs. time during different phases of the two-stage Miller compensated amplifier circuit 100 shown in FIG. 1, according to an embodiment. Signals P1, P2, and PRES illustrated in FIG. 2 may be generated by a controller in response to an external timing signal, e.g., a clock signal. The controller may include digital circuits and/or may be machine or computer-implemented.

As illustrated in FIG. 2, there are four phases of operation of the two-stage Miller compensated amplifier circuit 100: a common mode sample/autozero reset (CMS) phase when a signal PRES is at a logical high value, a first chop (CHP1) phase when a signal P1 is at a logical high value, a dummy common mode sample/non-autozero reset (DCMS) phase when the signal PRES is at a logical high value after the CHP1 phase, and a second chop (CHP2) phase when a signal P2 is at a logical high value. The CHP1 and CHP2 phases collectively may be referred to as amplify phases. Chopper and de-chopper circuits are not shown for clarity, but one of ordinary skill in the art would recognize that they may be present before differential inputs INP/INM and after differential outputs OUTP/OUTM of the two-stage Miller compensated amplifier circuit 100, respectively, when the two-stage Miller compensated amplifier circuit 100 is incorporated as part of a capacitive gain amplifier circuit.

The first group of Miller capacitors includes Miller capacitors C1 and C2 to amplify a common mode voltage and stabilize a correct output voltage of the two-stage Miller compensated amplifier circuit 100 during the CMS and DCMS phases to avoid slewing, while the second group of Miller capacitors includes Miller capacitors C3 and C4 to serve as compensation capacitors for the second differential amplifier circuit GM2 102 during the amplify phases.

The Miller capacitors C1 and C2 may be coupled as compensation capacitors between the differential output of the second differential amplifier circuit GM2 102 (differential outputs OUTP/OUTM, respectively) and the differential input of the second differential amplifier circuit GM2 102 during the CMS and DCMS phases, and between a bias voltage source VB and a common mode voltage source VCM during the CHP1 and CHP2 phases. The Miller capacitors C1 and C2 may be used to stabilize the common mode voltage of the first and second differential amplifier circuits GM1 101 and GM2 102 during the CMS and DCMS phases according to the charge applied to the Miller capacitors C1 and C2 by the bias voltage source VB and the common mode voltage source VCM during the CHP1 and CHP2 phases.

The Miller capacitors C1 and C2 may be charged to the correct voltage level by the bias voltage source VB and the common mode voltage source VCM during the CHP1 and CHP2 phases in order to stabilize the differential outputs OUTP/OUTM at the correct voltage level during the CMS and DCMS phases while avoiding slewing. Meanwhile, the Miller capacitors C3 and C4 are swapped as compensation capacitors between respective positive and negative polarities of the differential input and output of the second differential amplifier circuit GM2 102.

Switches 110 and switches 120 dynamically swap Miller capacitors C3 and C4 between one polarity of the differential amplifier circuit GM2 102 for use during the CHP1 phase and an opposite polarity of the differential amplifier circuit GM2 102 for use during the CHP2 phase according to switch control signals P1 and P2 shown in FIG. 2, respectively. For example, switches 110 may be active to provide an electrical connection during the CHP1 phase, and open during the CMS, DCMS, and CHP2 phases; meanwhile, switches 120 may be active to provide an electrical connection during the CHP2 phase, and open during the CMS, DCMS, and CHP1 phases. By swapping the Miller capacitors C3 and C4 between one polarity of the differential amplifier circuit GM2 102 for use during the CHP1 phase and an opposite polarity of the differential amplifier circuit GM2 102 for use during the CHP2 phase, each of the Miller capacitors C3 and C4 may continue to be used with the same polarity of the differential signal during each of the CHP1 and CHP2 phases. The charge on each of the Miller capacitors C3 and C4 may be maintained during the CMS and DCMS phases while they are disconnected from the differential amplifier circuit GM2 102, and may therefore already be charged to the correct voltage level at the start of each of the CHP1 and CHP2 phases because they were charged to the correct voltage level at the end of the prior CHP1 or CHP2 phase. Therefore, the Miller capacitors C3 and C4 may avoid slewing at the start of each of the CHP1 and CHP2 phases to be set to the correct voltage. This may save both power and time compared to typical Miller compensated amplifiers, making settling of the output voltages of the differential output OUTP/OUTM of the two-stage Miller compensated amplifier circuit 100 very fast after chopping.

Switches 130 and 140 dynamically switch Miller capacitors C1 and C2 between being connected with the differential amplifier circuit GM2 102 for use during the CMS and DCMS phases to stabilize the common mode voltage, and being charged to the correct common mode voltage levels by the bias voltage source VB and the common mode voltage source VCM during the CHP1 and CHP2 phases according to switch control signal PRES shown in FIG. 2. For example, switches 130 may be active to provide an electrical connection during the CMS and DCMS phases and not during the CHP1 and CHP2 phases; meanwhile, switches 140 may be active to provide an electrical connection during the CHP1 and CHP2 phases and not during the CMS and DCMS phases. No matter what the input voltages are at the differential input INP/INM, the differential output OUTP/OUTM may be stabilized at a common mode voltage by the Miller capacitors C1 and C2 during the CMS and DCMS phases while avoiding slewing. Because the Miller capacitors C1 and C2 are already set to the correct voltages during the CHP1 and CHP2 phases, slewing of the capacitors C1 and C2 during the CMS and DCMS phases may be avoided, leading to fast settling of the voltage values for the differential output OUTP/OUTM during the CMS and DCMS phases.

The dynamic Miller capacitor swapping performed by the two-stage Miller compensated amplifier circuit 100 facilitates fast settling and good linearity at the differential output OUTP/OUTM of the two-stage Miller compensated amplifier circuit 100, effectively minimizing slewing of the Miller capacitors C3 and C4 because the Miller capacitors C3 and C4 may already be charged to the correct voltage value by the end of each chop phase CHP1 and CHP2, be disconnected to maintain their charge during the reset phases CMS and DCMS, and then remain charged to the correct voltage value at the start of the next chop phase CHP1 or CHP2 after being swapped during the previous reset phase CMS or DCMS. The two-stage Miller compensated amplifier circuit 100 thus improves upon the speed of typical Miller compensation amplifiers.

Figure 3A:
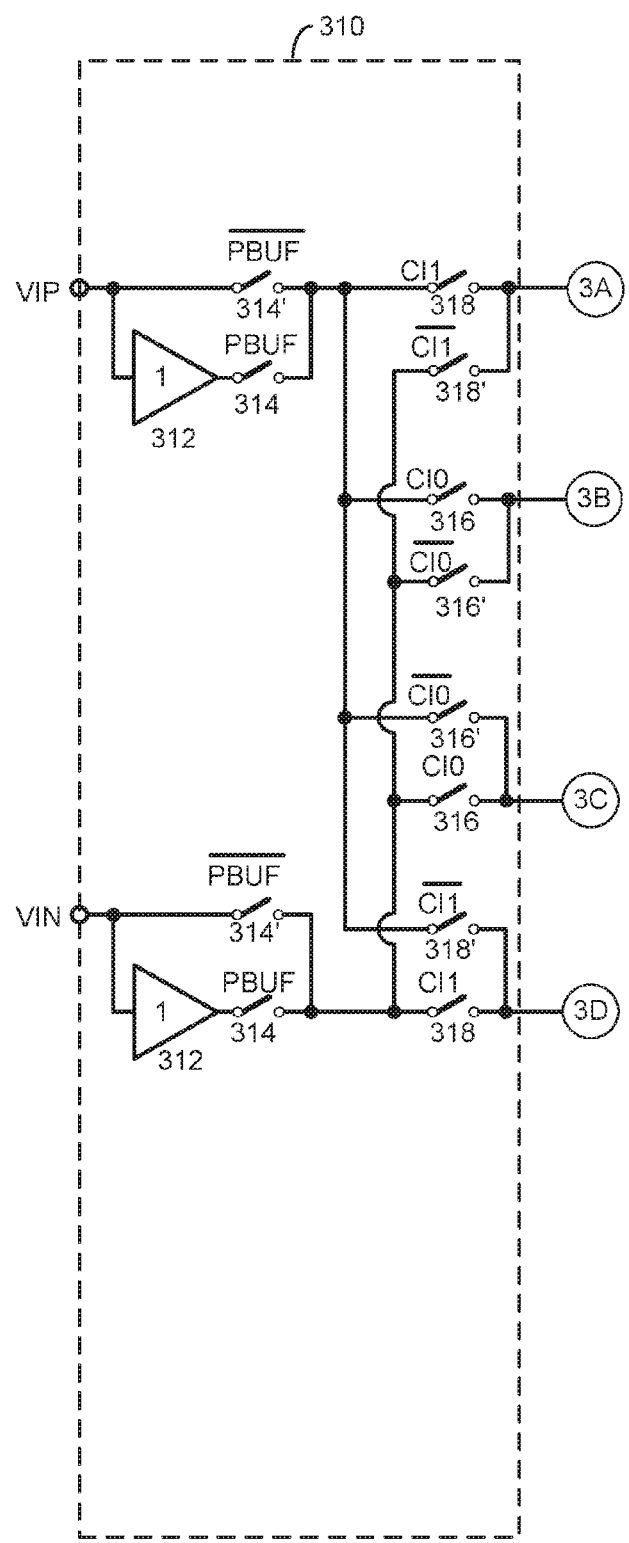
FIGS. 3A-3C are a circuit schematic that illustrates a capacitive gain amplifier circuit having a split output stage and two groups of output stage Miller capacitors, according to an embodiment.
Figure 3B:
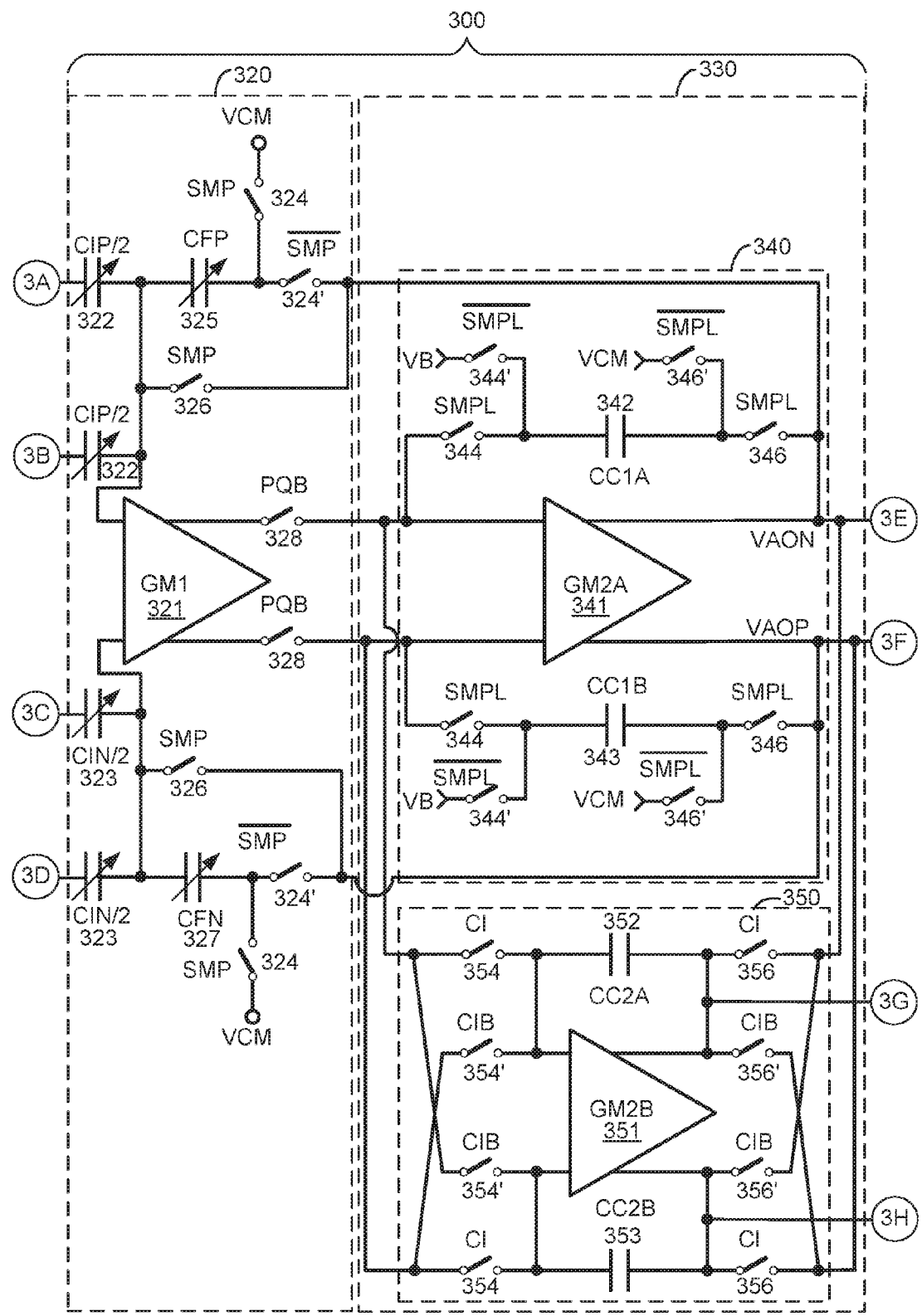
Figure 3C:
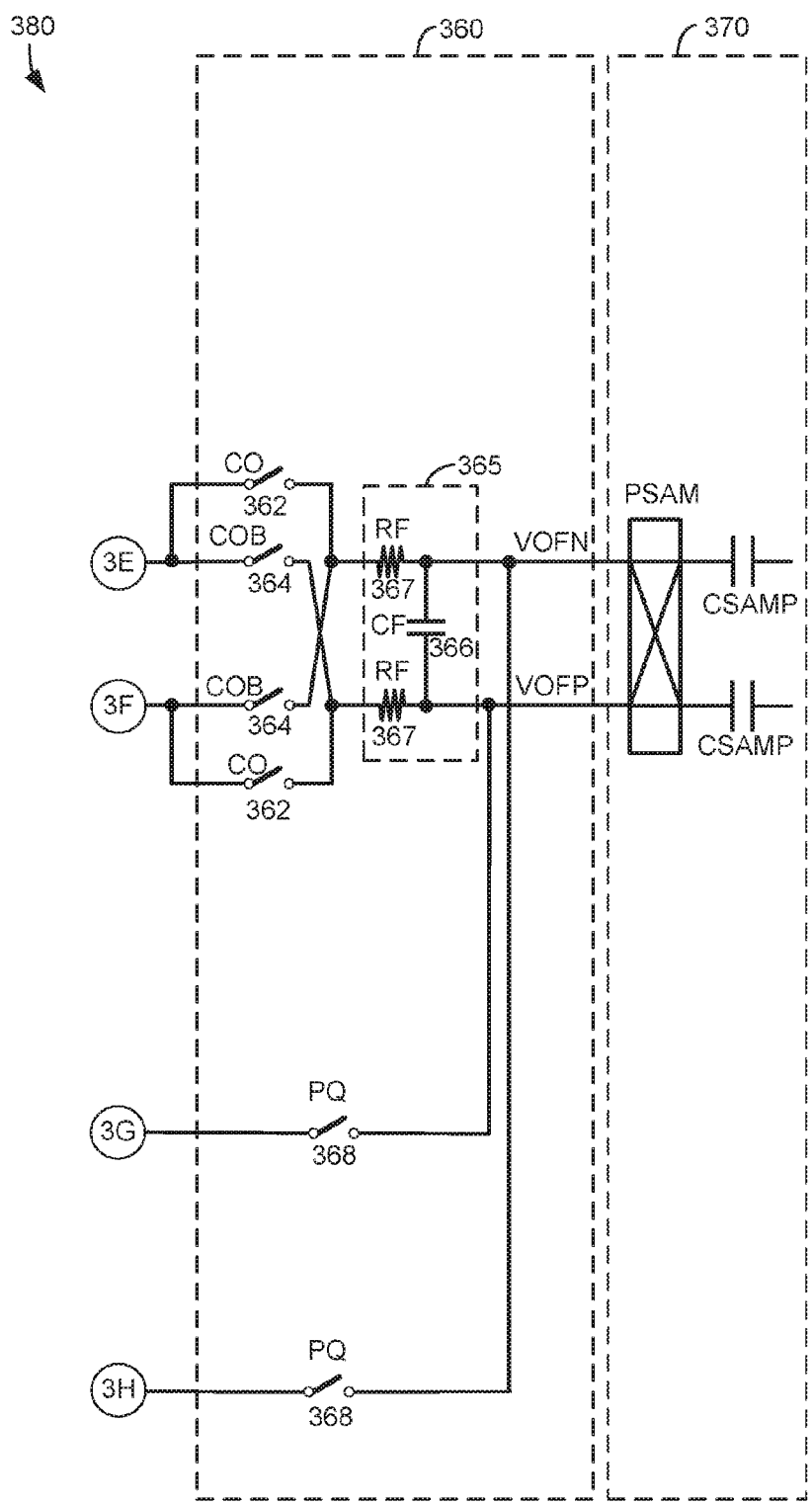

FIGS. 3A-3C are a circuit schematic that illustrates a capacitive gain amplifier circuit 300 having a split output stage and two groups of output stage Miller capacitors, according to an embodiment. An input buffer and chopper circuit 310 may provide a differential input to the capacitive gain amplifier circuit 300, while a de-chopper and dynamic anti-aliasing filter (AAF) circuit 360 may receive a differential output from the capacitive gain amplifier circuit 300. The capacitive gain amplifier circuit 300 may be broken down for reference into an input stage amplifier circuit 320 and a split output stage amplifier circuit 330 cascaded together. A differential output of the de-chopper and dynamic AAF circuit 360 may couple with a differential input of an ADC input sample capacitor circuit 370 of an ADC. For clarity, further details of the ADC are not shown. The input stage amplifier circuit 320 may be configured to amplify an input differential signal received by the input buffer and chopper circuit 310 prior to being input to the split output stage amplifier circuit 330.

In the illustrated embodiment, the input buffer and chopper circuit 310 includes a pair of pre-charge buffer circuits 312 respectively coupled with a pair of inputs VIP and VIN. The pair of inputs VIP and VIN collectively form a differential input to the capacitive gain amplifier circuit 300. The pre-charge buffer circuits 312 may be unity gain buffer circuits. An output of each pre-charge buffer circuit 312 is coupled in series with a buffer output switch 314 while a set of buffer bypass switches 314' provide a selectable bypass circuit to bypass each pre-charge buffer circuit 312. When a buffer switch control signal PBUF is at a logical high value, the buffer output switches 314 are set to a closed state to establish a circuit path from the pair of inputs VIP and VIN through the respective pre-charge buffer circuits 312 to a set of chopper switches 316, 316', 318, and 318', while the buffer bypass switches 314' are set to an open state. Conversely, when the buffer switch control signal PBUF is at a logical low value, the buffer output switches 314 are set to an open state while the buffer bypass switches 314' are set to a closed state to establish a circuit path from the pair of inputs VIP and VIN bypassing the respective pre-charge buffer circuits 312 to the set of chopper switches 316, 316', 318, and 318'. The pre-charge buffer circuits 312 may reduce input current to the capacitive gain amplifier circuit 300 when placed in circuit, for example, during common mode sample phase or chopping, when input capacitors CIP/2 322 and CIN/2 323 may be charged or slewed.

Each switch of each pair of chopper switches 316, 316', 318, and 318' communicatively couples a different one of the pair of inputs VIP and VIN with a different polarity input of the differential amplifier circuit GM1 321. The set of chopper switches 316, 316', 318, and 318' selectively communicatively couple an alternative one of each of the pair of pre-charge buffer circuits 312 and each of the pair of inputs VIP and VIN with a set of inputs of the input stage amplifier circuit 320 via one or more input capacitors CIP/2 322, CIN/2 323 in either a non-inverted or inverted polarity according to values of chopper switch control signals CI0 and CI1. There may be two input capacitors CIP/2 322 and two input capacitors CIN/2 323 to sample a common mode voltage during the common mode sample phase, so that after a common mode sample (CMS) phase, only one half of the total capacitance on each differential input to the differential amplifier circuit GM1 321 needs to be charged to the correct value in each of the amplify phases.

For example, when the chopper switch control signal CI0 is at a logical high value, a respective chopper switch 316 communicatively couples the input VIP with an input to a differential amplifier circuit GM1 321 of the input stage amplifier circuit 320 via a respective input capacitor CIP/2 322 either directly or via the respective pre-charge buffer circuit 312 depending upon the value of the buffer switch control signal PBUF, and a respective chopper switch 316 communicatively couples the input VIN with another input to the differential amplifier circuit GM1 321 of the input stage amplifier circuit 320 via a respective input capacitor CIN/2 323 either directly or via the respective pre-charge buffer circuit 312 depending upon the value of the buffer switch control signal PBUF. Alternatively, when the chopper switch control signal CI0 is at a logical low value, a respective chopper switch 316' communicatively couples the input VIN with one polarity of the differential input to the differential amplifier circuit GM1 321 of the input stage amplifier circuit 320 via the respective input capacitor CIP/2 322 either directly or via the respective pre-charge buffer circuit 312 depending upon the value of the buffer switch control signal PBUF, and a respective chopper switch 316' communicatively couples the input VIP with a respective polarity of the differential input to the differential amplifier circuit GM1 321 of the input stage amplifier circuit 320 via the respective input capacitor CIN/2 323 either directly or via the respective pre-charge buffer circuit 312 depending upon the value of the buffer switch control signal PBUF.

Furthermore, when the chopper switch control signal CI1 is at a logical high value, a respective chopper switch 318 communicatively couples the input VIP with the respective polarity of the differential input to the differential amplifier circuit GM1 321 of the input stage amplifier circuit 320 via a respective input capacitor CIP/2 322 either directly or via the respective pre-charge buffer circuit 312 depending upon the value of the buffer switch control signal PBUF, and a respective chopper switch 318 communicatively couples the input VIN with the respective polarity of the differential input to the differential amplifier circuit GM1 321 of the input stage amplifier circuit 320 via a respective input capacitor CIN/2 323 either directly or via the respective pre-charge buffer circuit 312 depending upon the value of the buffer switch control signal PBUF. Alternatively, when the chopper switch control signal CI1 is at a logical low value, a respective chopper switch 318' communicatively couples the input VIN with the respective polarity of the differential input to the differential amplifier circuit GM1 321 of the input stage amplifier circuit 320 via the respective input capacitor CIP/2 322 either directly or via the respective pre-charge buffer circuit 312 depending upon the value of the buffer switch control signal PBUF, and a respective chopper switch 318' communicatively couples the input VIP with the respective polarity of the differential input to the differential amplifier circuit GM1 321 of the input stage amplifier circuit 320 via the respective input capacitor CIN/2 323 either directly or via the respective pre-charge buffer circuit 312 depending upon the value of the buffer switch control signal PBUF.

In the illustrated embodiment, the input stage amplifier circuit 320 includes the set of input capacitors CIP/2 322 disposed between the input buffer and chopper circuit 310 and the respective polarity of the differential input of the differential amplifier circuit GM1 321 and the set of input capacitors CIN/2 323 disposed between the input buffer and chopper circuit 310 and the respective polarity of the differential input of the differential amplifier circuit GM1 321.

The input stage amplifier circuit 320 also includes a set of feedback capacitors CFP 325 and CFN 327 that respectively selectively couple one of the pair of inputs of the differential amplifier circuit GM1 321 to either a respective output of the split output stage amplifier circuit 330 or a common mode voltage source VCM depending upon a value of a feedback capacitor switch signal SMP. When the feedback capacitor switch signal SMP is at a logical high value, a pair of feedback switches 326 couple the two polarities of the differential input of the differential amplifier circuit GM1 321 with the respective outputs of the split output stage amplifier circuit 330 by bypassing the respective feedback capacitors CFP 325 and CFN 327 while a pair of feedback switches 324 couple an end of the respective feedback capacitors CFP 325 and CFN 327 opposite the respective input of the differential amplifier circuit GM1 321 to the common mode voltage source VCM. When the feedback capacitor switch signal SMP is at a logical low value, a pair of feedback switches 324' couple the respective feedback capacitors CFP 325 and CFN 327 between respective inputs of the differential amplifier circuit GM1 321 and the respective outputs of the split output stage amplifier circuit 330 (nodes VAON, VAOP).

The capacitors CIP/2 322, CIN/2 323, CFP 325, and CFN 327 may be variable capacitors. In various embodiments, each of the capacitors CIP/2 322, CIN/2 323, CFP 325, and CFN 327 may include an array of switched capacitor devices. During operation, the sets of input capacitors CIP/2 322, CIN/2 323 may be set to have equal capacitance to each other, and the set of feedback capacitors CFP 325, CFN 327 may be set to have equal capacitance to each other. A ratio of capacitances between the input capacitors CIP/2 322, CIN/2 323 and the feedback capacitors CFP 325, CFN 327 may be controlled by a control signal to provide a programmable gain of the capacitive gain amplifier circuit 300.

The input stage amplifier circuit 320 also includes a pair of input stage amplifier output switches 328 that selectively couple and decouple respective outputs of the differential amplifier circuit GM1 321 and the input stage amplifier circuit 320 with respective inputs of the split output stage amplifier circuit 330 according to a value of an input stage amplifier output switch signal PQB. When the input stage amplifier output switch signal PQB is at a logical high level, the input stage amplifier output switches 328 communicatively couple the differential output of the differential amplifier circuit GM1 321 and the differential output of the input stage amplifier circuit 320 with the differential input of the split output stage amplifier circuit 330. Conversely, when the input stage amplifier output switch signal PQB is at a logical low level, the input stage amplifier output switches 328 communicatively decouple the differential output of the differential amplifier circuit GM1 321 and the differential output of the input stage amplifier circuit 320 from the differential input of the split output stage amplifier circuit 330.

In the illustrated embodiment, the split output stage amplifier circuit 330 includes a primary output stage amplifier branch 340 that includes a differential amplifier circuit GM2A 341 and a secondary output stage amplifier branch 350 that includes a differential amplifier circuit GM2B 351 in parallel with the differential amplifier circuit GM2A 341 of the primary output stage amplifier branch 340 between the differential input of the split output stage amplifier circuit 330 and the differential output of the split output stage amplifier circuit 330.

In the illustrated embodiment, the primary output stage amplifier branch 340 includes a pair of first Miller capacitors CC1A 342 and CC1B 343 respectively selectively coupled between a respective input of the differential amplifier circuit GM2A 341 on an input side of the respective one of the first Miller capacitors CC1A 342 and CC1B 343 and a respective output of the differential amplifier circuit GM2A 341 on an output side of the respective one of the first Miller capacitors CC1A 342 and CC1B 343 when a first Miller capacitor switch control signal SMPL is at a logical high level by first Miller capacitor switches 344 and 346, and respectively selectively coupled between a first voltage source VB on the input side of the respective one of the first Miller capacitors CC1A 342 and CC1B 343 and a second voltage source VCM on the output side of the respective one of the first Miller capacitors CC1A 342 and CC1B 343 when a first Miller capacitor switch control signal SMPL is at a logical low level by first Miller capacitor switches 344' and 346'.

In the illustrated embodiment, the secondary output stage amplifier branch 350 includes a pair of second Miller capacitors CC2A 352 and CC2B 353 respectively selectively coupled with one of the pair of inputs of the differential amplifier circuit GM2A 341 of the primary output stage amplifier branch 340 on an input side of the respective one of the second Miller capacitors CC2A 352 and CC2B 353 and with a corresponding one of the pair of outputs of the differential amplifier circuit GM2A 341 of the primary output stage amplifier branch 340 on an output side of the respective one of the second Miller capacitors CC2A 352 and CC2B 353 when a second Miller capacitor switch control signal CI is at a logical high level by second Miller capacitor switches 354 and 356, and respectively selectively coupled with another of the pair of inputs of the differential amplifier circuit GM2A 341 of the primary output stage amplifier branch 340 on the input side of the respective one of the second Miller capacitors CC2A 352 and CC2B 353 and with a corresponding other of the pair of outputs of the differential amplifier circuit GM2A 341 of the primary output stage amplifier branch 340 on the output side of the respective one of the second Miller capacitors CC2A 352 and CC2B 353 when a second Miller capacitor switch control signal CIB is at a logical high level by second Miller capacitor switches 354' and 356'. When neither one of the second Miller capacitor switch control signals CI and CIB are at a logical high level, the second Miller capacitors CC2A 352 and CC2B 353 and the secondary output stage amplifier branch 350 are decoupled from the differential amplifier circuit GM2A 341 and the primary output stage amplifier branch 340. The second Miller capacitors CC2A 352 and CC2B 353 are each coupled between a respective input and a respective output of the differential amplifier circuit GM2B 351 of the secondary output stage amplifier branch 350 regardless of the values of second Miller capacitor switch control signals CI and CIB.

Figure 16:
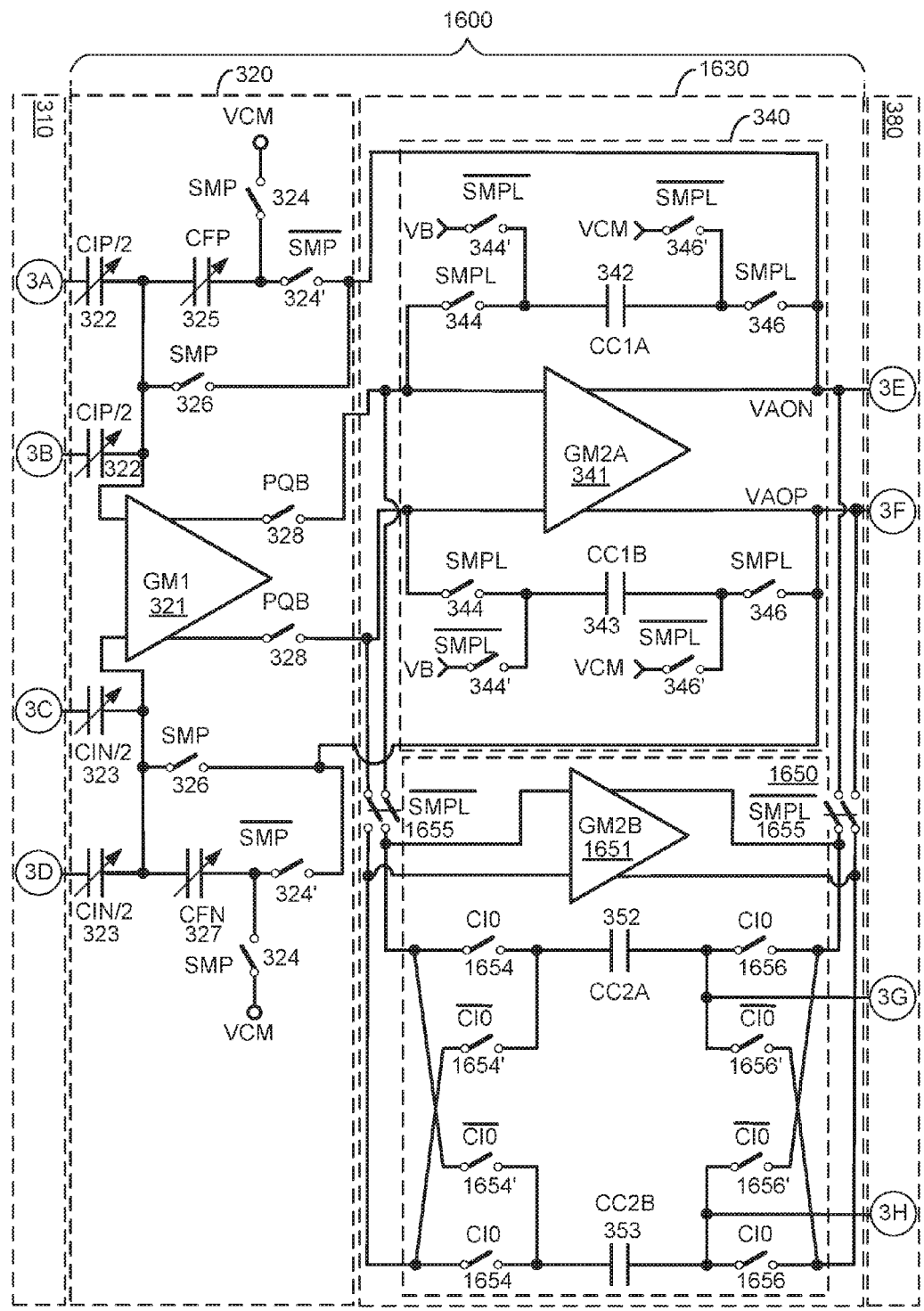
FIG. 16 is a circuit schematic that illustrates a capacitive gain amplifier circuit having a split output stage and two groups of output stage Miller capacitors, according to an embodiment.

Although in the illustrated embodiment the second Miller capacitors CC2A 352 and CC2B 353 are each fixedly coupled with a single pair of input and output ports of the differential amplifier circuit GM2B 351 of the secondary output stage amplifier branch 350, this should not be construed as limiting. FIG. 16 illustrates an embodiment in which the second Miller capacitors are also swapped with respect to the polarity of the differential amplifier circuit of the secondary output stage amplifier branch, and the differential amplifier circuit of the secondary output stage amplifier branch maintains a same signal polarity relationship with the differential amplifier circuit of the primary output stage amplifier branch even as the second Miller capacitors are swapped in relation to the polarity of the differential amplifier circuit of the primary output stage amplifier branch.

In the illustrated embodiment, the de-chopper and dynamic AAF circuit 360 includes a set of de-chopper switches 362 and 364 that selectively communicatively couple the differential output of the split output stage amplifier circuit 330 with a differential input of the ADC input sample capacitor circuit 370 in either a non-inverted or inverted polarity according to values of de-chopper switch control signals CO and COB. The differential output of the split output stage amplifier circuit 330 may be communicatively coupled with the differential input of the ADC input sample capacitor circuit 370 via an impedance network 365. The impedance network 365 may be an anti-alias filter (AAF) and be used to band-limit noise. In the illustrated embodiment, the impedance network 365 includes a pair of resistors RF 367, one for each polarity of the differential signal path, disposed between the de-chopper switches (362 and 364) and the differential output of the de-chopper and dynamic AAF circuit 360. The differential output of the de-chopper and dynamic AAF circuit 360 includes a positive polarity output VOFP and a negative polarity output VOFN. The impedance network 365 also includes a capacitor CF 366 disposed between an output side of each of the pair of resistors RF 367, and thus between the outputs VOFP and VOFN.

For example, when the de-chopper switch control signal CO is at a logical high value, respective de-chopper switches 362 communicatively couple the differential output of the split output stage amplifier circuit 330 with the differential input of the ADC input sample capacitor circuit 370 in a non-inverting manner. In contrast, when the de-chopper switch control signal COB is at a logical high value, respective de-chopper switches 364 communicatively couple the differential output of the split output stage amplifier circuit 330 with the differential input of the ADC input sample capacitor circuit 370 in an inverting manner. When neither de-chopper switch control signals CO and COB are at a logical high value, the differential output of the split output stage amplifier circuit 330 is communicatively decoupled from the differential input of the ADC input sample capacitor circuit 370.

In the illustrated embodiment, the de-chopper and dynamic AAF circuit 360 also includes a pair of ADC pre-charge switches 368 that selectively couple the differential output of the differential amplifier circuit GM2B 351 and the pair of second Miller capacitors CC2A 352 and CC2B 353 of the secondary output stage amplifier branch 350 with the differential output of the de-chopper and dynamic AAF circuit 360 according to a value of the pre-charge switch control signal PQ. For example, when the pre-charge switch control signal PQ is at a logical high value, the differential output of the differential amplifier circuit GM2B 351 and the pair of second Miller capacitors CC2A 352 and CC2B 353 of the secondary output stage amplifier branch 350 couple with the differential input of the ADC input sample capacitor circuit 370 via the differential output of the de-chopper and dynamic AAF circuit 360 to pre-charge ADC sampling capacitors CSAMP of the ADC input sample capacitor circuit 370.

Figure 4:
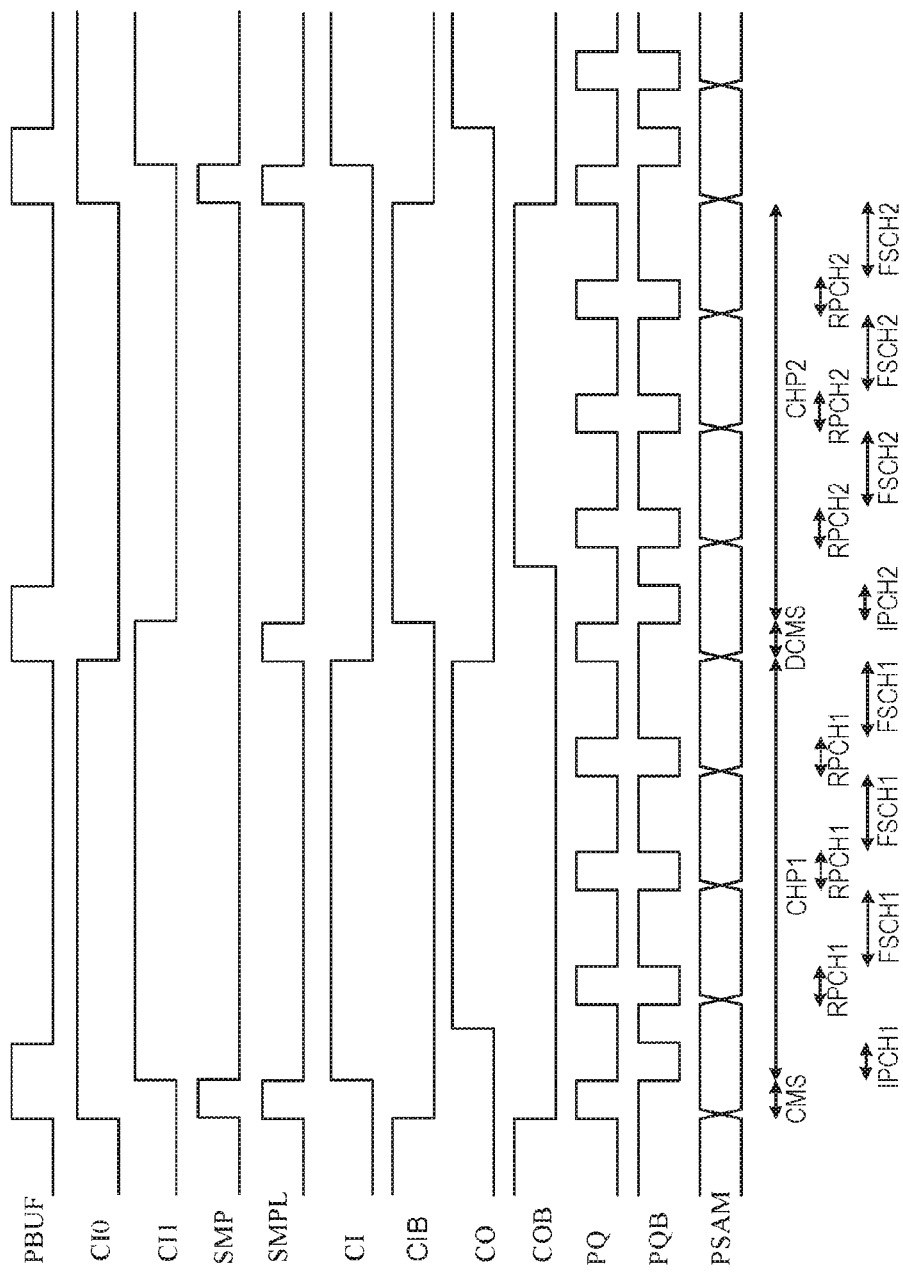
FIG. 4 is a timing diagram illustrating control signal waveforms for controlling the capacitive gain amplifier circuit of FIGS. 3A-3C, according to an embodiment.

FIG. 4 is a timing diagram illustrating control signal waveforms for controlling the capacitive gain amplifier circuit 300 of FIGS. 3A-3C, according to an embodiment. FIG. 4 illustrates logical values for the control signals PBUF, CI0, CI1, SMP, SMPL, CI, CIB, CO, COB, PQ, and PQB during each of the phases autozero reset/common mode sample (CMS), amplify/chop 1 (CHP1) including both pre-charge and fine settling sub-phases, non-autozero reset/dummy common mode sample (DCMS), and amplify/chop 2 (CHP2) including both pre-charge and fine settling sub-phases. The CHP1 phase includes an initial gain network pre-charge sub-phase (IPCH1), a recurring pre-charge sub-phase (RPCH1), and a recurring fine settling phase (FSCH1). Likewise, the CHP2 phase includes an initial gain network pre-charge sub-phase (IPCH2), a recurring pre-charge sub-phase (RPCH2), and a recurring fine settling phase (FSCH2). While the CMS and DCMS phases are short, during which no samples are taken by an ADC connected to outputs of the capacitive gain amplifier circuit 300, the CHP1 and CHP2 phases are longer, during which multiple samples may be taken by an ADC. The values of the various control signals during each of the phases are discussed herein with respect to the capacitive gain amplifier circuit at different phases of operation in FIGS. 5, 6, 7, and 8.

The control signals PBUF, CI0, CI1, SMP, SMPL, CI, CIB, CO, COB, PQ, and PQB illustrated in FIG. 4 may be generated by a controller in response to an external timing signal, e.g., a clock signal. The controller may include digital circuits and/or may be machine or computer-implemented.

Figure 5A:
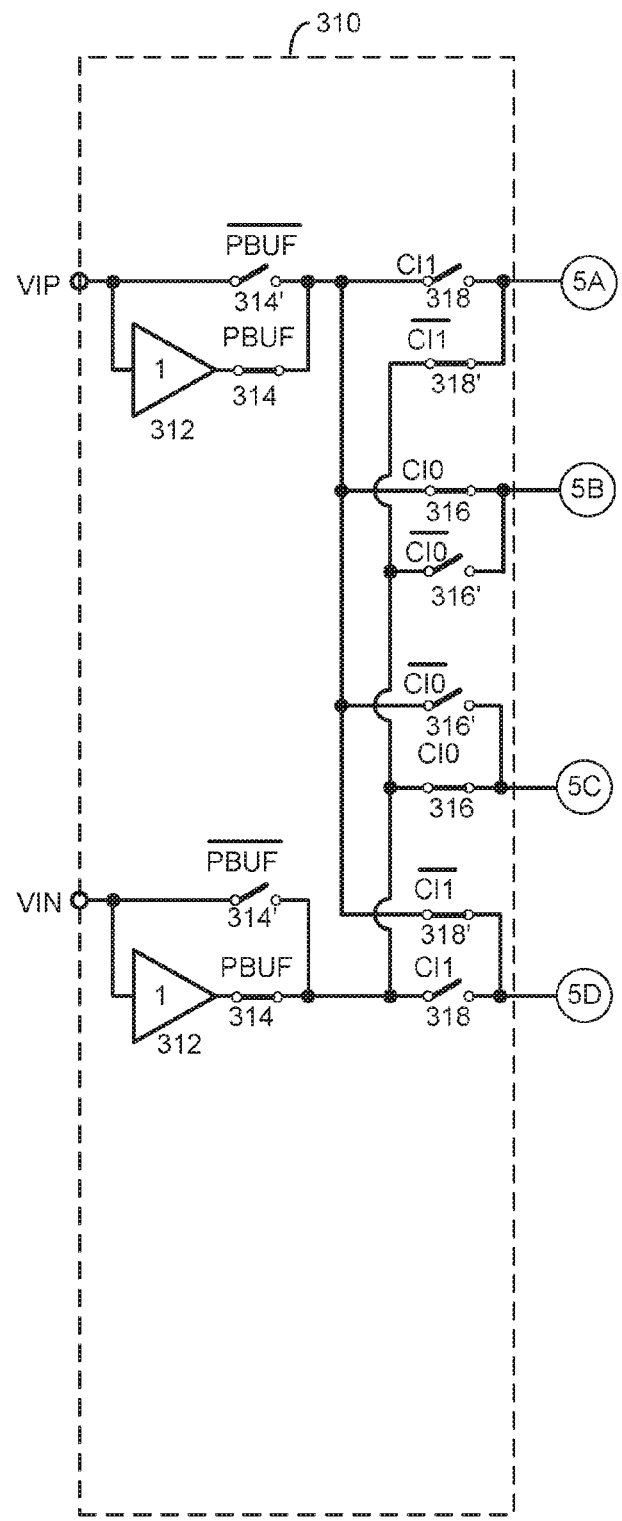
FIGS. 5A-5C are a circuit schematic that illustrates the capacitive gain amplifier circuit of FIGS. 3A-3C during the common mode sample or autozero (CMS) phase, according to an embodiment.
Figure 5B:
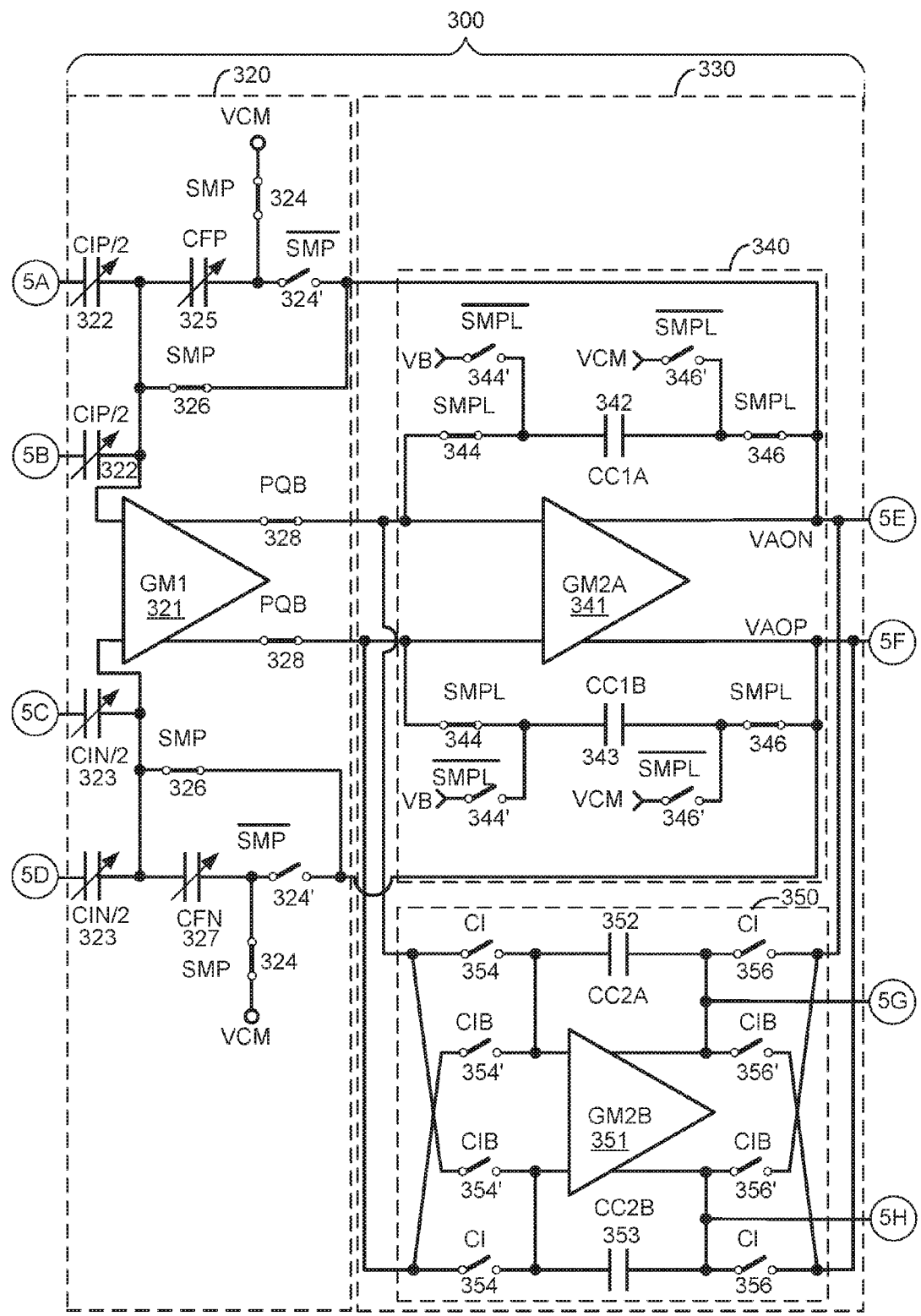
Figure 5C:
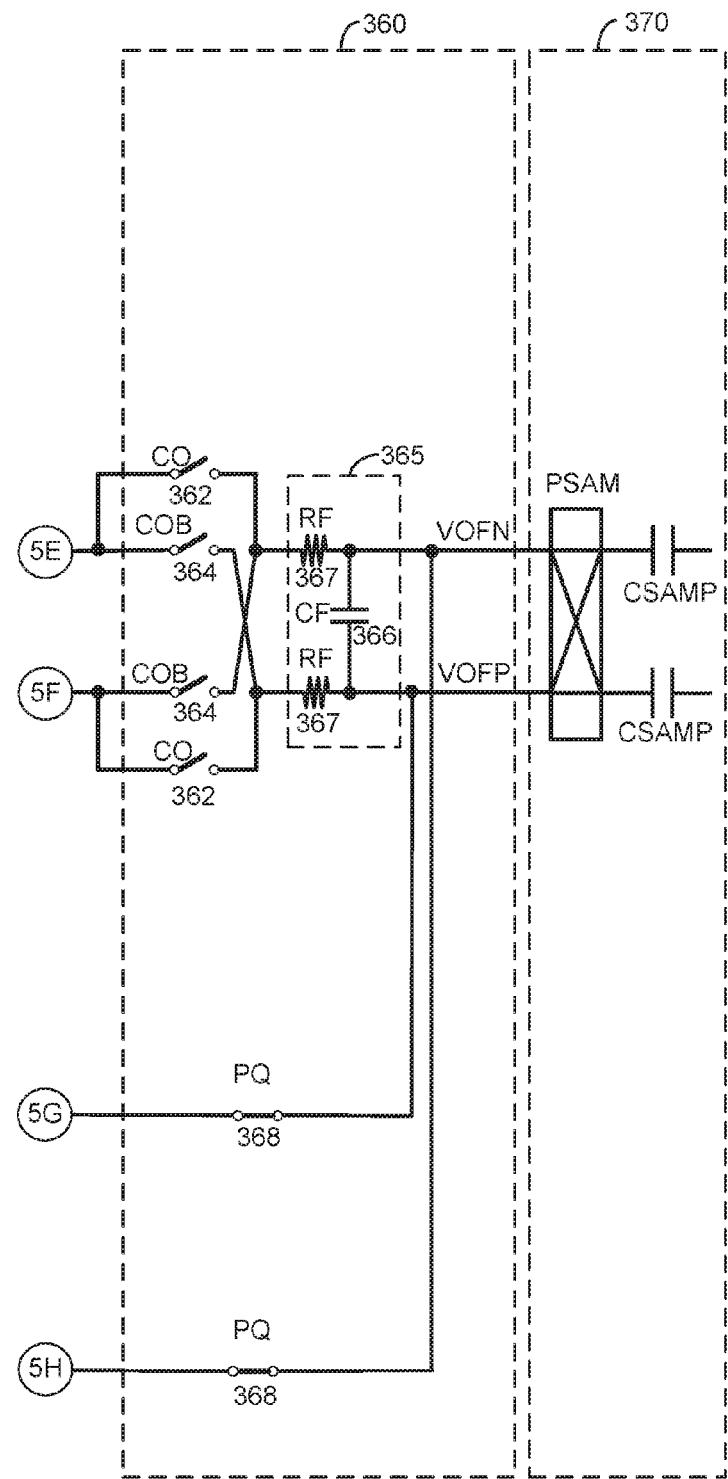

FIGS. 5A-5C are a circuit schematic that illustrates the capacitive gain amplifier circuit 300 of FIGS. 3A-3C during the common mode sample or autozero (CMS) phase, according to an embodiment. The PBUF control signal is set to be in a high state to place the pre-charge buffer circuits 312 in circuit between the pair of inputs VIP and VIN and the input stage amplifier circuit 320 to pre-charge the input capacitors CIP/2 322, CIN/2 323. Also, the input stage amplifier circuit 320 and the primary output stage amplifier branch 340 are set to auto-zero by setting the PQB control signal to be in a high state to couple the input stage amplifier circuit 320 with the primary output stage amplifier branch 340, setting the SMP control signal to be in a high state to directly couple the output of the primary output stage amplifier branch 340 with the input stage amplifier circuit 320 while coupling the feedback capacitors CFP 325 and CFN 327 between the respective inputs of the differential amplifier circuit GM1 321 and the common mode voltage source VCM, setting the SMPL control signal to be in a high state to respectively couple the pair of first Miller capacitors CC1A 342 and CC1B 343 between the input of the differential amplifier circuit GM2A 341 and the output of the differential amplifier circuit GM2A 341, setting the CI and CIB control signals to be in a low state to decouple the secondary output stage amplifier branch 350 from the primary output stage amplifier branch 340, and setting the CO and COB control signals to be in a low state to decouple the output of the primary output stage amplifier branch 340 from the de-chopper circuit 360. In addition, the ADC sample capacitors CSAMP are pre-charged by the secondary output stage amplifier branch 350 by setting the PQ timing control signal to a high state to couple the output of the secondary output stage amplifier branch 350 with the input of the ADC sample capacitors CSAMP.

Figure 6A:
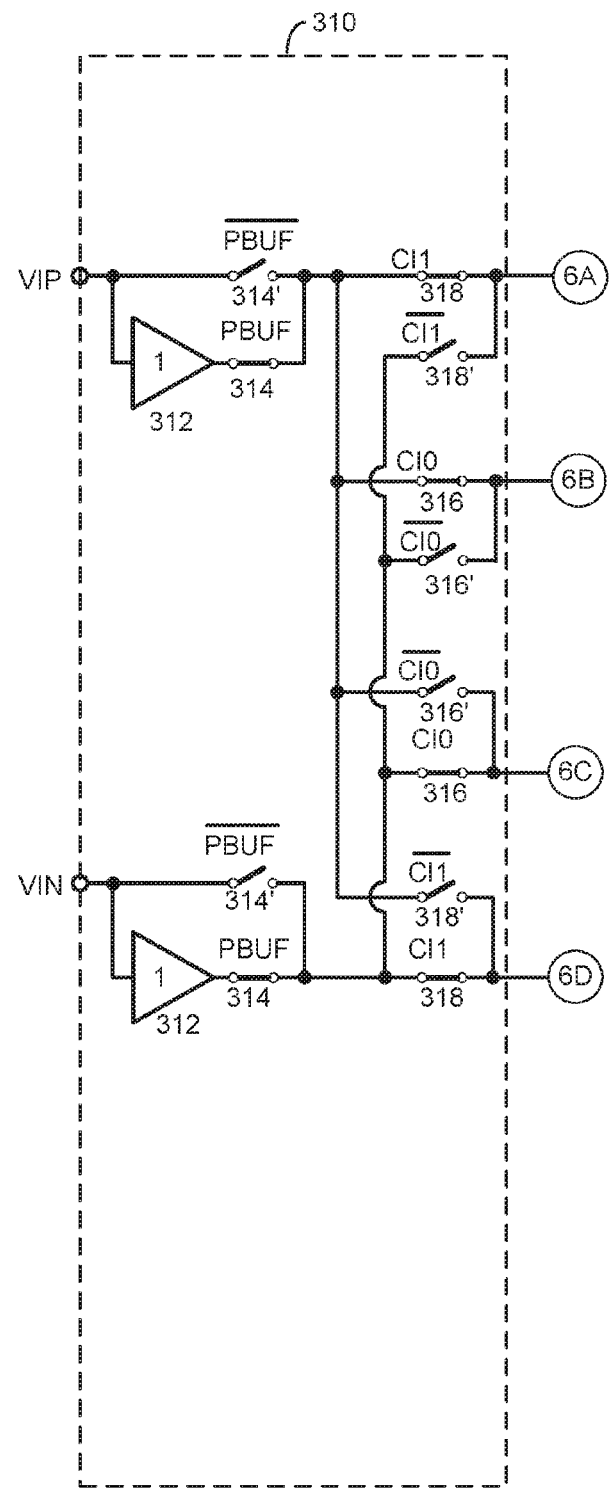
FIGS. 6A-6C are a circuit schematic that illustrates the capacitive gain amplifier circuit of FIGS. 3A-3C during the pre-charge phase after the CMS phase, according to an embodiment.
Figure 6B:
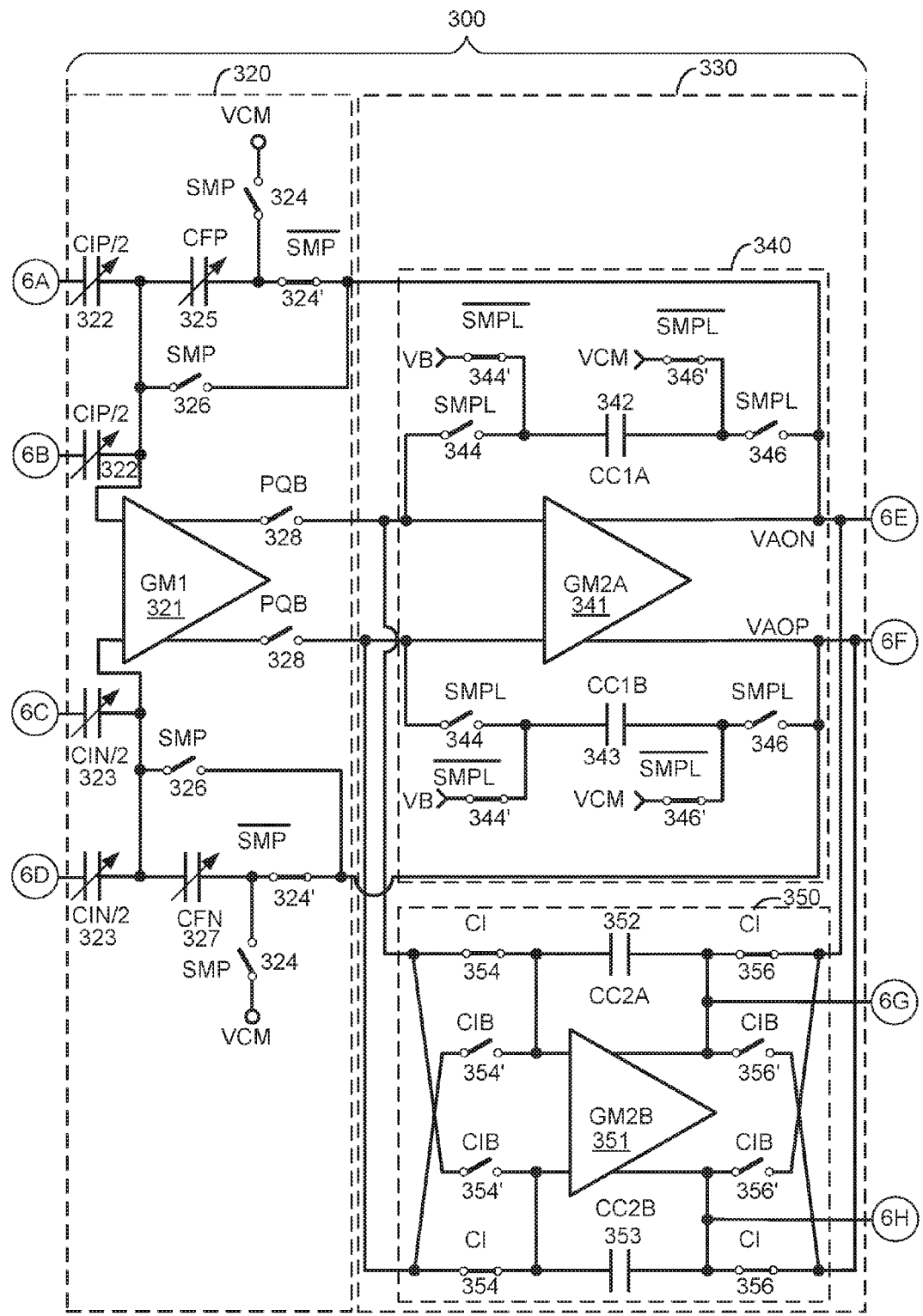
Figure 6C:
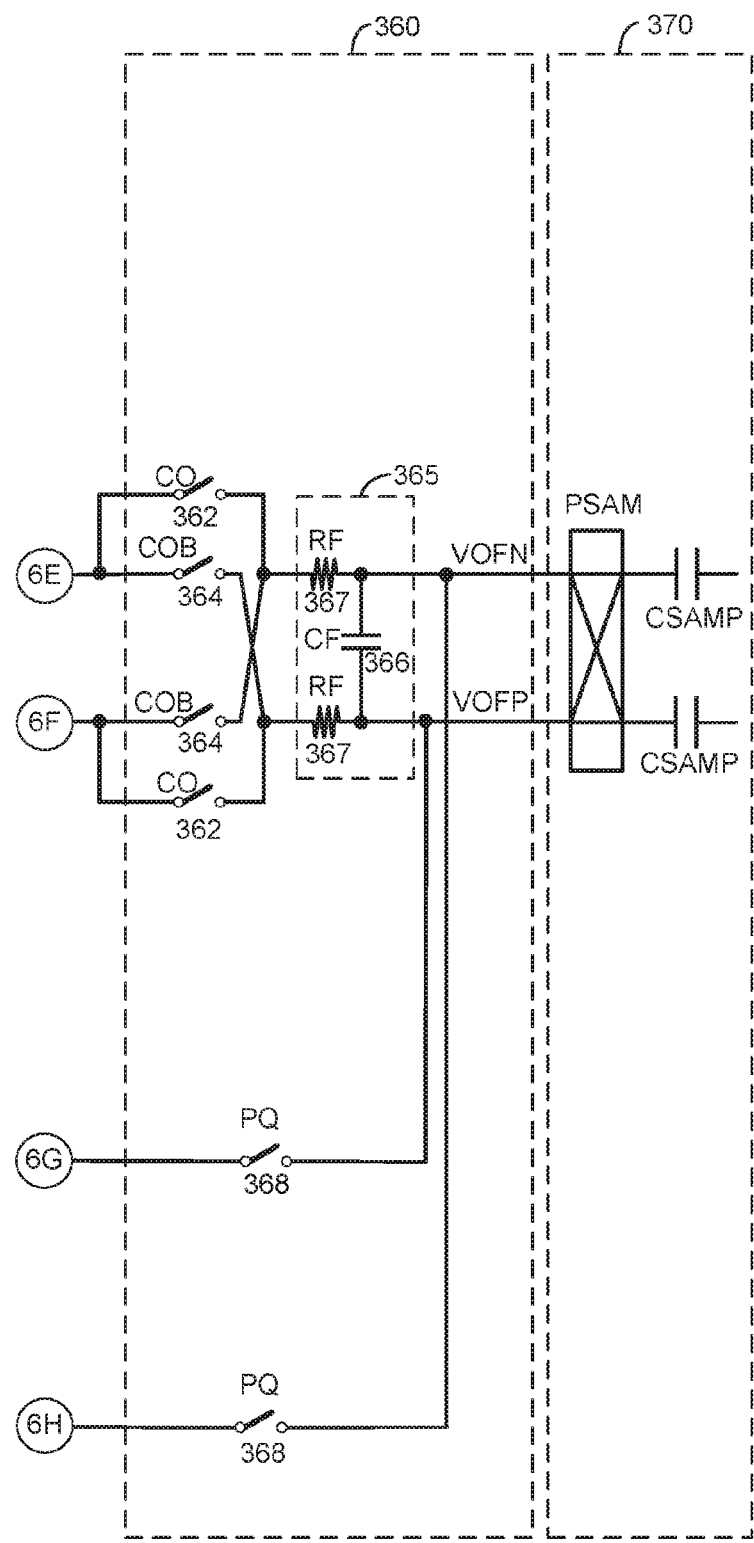

FIGS. 6A-6C are a circuit schematic that illustrates the capacitive gain amplifier circuit 300 of FIGS. 3A-3C during an initial gain network pre-charge sub-phase of the amplify phase CHP1 (IPCH1) after the CMS phase, according to an embodiment. During the IPCH1 phase, the PBUF control signal remains in a high state to maintain the pre-charge buffer circuits 312 in circuit between the pair of inputs VIP and VIN and the input stage amplifier circuit 320 to continue to pre-charge the input capacitors CIP/2 322, CIN/2 323 due to the chop event after the CMS phase. Also, the split output stage amplifier circuit 330 is controlled to charge the gain network and remove the offset effect of the pre-charge buffer circuits 312 by setting the PQB control signal to be in a low state to disconnect the input stage amplifier circuit 320 from the split output stage amplifier circuit 330, setting the SMP control signal to be in a low state to couple the feedback capacitors CFP 325 and CFN 327 between the output of the split output stage amplifier circuit 330 and the input of the input stage differential amplifier circuit GM1 321, setting the SMPL control signal to be in a low state to respectively couple the pair of first Miller capacitors CC1A 342 and CC1B 343 between the first voltage source VB and the second voltage source VCM to hold their charge, discontinue pre-charging of the ADC sample capacitors CSAMP by the secondary output stage amplifier branch 350 by setting the PQ control signal to a low state to decouple the output of the secondary output stage amplifier branch 350 from the input of the ADC sample capacitors CSAMP, setting the CI control signals to be in a high state and the CIB control signals to be in a low state to couple the secondary output stage amplifier branch 350 with the primary output stage amplifier branch 340 in preparation for the CHP1 phase, and setting the CO and COB control signals to be in a low state to continue to decouple the output of the primary output stage amplifier branch 340 from the de-chopper and dynamic AAF circuit 360.

The pre-charge buffer circuits 312 may be placed in the input path of the capacitive gain amplifier circuit 300 during the CMS phase to pre-charge the input capacitors CIP/2 322, CIN/2 323, and may be removed from the input path of the capacitive gain amplifier circuit 300 when the input capacitors CIP/2 322, CIN/2 323 are charged to the correct voltage. The pre-charge buffer circuits 312 reduce the input current to the input buffer and chopper circuit 310 compared to prior capacitive gain amplifier circuits that do not include pre-charge buffer circuits at their inputs. However, because accurate pre-charge buffer circuits consume a great deal of power and area, it is desirable that the pre-charge buffer circuits 312 be switchable in and out of the input path of the capacitive gain amplifier circuit 300 so that they can have relaxed accuracy requirements and only be used when needed for charging the input capacitors.

Figure 7A:
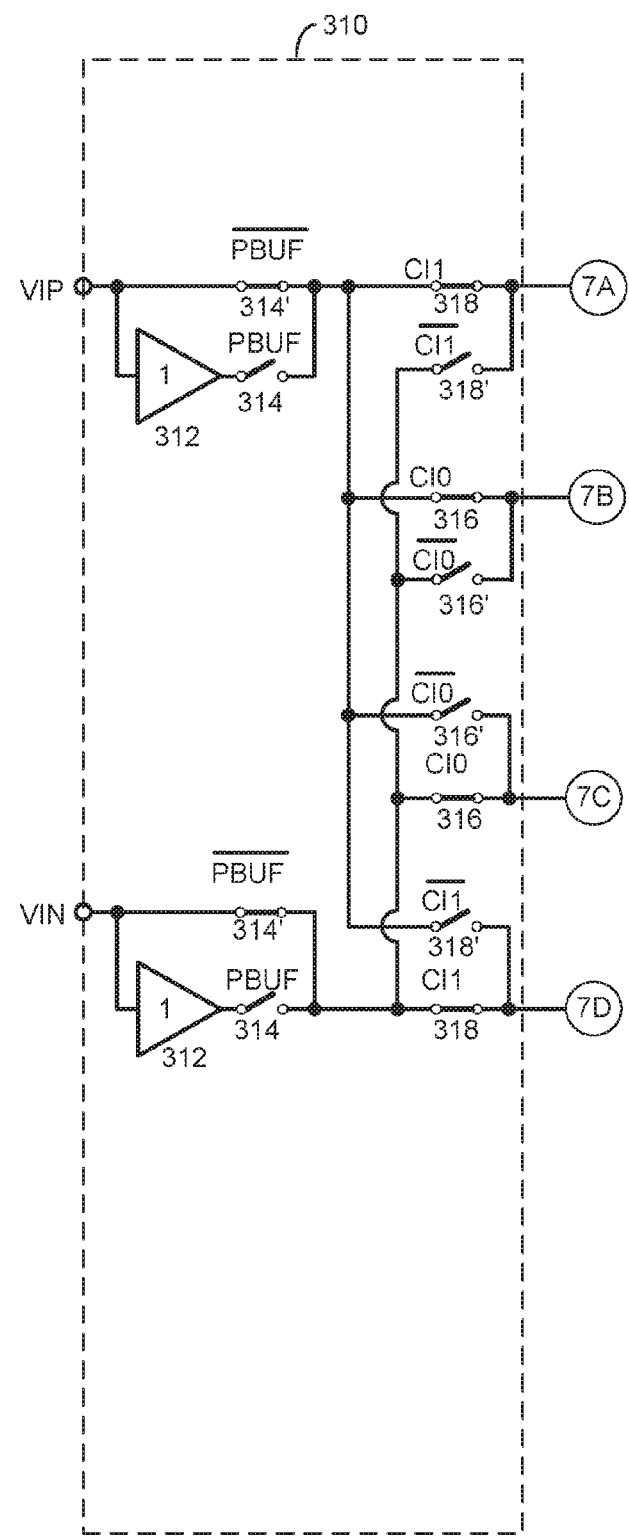
FIGS. 7A-7C are a circuit schematic that illustrates the capacitive gain amplifier circuit of FIGS. 3A-3C during the pre-charge portion of the CHP1 phase, according to an embodiment.
Figure 7B:
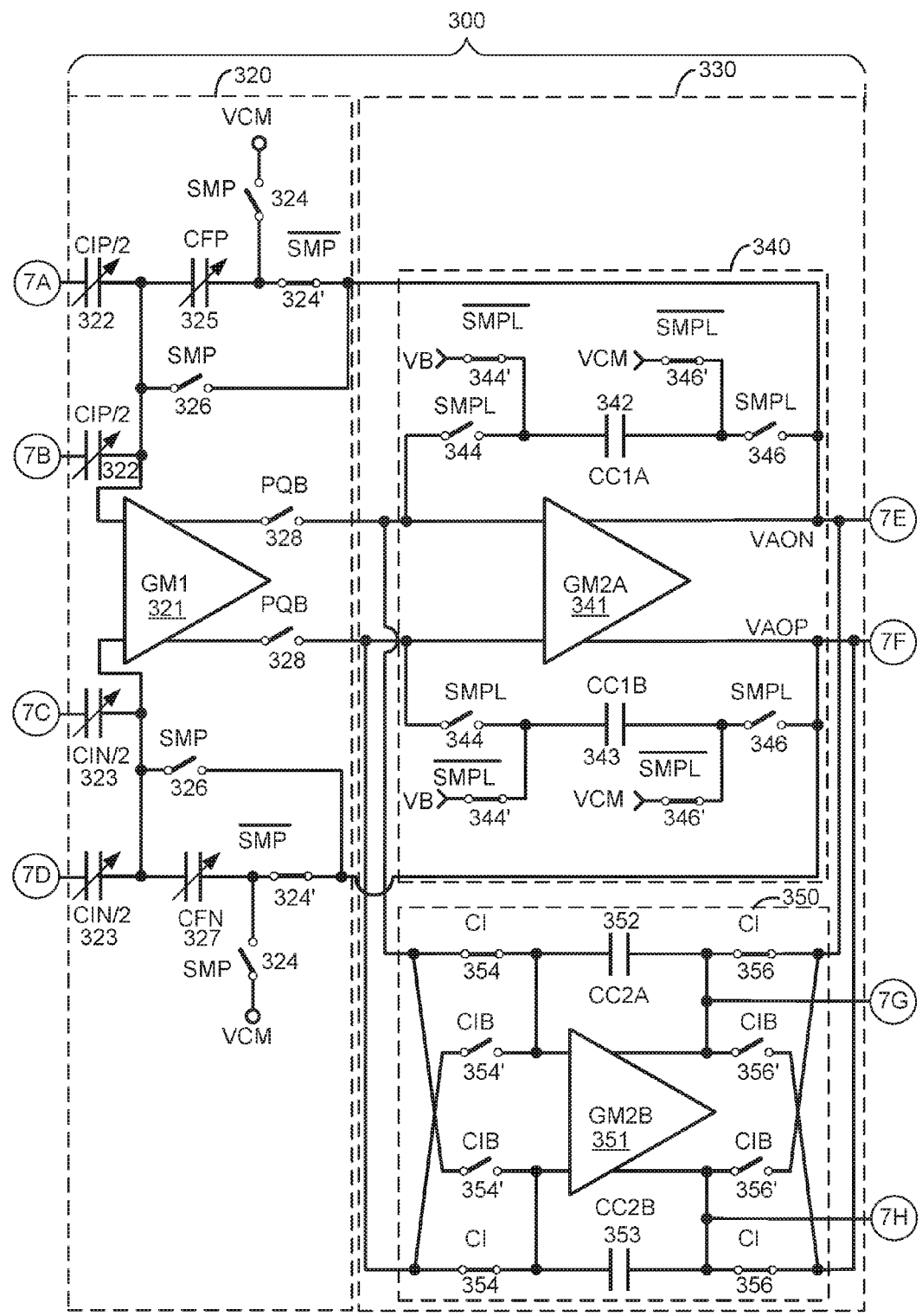
Figure 7C:
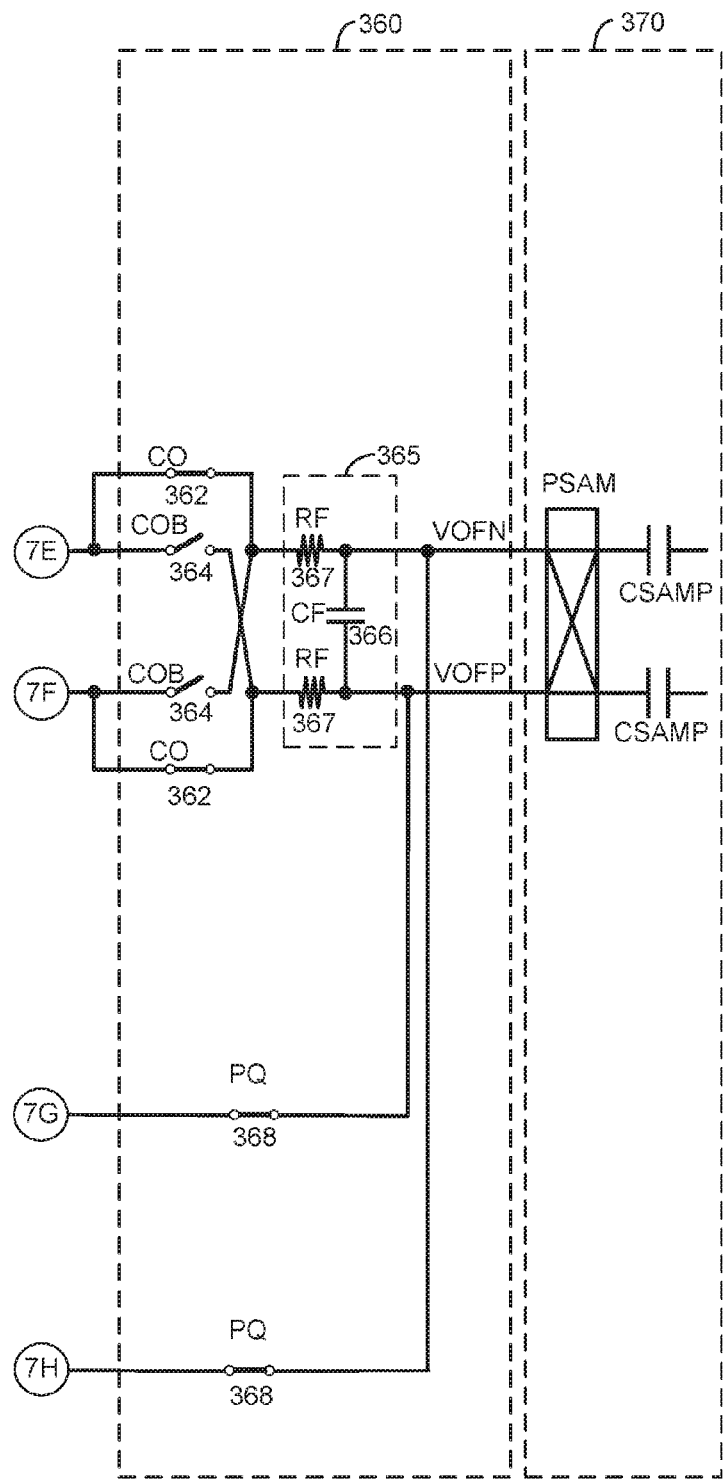

FIGS. 7A-7C are a circuit schematic that illustrates the capacitive gain amplifier circuit 300 of FIGS. 3A-3C during a recurring pre-charge portion of the CHP1 phase (RPCH1), according to an embodiment. The PBUF control signal is set to be in a low state to place the pre-charge buffer circuits 312 out of circuit and connect the pair of inputs VIP and VIN to the input stage amplifier circuit 320. Also, the input stage amplifier circuit 320 and the split output stage amplifier circuit 330 are disconnected from one another by setting the PQB control signal to be in a low state. In addition, the ADC sample capacitors CSAMP are pre-charged by the secondary output stage amplifier branch 350 by setting the PQ control signal to a high state to couple the output of the secondary output stage amplifier branch 350 with the input of the ADC sample capacitors CSAMP. Furthermore, the CHP1 phase is begun by setting the SMP control signal to be in a low state to couple the feedback capacitors CFP 325 and CFN 327 between the output of the split output stage amplifier circuit 330 and the input of the input stage differential amplifier circuit GM1 321, setting the SMPL control signal to be in a low state to respectively couple the pair of first Miller capacitors CC1A 342 and CC1B 343 between the first voltage source VB and the second voltage source VCM to hold their charge, setting the CI control signals to be in a high state and the CIB control signals to be in a low state to couple the secondary output stage amplifier branch 350 with the primary output stage amplifier branch 340 in a non-inverted orientation, and setting the CO control signal to be in a high state while setting the COB control signal to be in a low state to couple the output of the split output stage amplifier circuit 330 with the de-chopper and dynamic AAF circuit 360 in a non-inverted orientation.

During this RPCH1 phase, both the primary output stage amplifier branch 340 and the secondary output stage amplifier branch 350 charge the ADC sample capacitors CSAMP via the impedance network 365 as the differential amplifier circuits GM2A 341 and GM2B 351 work together in parallel, while simultaneously the secondary output stage amplifier branch 350 charges the ADC sample capacitors CSAMP directly while bypassing the impedance network 365 through the closure of switches 368 due to the switch control signal PQ having a logical high value. The charging path through the switches 368 is a fast charging path, while the charging path through the impedance network 365 is a slow charging path. In this phase, the charging of the ADC sample capacitors CSAMP by the secondary output stage amplifier branch 350 through the switches 368 dominates the charging through the impedance network 365.

The secondary output stage amplifier branch 350 pre-charges the ADC sample capacitors CSAMP while bypassing the impedance network 365. The impedance network 365 may create a low pass filter to reduce noise prior to sampling by the ADC. However, it also may slow down slewing of the ADC sample capacitor CSAMP between samples when the secondary output stage amplifier branch 350 drives the ADC through the impedance network 365. This is not an issue during the fine settling portion of the amplify phases, because only a small voltage change needs to be corrected from sample to sample. Therefore, by bypassing the impedance network 365 when the secondary output stage amplifier branch 350 pre-charges the ADC sample capacitor CSAMP during the pre-charge phases, the secondary output stage amplifier branch 350 may pre-charge the ADC sample capacitor CSAMP more quickly. Since the secondary output stage amplifier branch 350 may pre-charge the ADC sample capacitor CSAMP during times other than when the ADC is sampling the voltage of the ADC sample capacitor CSAMP, noise from the secondary output stage amplifier branch 350 is not an issue while the impedance network 365 is bypassed.

Figure 8A:
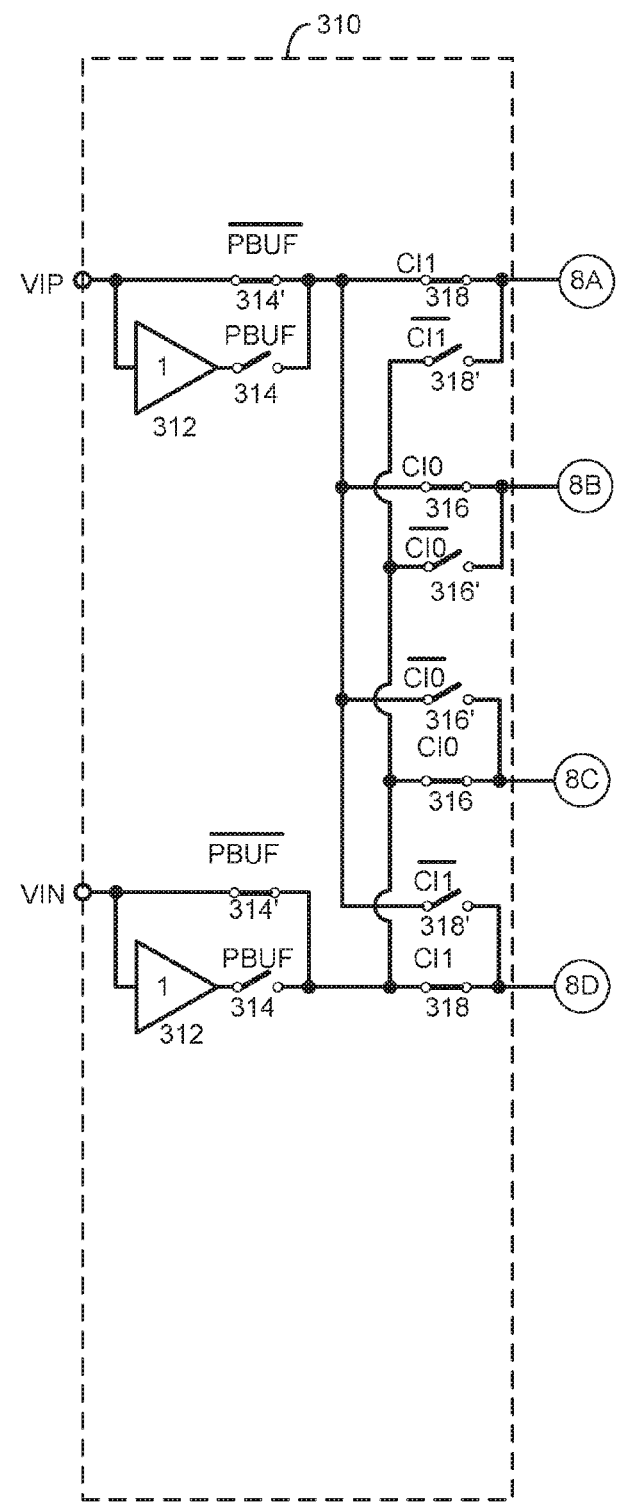
FIGS. 8A-8C are a circuit schematic that illustrates the capacitive gain amplifier circuit of FIGS. 3A-3C during the fine settling portion of the CHP1 phase, according to an embodiment.
Figure 8B:
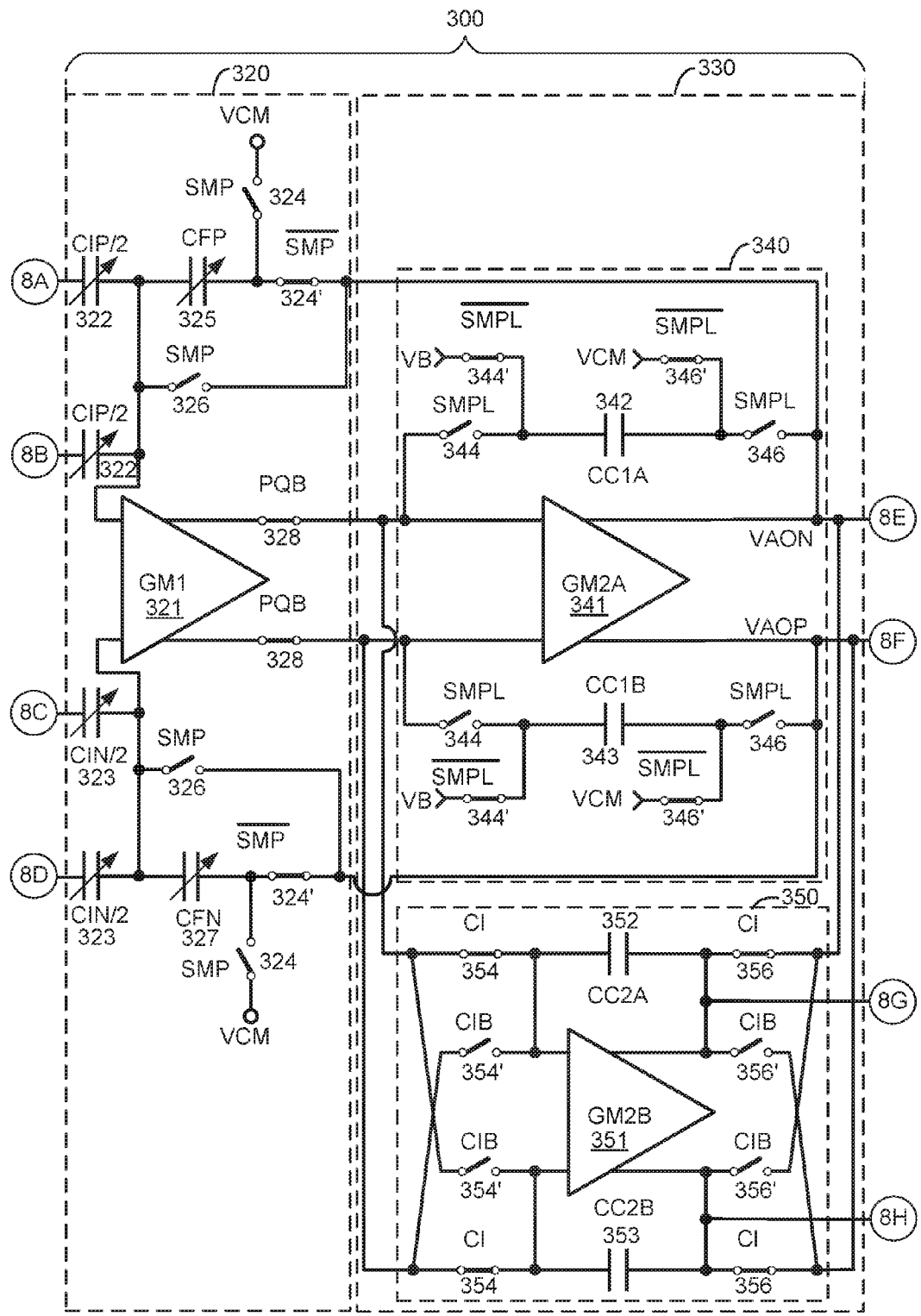
Figure 8C:
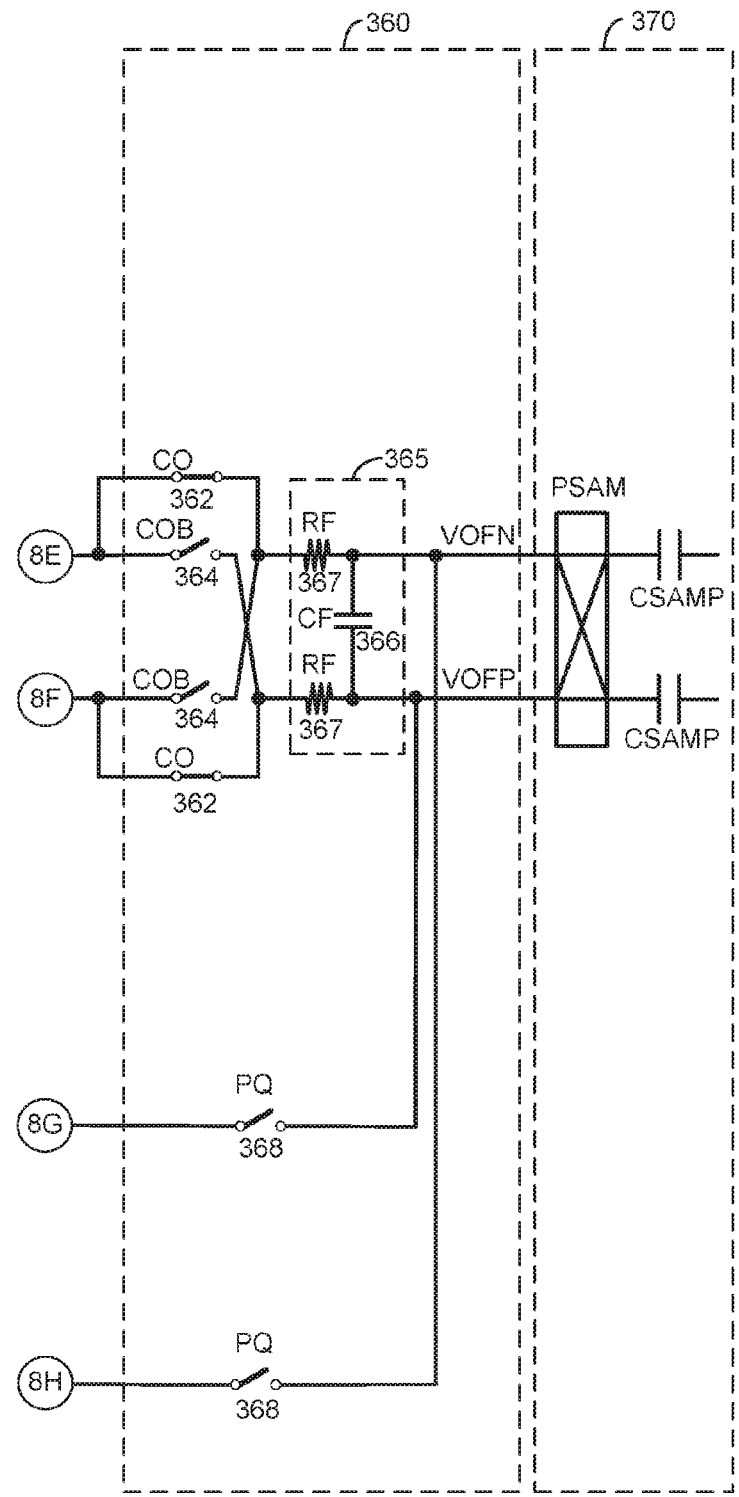

FIGS. 8A-8C are a circuit schematic that illustrates the capacitive gain amplifier circuit 300 of FIGS. 3A-3C during the recurring fine settling portion of the CHP1 phase (FCHP1), according to an embodiment. For fine settling, all of the input stage amplifier circuit 320 and both branches of the split output stage amplifier circuit 330 are coupled together and the output of the secondary output stage amplifier branch 350 is decoupled from the input of the ADC sample capacitors CSAMP by ADC pre-charge switches 368 to make the output of the capacitive gain amplifier circuit 300 input to the ADC input sample capacitor circuit 370 well-settled for accurate sampling by the ADC. This is done by setting the PQB control signal to be in a high state and the PQ control signal to be in a low state while the other control signals remain the same as in the prior pre-charge portion of the CHP1 phase.

As illustrated in FIG. 4, following the CHP1 phase, a DCMS phase commences. The DCMS phase is similar to the CMS phase described with reference to FIG. 5 except that the CI0 and CI1 control signals are set opposite in the DCMS phase compared to the CMS phase. The CI0 and CI1 control signals are set opposite in the DCMS phase compared to the CMS phase because in the DCMS phase, the capacitive gain amplifier circuit 300 switches from a non-inverting chop configuration (CHP1) to an inverting chop configuration (CHP2), whereas in the CMS phase, the capacitive gain amplifier circuit 300 switches from an inverting chop configuration (CHP2) to a non-inverting chop configuration (CHP1).

Following the DCMS phase, the CHP2 phase begins with an initial pre-charge sub-phase of a CHP2 phase (IPCH2), as illustrated in FIG. 4. The IPCH2 phase is similar to the IPCH1 phase described with reference to FIG. 6 except that the CI0 and CI1 control signals are set opposite in the IPCH2 phase compared to the IPCH1 phase. The CI0 and CI1 control signals are set opposite in the IPCH2 phase compared to the IPCH1 phase because in the IPCH2 phase, the capacitive gain amplifier circuit 300 is in an inverting chop configuration (CHP2), whereas in the IPCH1 phase, the capacitive gain amplifier circuit 300 is in a non-inverting chop configuration (CHP1).

Following the IPCH2 phase, the RPCH2 and FSCH2 phases alternate in a manner similar to that by which the RPCH1 and FSCH1 phases alternate as discussed above with respect to FIGS. 7 and 8, except that the CI0, CI1, CI, CIB, CO, and COB control signals are set opposite in the RPCH2 and FSCH2 phases compared to the RPCH1 and FSCH1 phases. The CI0, CI1, CL CIB, CO, and COB control signals are set opposite in the RPCH2 and FSCH2 phases compared to the RPCH1 and FSCH1 phases because in the RPCH2 and FSCH2 phases, the capacitive gain amplifier circuit 300 is in an inverting chop configuration (CHP2), whereas in the RPCH1 and FSCH1 phases, the capacitive gain amplifier circuit 300 is in a non-inverting chop configuration (CHP1).

Figure 9A:
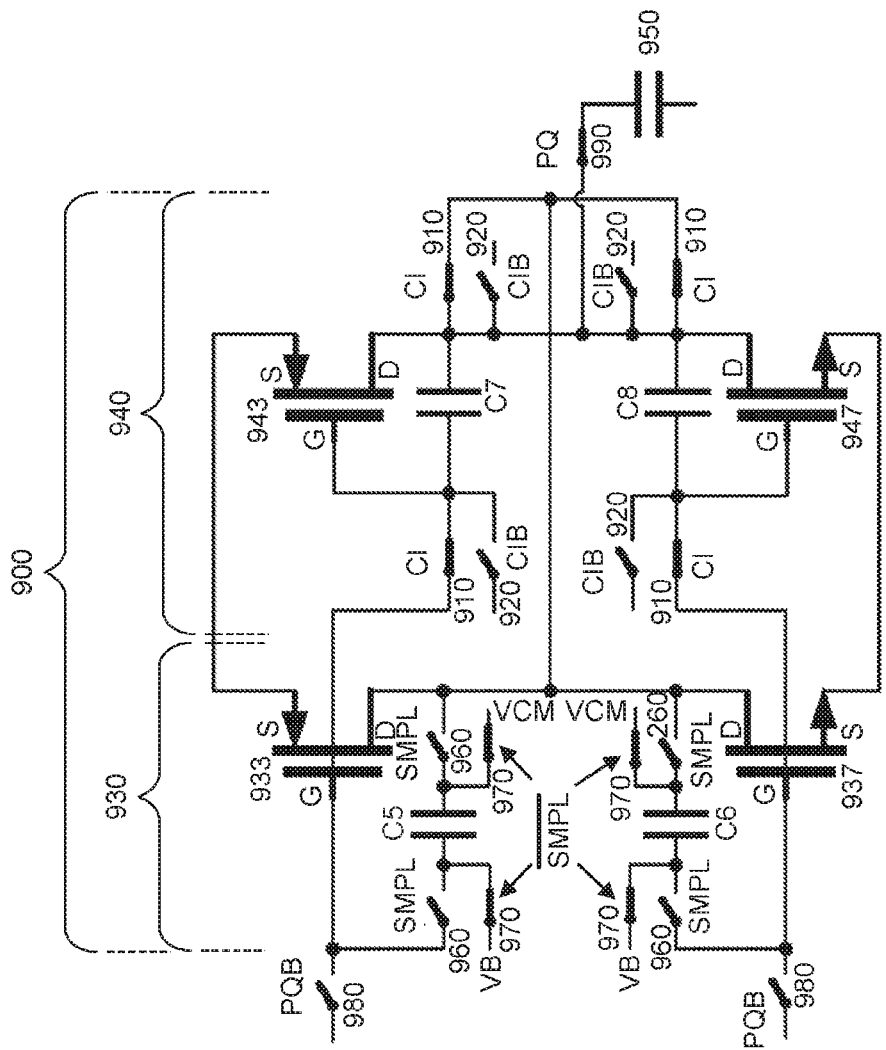
FIGS. 9A and 9B are circuit schematics that illustrate a split Miller compensated output stage circuit portion corresponding to one polarity of the split output stage amplifier circuit of the capacitive gain amplifier circuit of FIGS. 3A-3C, according to an embodiment.
Figure 9B:
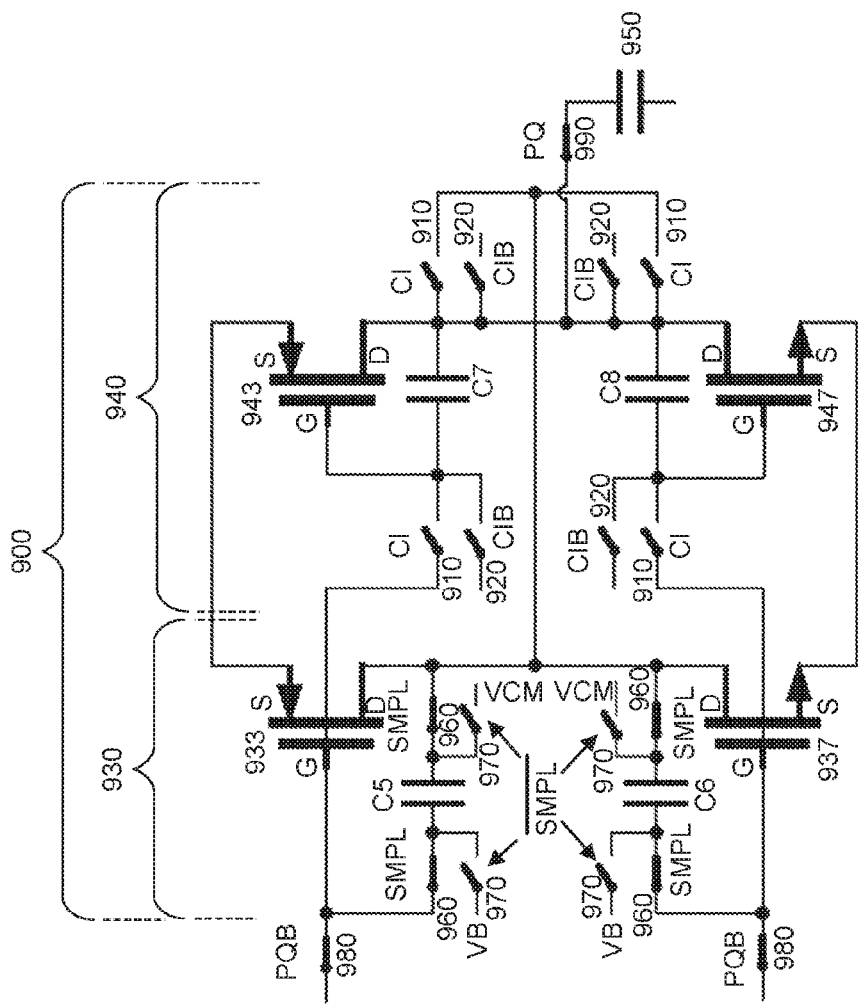

FIGS. 9A and 9B are circuit schematics that illustrate a split Miller compensated output stage circuit portion 900 corresponding to one polarity of the split output stage amplifier circuit 330 of the capacitive gain amplifier circuit 300 of FIGS. 3A-3C, according to an embodiment. The split Miller compensated output stage circuit portion 900 may include an embodiment of one half of the combination of the differential amplifier circuit GM2A 341 and differential amplifier circuit GM2B 351 corresponding to one polarity. In other words, one instantiation of an embodiment of the split Miller compensated output stage circuit portion 900 may provide an output at node VAON of the split output stage amplifier circuit 330, while another instantiation of the embodiment of the split Miller compensated output stage circuit portion 900 may provide an output at node VAOP of the split output stage amplifier circuit 330. Similar to that previously discussed in relation to the split output stage amplifier circuit 330, the split Miller compensated output stage circuit portion 900 may pre-charge a sampling capacitor 950 at an input of an analog to digital converter (ADC) circuit during the CMS phase to improve the accuracy of the ADC's first sampled data after chopping. The sampling capacitor 950 may be an embodiment of the ADC sampling capacitor CSAMP illustrated in FIG. 3C.

FIG. 9A illustrates the split Miller compensated output stage circuit portion 900 during a CHP1 amplify phase, in which both a first branch 930 and a second branch 940 are coupled in parallel with each other to pre-charge the ADC circuit's sampling capacitor 950 prior to an ADC sampling period. The first branch 930 may be an embodiment of the primary output stage amplifier branch 340 that includes the differential amplifier circuit GM2A 341, while the second branch 940 may be an embodiment of the secondary output stage amplifier branch 350 that includes the differential amplifier circuit GM2B 351. While FIG. 9A illustrates the split Miller compensated output stage circuit portion 900 in the CHP1 phase with switches 910 closed according to a logical high value of the switch control signal CI and switches 920 open according to a logical low value of the switch control signal CIB, the split Miller compensated output stage circuit portion 900 during the CHP2 phase would only differ by having switches 910 open according to a logical low value of the switch control signal CI and switches 920 closed according to a logical high value of the switch control signal CIB.

In an embodiment, the devices illustrated in FIGS. 9A and 9B may be implemented with metal oxide semiconductor (MOS) devices, for example, n-type MOS (NMOS) devices and/or p-type MOS (PMOS) devices. While materials identified by the terms "metal" and "oxide" may be present in, for example, a MOS field effect transistor (MOSFET), MOS transistors may have gates made out of materials other than metals, such as polysilicon, and may have dielectric regions made from dielectrics other than silicon oxide, e.g., a high-k dielectric. In various embodiments, the devices illustrated in FIGS. 9A and 9B may be implemented using other devices on silicon, compound semiconductor, or any other suitable semiconductor.

In the embodiment illustrated in FIG. 9A, a source S of NMOS transistor 937 of the first branch 930 and a source S of NMOS transistor 947 of the second branch 940 are coupled together, while a source S of PMOS transistor 933 of the first branch 930, a source S of PMOS transistor 943 of the second branch 940 are coupled together, drains D of the PMOS transistor 933 and NMOS transistor 937 are coupled together, and drains D of the PMOS transistor 943 and NMOS transistor 947 are coupled together. During a CHP1 amplify phase, the drains of all four transistors 933, 937, 943, and 947 may be coupled together to pre-charge the ADC sampling capacitor 950 while the switch 990 is closed according to a switch control signal PQ at a logical high value prior to an ADC sampling period. By charging the ADC sampling capacitor 950 by both the first branch 930 and the second branch 940 during the amplify phase prior to an ADC sampling period, the ADC sampling capacitor 950 may be charged and settle rapidly without there being an additional buffer circuit disposed between the split Miller compensated output stage circuit portion 900 and the ADC sampling capacitor 950.

As illustrated, the gate G and drain D of transistors 943 and 947 of the second branch 940 are coupled in parallel with the pair of Miller capacitors C7 and C8. During the CHP1 amplify phase, the inputs and outputs of the first branch 930 and the second branch 940 are coupled together by switches 910 so that the pair of Miller capacitors C7 and C8 are also coupled in parallel with the first branch 930 according to the CI signal being at a logical high value. During the CHP2 amplify phase, however, switches 920 cause the second branch 940 to couple in parallel with a corresponding first branch 930 of the other polarity split Miller compensated output stage circuit portion 900 according to the CIB signal being at a logical high value. Since the split Miller compensated output stage circuit portion 900 represents a single polarity of the split output stage amplifier circuit 330 of the capacitive gain amplifier circuit 300 of FIGS. 3A-3C, the connections between the switches 920 and the other polarity instantiation of the split Miller compensated output stage circuit portion 900 is not explicitly shown in FIGS. 9A and 9B. The switches 920 correspond to the switches 354' and 356' of FIG. 3B.

Also, in the illustrated embodiment during the CHP1 amplify phase, the Miller capacitors C5 and C6 are disconnected from the respective input and output nodes of the differential amplifier of the first branch 930 by switches 960 according to a switch control signal SMPL at a logical low value, and instead connected between a bias voltage source VB and a common mode voltage source VCM by switches 970 according to the switch control signal SMPL at a logical low value in a manner similar to that illustrated in FIG. 7B. Furthermore, the first branch 930 and second branch 940 are disconnected from an output of an input signal (e.g., from a buffer or input stage amplifier) by switches 980 according to a switch control signal PQB having a logical low value during a first portion of the amplify phase to disconnect the split Miller compensated output stage circuit portion 900 from circuitry providing the input signal while pre-charging the ADC sampling capacitor 950 during a first portion of the amplify phase. The split Miller compensated output stage circuit portion 900 may be reconnected to the circuitry providing the input signal during a fine settling portion of the amplify phase by closing switches 980 according to the switch control signal PQB having a logical high value during a second portion of the amplify phase, as illustrated in FIG. 8B. Thus, the split Miller compensated output stage circuit portion 900 may be disconnected from the circuitry providing the input signal during an amplify stage to pre-charge the ADC sampling capacitor 950 during the first portion of the amplify phase.

FIG. 9B illustrates the split Miller compensated output stage circuit portion 900 during a CMS/DCMS phase, in which the inputs and outputs of the second branch 940 along with the Miller capacitors C7 and C8 are disconnected from the inputs and outputs of the first branch 930 by the switches 910 and 920 according to respective switch control signals CI and CIB being at logical low values. Also, Miller capacitors C5 and C6 are coupled across respective input/output pairs of the transistors 933 and 937 of the first branch 930 by switches 960 and disconnected from the bias voltage source VB and the common mode voltage source VCM by switches 970 according to a switch control signal SMPL being at a logical high value. The Miller capacitors C5 and C6 may be used during the CMS phase to set up the common mode voltage for the first branch 930. Meanwhile, the output of the second branch 940 is coupled with the ADC sampling capacitor 950 by the switch 990 according to the switch control signal PQ being at a logical high value to pre-charge the ADC sampling capacitor 950 during the CMS phase according to signal values stored on the Miller capacitors C7 and C8 from the CHP1 amplify phase. In addition, the input to the first branch 930 is coupled with circuitry providing the input signal by switches 980 according to the switch control signal PQB being at a logical high signal.

By pre-charging the ADC sampling capacitor 950 by the split Miller compensated output stage circuit portion 900 as discussed above, the ADC sampling capacitor 950 may see a correct input voltage during the CMS phase as well as the amplify phases, which increases the accuracy of the first sample of the ADC after chopping. Furthermore, because the second branch 940 pre-charges the ADC sampling capacitor 950 during the CMS phase while having its inputs and outputs disconnected from the first branch 930, the ADC sampling capacitor 950 may be pre-charged according to the voltage values of the Miller capacitors C7 and C8 as of the end of the prior amplify phase, and the second branch 940 may pre-charge the ADC sampling capacitor 950 both rapidly and directly without any additional intervening buffer circuits, thereby saving power and space.

In various embodiments, the split Miller compensated output stage circuit portion 900 shown in FIGS. 9A and 9B may also be used to overcome a pre-charge buffer offset effect of buffer circuits upstream of the split Miller compensated output stage circuit portion 900. Such pre-charge buffer circuits may include unity gain buffer circuits used to reduce input current at an input to a capacitive gain amplifier circuit that may include the split Miller compensated output stage circuit portion 900, especially due to charging of input capacitors when chopping the input signals. The pre-charge buffer circuits may be selectively switched in and out of an input path to a capacitive gain amplifier circuit including the split Miller compensated output stage circuit portion 900 according to whether the capacitive gain amplifier circuit is in a pre-charge phase.

During a pre-charge phase, the capacitive gain amplifier circuit may be driven by a voltage VIN+VOFFSET, representing an input voltage plus an offset voltage of the pre-charge buffer circuits. This driving voltage may be reflected at an output voltage of the capacitive gain amplifier circuit of GAIN×(VIN+VOFFSET), where GAIN is the amplification factor or gain of the capacitive gain amplifier circuit. Because the offset voltage of the pre-charge buffer circuits may cause the output voltage of the capacitive gain amplifier circuit to clip at a voltage rail or ground, and because the pre-charge buffer circuits consume a significant amount of power when operating, it may be desirable to only use the pre-charge buffer circuits during chopping. However, after the pre-charge buffer circuits are bypassed, the capacitive gain amplifier circuit may need a significant amount of time to recover, thereby worsening the settling time of the capacitive gain amplifier circuit. To avoid this problem, embodiments may disconnect the split Miller compensated output stage circuit portion 900 from an input stage upstream of the split Miller compensated output stage circuit portion 900 using switches 980 during a first portion of the amplify phase while the ADC sampling capacitor 950 is charged. Any voltage offset due to the pre-charge buffer circuits may not be seen by the ADC sampling capacitor 950, since it is pre-charged according to the values of the Miller capacitors C7 and C8 as set at the end of the last amplify phase. The second branch 940 may not see any voltage offset due to the pre-charge buffer circuits because its input may be disconnected from the input of the first branch 930 when the pre-charge buffer circuits are connected to the input of the first branch 930, and the voltage values of the Miller capacitors C7 and C8 may therefore also not be affected by any voltage offset due to the pre-charge buffer circuits.

Figure 10A:
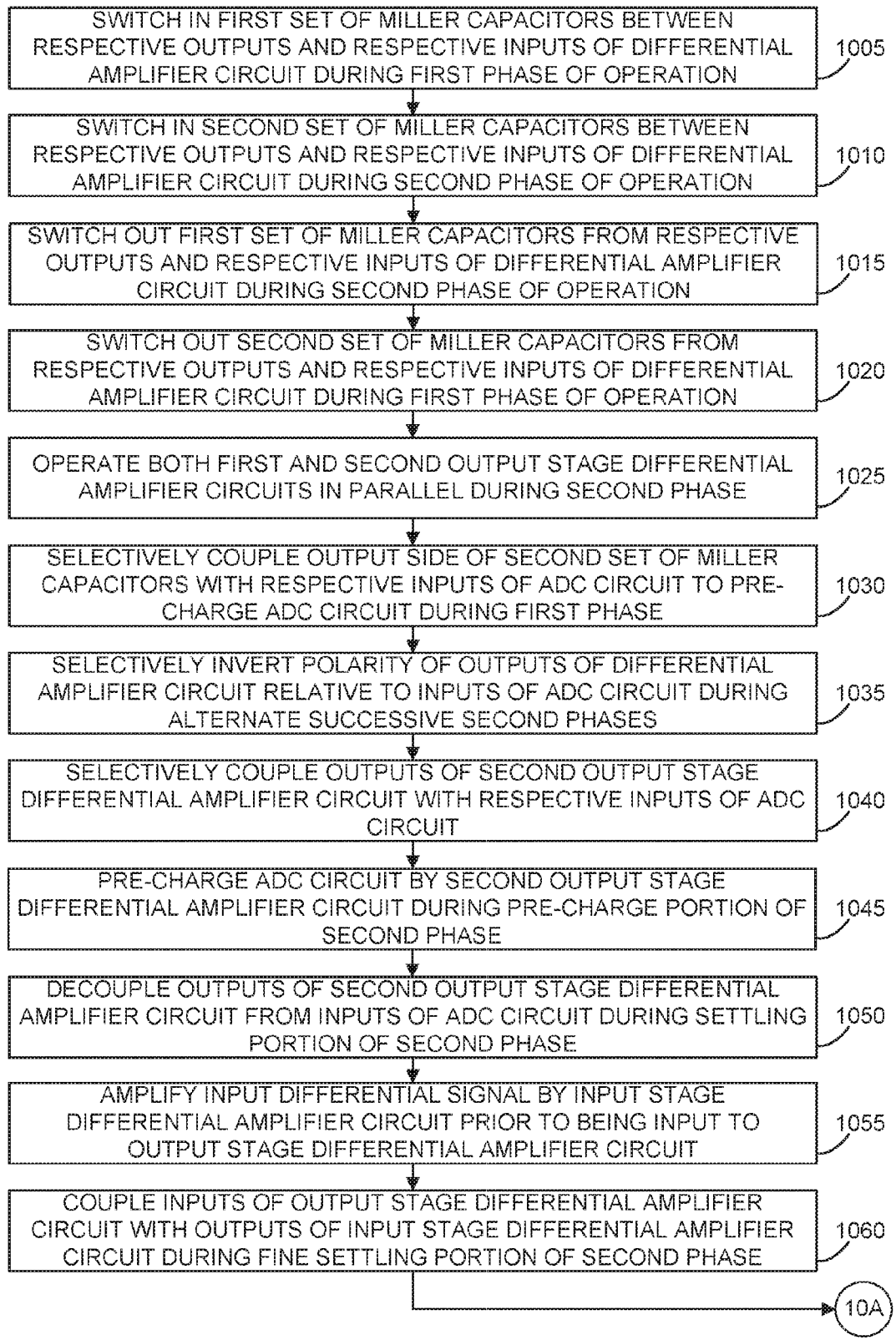
FIGS. 10A-10B are a block diagram that illustrates a method of capacitive gain amplification using a differential amplifier circuit, according to an embodiment.
Figure 10B:
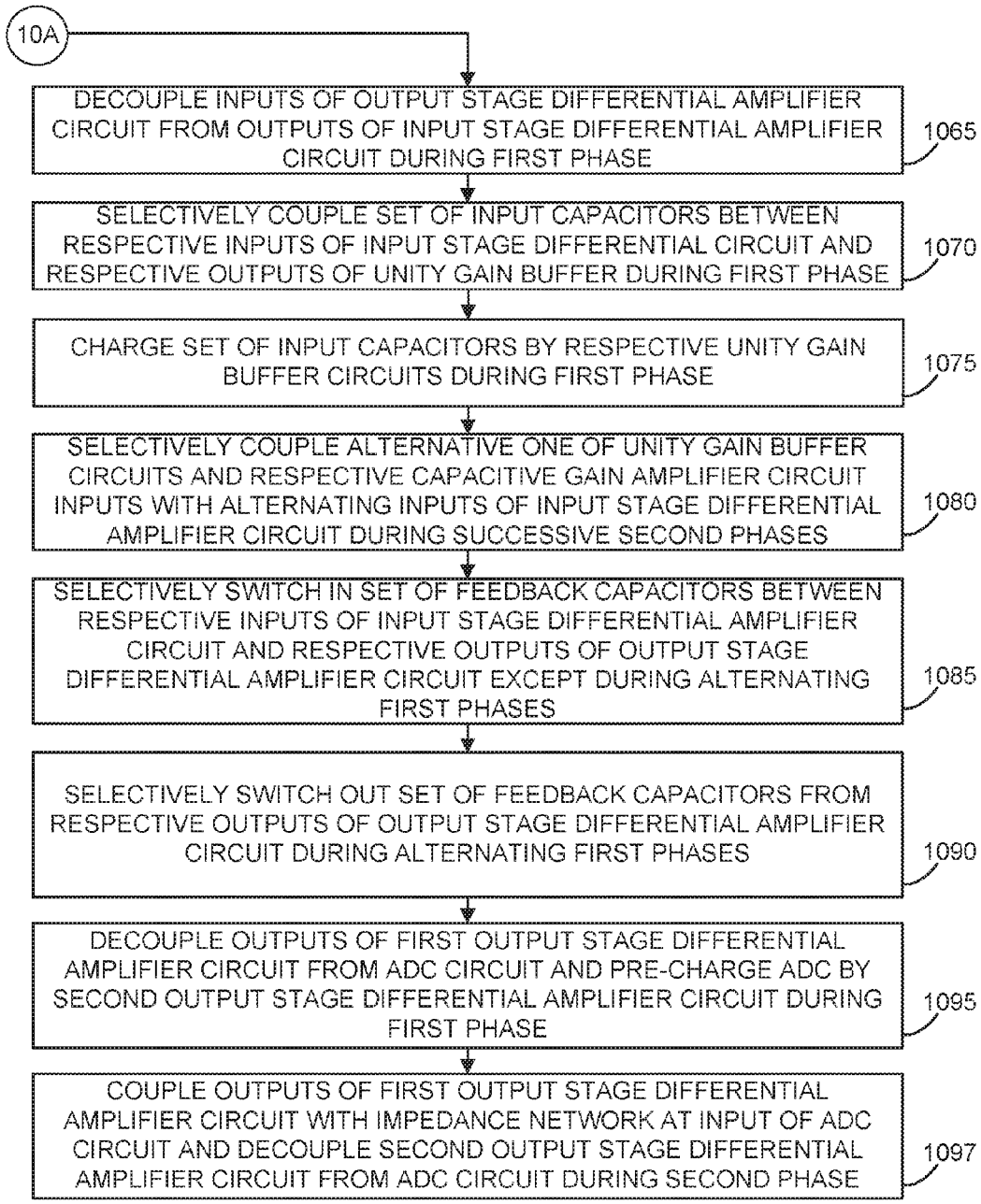

FIG. 10 is a block diagram that illustrates a method of capacitive gain amplification using a differential amplifier circuit, according to an embodiment.

In an operation 1005, a first set of Miller capacitors may be switched in between respective outputs and respective inputs of a differential amplifier circuit during a first phase of operation. The first phase of operation may reset the differential amplifier circuit.

In an operation 1010, a second set of Miller capacitors may be switched in between respective outputs and respective inputs of the differential amplifier circuit during a separate second phase of operation. The second phase may chop a signal being amplified by the differential amplifier circuit. The switching in of the second set of Miller capacitors may be to alternating inputs of the differential amplifier circuit during successive second phases.

In an operation 1015, the first set of Miller capacitors may be switched out from respective outputs and respective inputs of the differential amplifier circuit during the second phase. The first set of Miller capacitors may be switched out to retain electrical charge on the first set of Miller capacitors between successive first phases.

In an operation 1020, the second set of Miller capacitors may be switched out from respective outputs and respective inputs of the differential amplifier circuit during the first phase. The second set of Miller capacitors may be switched out to retain electrical charge on the second set of Miller capacitors between successive second phases.

In an operation 1025, wherein the differential amplifier circuit of operations 1005-1020 is a first output stage differential amplifier circuit, both the first output stage differential amplifier circuit and a second output stage differential amplifier circuit may operate in parallel during the second phase, wherein the second output stage differential amplifier circuit has inputs respectively coupled with the input side of the second set of Miller capacitors and has outputs respectively coupled with the output side of the second set of Miller capacitors.

In an operation 1030, the output side of the second set of Miller capacitors may be selectively coupled with respective inputs of an analog to digital converter (ADC) circuit by a first set of switches of an output de-chopper circuit to pre-charge the ADC circuit during the first phase. The de-chopper circuit may be cascaded with the differential amplifier circuit.

In an operation 1035, a polarity of the outputs of the differential amplifier circuit may be selectively inverted relative to the inputs of the ADC circuit during alternate successive second phases by a second set of switches of the output de-chopper circuit.

In an operation 1040, wherein the differential amplifier circuit of operations 1005-1020 is a first output stage differential amplifier circuit, outputs of a second output stage differential amplifier circuit may be selectively coupled with respective inputs of the ADC circuit. The second output stage differential amplifier circuit may have inputs respectively coupled with the input side of the second set of Miller capacitors and have outputs respectively coupled with a corresponding output side of the second set of Miller capacitors.

In an operation 1045, the ADC circuit may be pre-charged by the second output stage differential amplifier circuit during a pre-charge portion of the second phase.

In an operation 1050, the outputs of the second output stage differential amplifier circuit may be decoupled from the inputs of the ADC circuit during a settling portion of the second phase.

In an operation 1055, wherein the differential amplifier circuit of operations 1005-1020 is an output stage differential amplifier circuit, an input differential signal may be amplified prior to being input to the output stage differential amplifier circuit by an input stage differential amplifier circuit cascaded with the output stage differential amplifier circuit.

In an operation 1060, inputs of the output stage differential amplifier circuit may be coupled with respective outputs of the input stage differential amplifier circuit during a fine settling portion of the second phase.

In an operation 1065, inputs of the output stage differential amplifier circuit may be decoupled from the outputs of the input stage differential amplifier circuit during the first phase.

In an operation 1070, a set of input capacitors may be selectively coupled between respective inputs of the input stage differential circuit and respective outputs of unity gain buffer circuits during the first phase. The unity gain buffer circuits may receive input from respective capacitive gain amplifier circuit inputs collectively forming a differential capacitive gain amplifier circuit input.

In an operation 1075, the set of input capacitors may be charged by the respective unity gain buffer circuits during the first phase.

In an operation 1080, an alternative one of the unity gain buffer circuits and the respective capacitive gain amplifier circuit inputs may be selectively communicatively coupled with alternating inputs of the input stage differential amplifier circuit during successive second phases by a set of chopper switches.

In an operation 1085, a set of feedback capacitors may be selectively switched in between respective inputs of the input stage differential amplifier circuit and respective outputs of the output stage differential amplifier circuit except during alternating first phases.

In an operation 1090, the set of feedback capacitors may be selectively switched out from respective outputs of the output stage differential amplifier circuit during alternating first phases.

In an operation 1095, wherein the output stage differential amplifier circuit of operations 1085 and 1090 is a first output stage differential amplifier circuit, the outputs of the first output stage differential amplifier circuit may be decoupled from an analog to digital converter (ADC) circuit and the ADC circuit may be pre-charged by a second output stage differential amplifier circuit during the first phase. The second output stage differential amplifier circuit may have inputs respectively coupled with the input side of the second set of Miller capacitors and have outputs respectively coupled with a corresponding output side of the second set of Miller capacitors during the first phase.

In an operation 1097, wherein the output stage differential amplifier circuit of operations 1085 and 1090 is a first output stage differential amplifier circuit, the outputs of the first output stage differential amplifier circuit may be coupled with an impedance network at an input of the ADC circuit and the second output stage differential amplifier circuit may be decoupled from the ADC circuit during the second phase.

Figure 11:
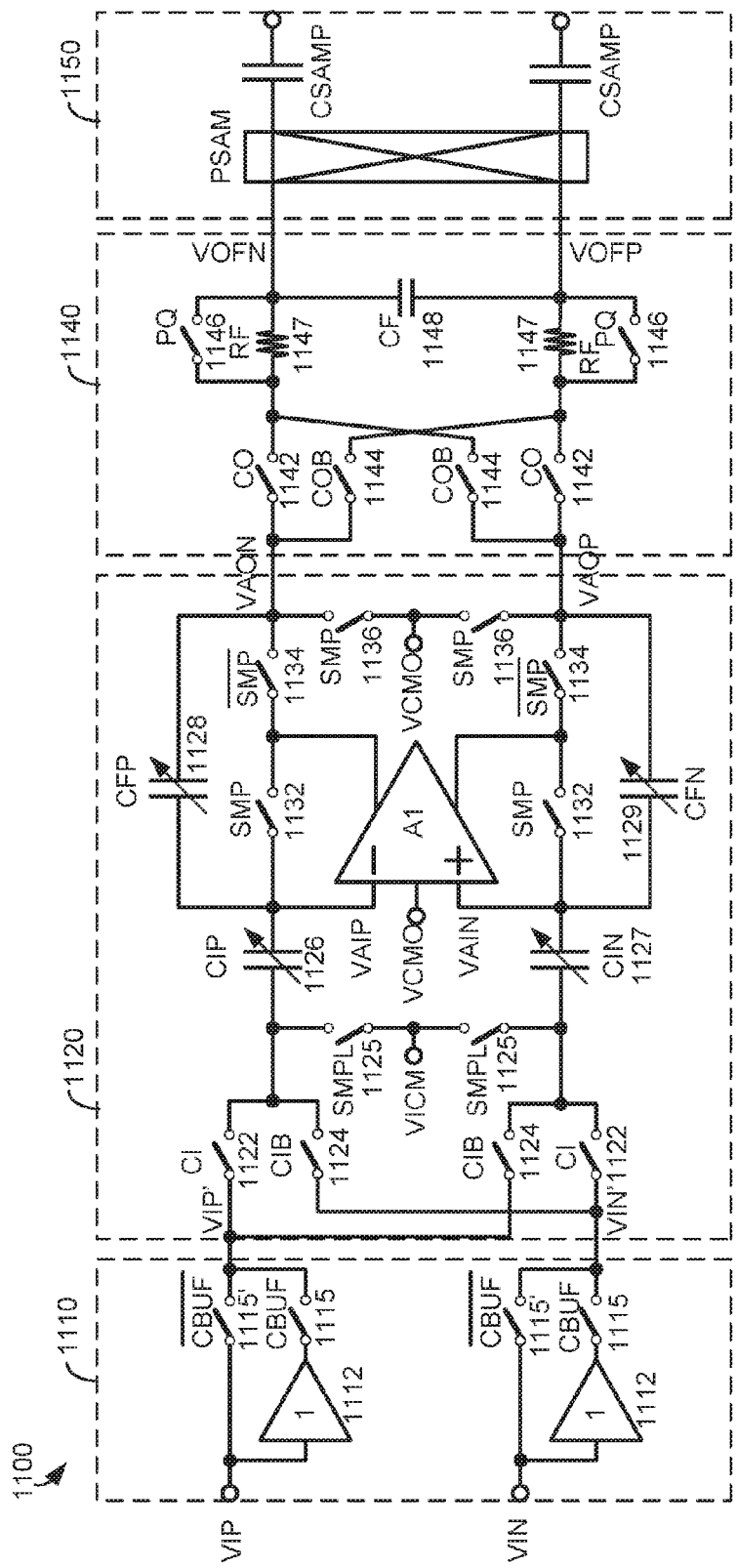
FIG. 11 is a circuit schematic that illustrates a capacitive gain amplifier circuit having a Miller compensated differential amplifier circuit that may drive an ADC directly without intervening buffer circuits, according to an embodiment.

FIG. 11 is a circuit schematic that illustrates a capacitive gain amplifier circuit 1100 having a Miller compensated amplifier circuit A1 that may drive an ADC directly without intervening buffer circuits, according to an embodiment. The capacitive gain amplifier circuit 1100 may be an embodiment of the capacitive gain amplifier circuit 300 of FIGS. 3A-3C or the capacitive gain amplifier circuit 1300 of FIG. 13. The Miller compensated amplifier circuit A1 may take any of a range of forms, including examples previously discussed herein. For example, the Miller compensated amplifier circuit A1 may include an embodiment of the two-stage Miller compensated amplifier circuit 100 shown in FIG. 1, in various embodiments. In other embodiments, the Miller compensated amplifier circuit A1 may take the form of a Miller compensated amplifier circuit included within the capacitive gain amplifier circuit 300, for example, the differential amplifier circuit GM1 321 cascaded with the split output stage amplifier circuit 330, or the form of a Miller compensated amplifier circuit included within the capacitive gain amplifier circuit 1300.

An input current cancellation circuit 1110 receives a differential input including positive polarity input VIP and negative polarity input VIN, and is cascaded with a chopper and capacitive gain network 1120, a de-chopper and dynamic anti-alias filter (AAF) circuit 1140, and an ADC double sample capacitor circuit 1150, each of which may input and output differential signals. For clarity, further details of the ADC are not shown.

In the illustrated embodiment, the input current cancellation circuit 1110 includes a pair of pre-charge buffer circuits 1112 respectively coupled with the pair of inputs VIP and VIN. The pre-charge buffer circuits 1112 may be unity gain buffer circuits. An output of each pre-charge buffer circuit 1112 is coupled in series with a buffer output switch 1115 while a set of buffer bypass switches 1115' provide a selectable bypass circuit to bypass each pre-charge buffer circuit 1112. When a buffer switch control signal CBUF is at a logical high value, the buffer output switches 1115 are set to a closed state to establish a circuit path from the pair of inputs VIP and VIN through the respective pre-charge buffer circuits 1112 to input nodes VIP' and VIN' of the chopper and capacitive gain network 1120, while the buffer bypass switches 1115' are set to an open state. Conversely, when the buffer switch control signal CBUF is at a logical low value, the buffer output switches 1115 are set to an open state while the buffer bypass switches 1115' are set to a closed state to establish a circuit path from the pair of inputs VIP and VIN bypassing the respective pre-charge buffer circuits 1112 to the input nodes VIP' and VIN' of the chopper and capacitive gain network 1120.

The pre-charge buffer circuits 1112 may reduce input current to the capacitive gain amplifier circuit 1100 when placed in circuit, for example, during common mode sample phase or chopping of the chopper and capacitive gain network 1120, when input capacitors CIP 1126 and CIN 1127 may be charged or slewed.

The chopper and capacitive gain network 1120 includes chopper switches 1122 and 1124 that chop differential input signals received at nodes VIN' and VIP' according to chopper timing control signals CI and CIB, respectively, prior to being provided to input capacitors CIP 1126 and CIN 1127 which couple between respective outputs of the chopper switches 1122 and 1124 and inputs VAIP and VAIN of the Miller compensated amplifier circuit A1. When a common mode sample timing control signal SMPL is in a logical low state, the outputs of the chopper switches 1122 and 1124 couple with the respective input capacitors CIP 1126 and CIN 1127 to drive the capacitive gain network including the Miller compensated amplifier circuit A1.

The common mode switches 1125 couple the outputs of the chopper switches 1122 and 1124 together with the inputs to the input capacitors CIP 1126 and CIN 1127 to set a common mode voltage VICM at the input side of the input capacitors CIP 1126 and CIN 1127 when the common mode sample timing control signal SMPL is in a logical high state.

Common mode switches 1132 couple respective inputs and outputs of the Miller compensated amplifier circuit A1 together while common mode switches 1134 decouple the outputs of the Miller compensated amplifier circuit A1 from respective output sides of feedback capacitors CFP 1128 and CFN 1129 and common mode switches 1136 couple differential output nodes VAOP and VAON together with the outputs of feedback capacitors CFP 1128 and CFN 1129 to set a common mode voltage VCMO at the output nodes VAOP and VAON when common mode sample timing control signal SMP is in a logical high state.

When the common mode sample timing control signal SMP is in a logical low state, the common mode switches 1134 couple the outputs of the Miller compensated amplifier circuit A1 with respective output sides of feedback capacitors CFP 1128 and CFN 1129 and respective output nodes VAOP and VAON. The capacitive gain network is in an amplify phase when the common mode sample timing control signal SMP is in a logical low state.

The capacitors CIP 1126, CIN 1127, CFP 1128, and CFN 1129 may be variable capacitors. In various embodiments, each of the capacitors CIP 1126, CIN 1127, CFP 1128, and CFN 1129 may include an array of switched capacitor devices. During operation, the set of input capacitors CIP 1126, CIN 1127 may be set to have equal capacitance to each other, and the set of feedback capacitors CFP 1128, CFN 1129 may be set to have equal capacitance to each other. A ratio of capacitances between the input capacitors CIP 1126, CIN 1127 and the feedback capacitors CFP 1128, CFN 1129 may be controlled by a control signal to provide a programmable gain of the capacitive gain amplifier circuit 1100.

The de-chopper and dynamic AAF circuit 1140 includes de-chopper switches 1142 and 1144 that de-chop differential output signals provided by the chopper and capacitive gain network 1120 at output nodes VAOP and VAON according to de-chopper timing control signals CO and COB, respectively, prior to being provided to the dynamic AAF circuit that includes resistors RF 1147 and capacitor CF 1148.

When a pre-charge ADC timing control signal PQ is in a low state, the dynamic AAF circuit that includes resistors RF 1147 and capacitor CF 1148 band-limits noise in the differential signal being output from the capacitive gain amplifier circuit 1100 before being input to the ADC double sample capacitor circuit 1150 at differential output nodes VOFP and VOFN. Because the dynamic AAF circuit limits a bandwidth of a signal, the speed by which the ADC double sample capacitor circuit 1150 can be charged by the capacitive gain amplifier circuit 1100 through the dynamic AAF circuit when the pre-charge ADC timing control signal PQ is in a low state is also limited by an RC constant of an impedance network including the resistors RF 1147 and the capacitor CF 1148. When the pre-charge ADC timing control signal PQ is set to a logical high state, the capacitive gain amplifier circuit 1100 may rapidly charge the ADC double sample capacitor circuit 1150 by bypassing the impedance network including the resistors RF 1147 and the capacitor CF 1148 by switches 1146. After the ADC double sample capacitor circuit 1150 is pre-charged, the ADC may sample the voltage at the ADC double sample capacitor circuit 1150 while the impedance network including the resistors RF 1147 and the capacitor CF 1148 band-limits the noise and the capacitive gain amplifier circuit 1100 outputs a finely settled voltage during a fine settling portion of an amplify phase. For example, in an amplify CHP1 or CHP2 phase, during the start of an ADC sample period, the AAF may be bypassed when the pre-charge ADC timing control signal PQ is set to a logical high state and the ADC sampling capacitors CSAMP may be charged to a rough value in a short period of time. Then, during a later portion of the ADC sample period, the AAF may be placed in circuit again when the pre-charge ADC timing control signal PQ is set to a logical low state so that the impedance network including the resistors RF 1147 and the capacitor CF 1148 band-limits the noise and the capacitive gain amplifier circuit 1100 outputs a finely settled voltage during a fine settling portion of an amplify phase. The ADC may then sample an accurate voltage on the ADC sample capacitors CSAMP. The ability to rapidly charge the ADC double sample capacitor circuit 1150 enables the capacitive gain amplifier circuit 1100 to drive an ADC directly without buffer amplifiers in between.

Figure 12:
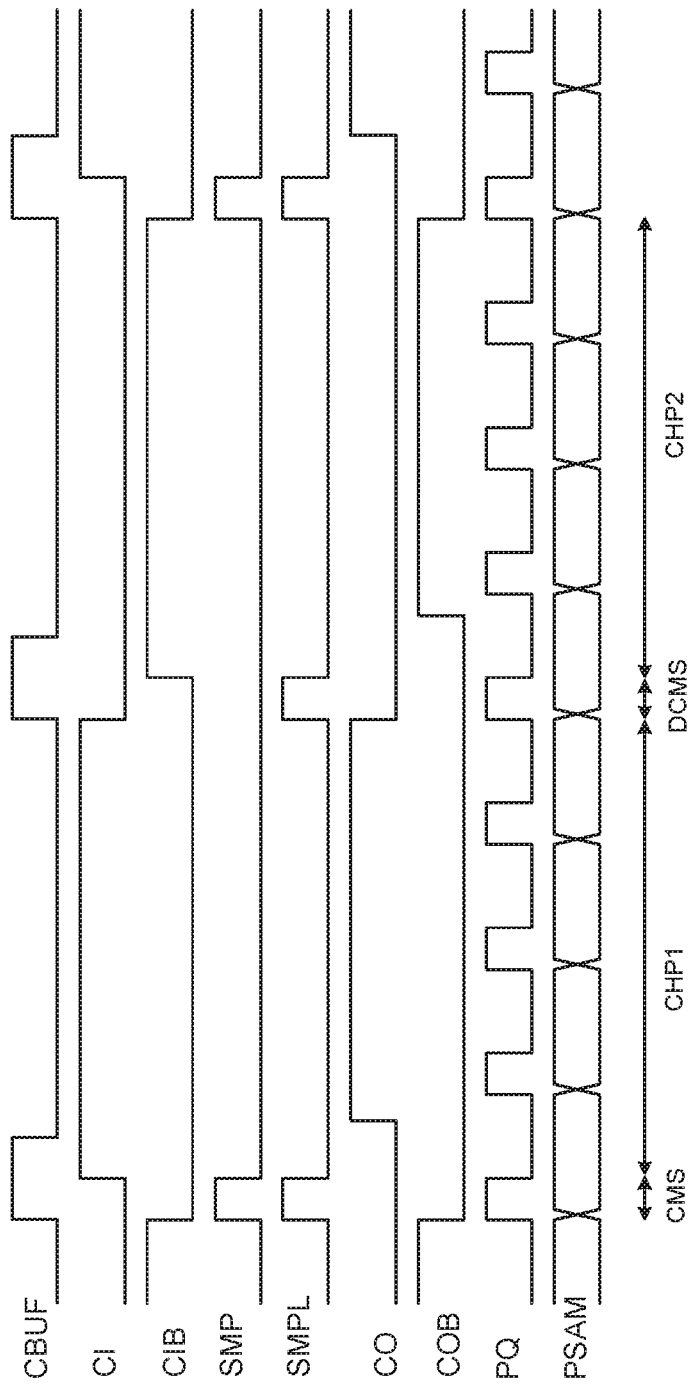
FIG. 12 is a timing diagram illustrating control signal waveforms for controlling the capacitive gain amplifier circuit of FIG. 11, according to an embodiment.

The gain of the capacitive gain amplifier circuit 1100 may be limited by voltage offset of the pre-charge buffer circuits 1112. The voltage offset of the pre-charge buffer circuits 1112 may cause the Miller compensated amplifier circuit A1 to saturate if the gain of the capacitive gain amplifier circuit 1100 (e.g., CIP/CFP) is large. For example, if the gain is 128 in an embodiment, a 5 mV offset of the pre-charge buffer circuits 1112 may lead to a 640 mV error. In the CBUF phase when the buffer enable timing control signal CBUF is at a logical high level as illustrated in FIG. 12, the capacitive gain amplifier circuit 1100 may settle to an incorrect voltage due to this 640 mV error. Then, during an amplify phase when the pre-charge buffer circuits 1112 are bypassed, the capacitive gain amplifier circuit 1100 may take a relatively long period of time to resettle, thereby limiting the speed by which the capacitive gain amplifier circuit 1100 may operate.

FIG. 12 is a timing diagram illustrating control signal waveforms for controlling the capacitive gain amplifier circuit 1100 of FIG. 11, according to an embodiment. A common mode sample (CMS) phase begins when the common mode sample timing control signals SMP and SMPL go to a logical high value, and ends when the common mode sample timing control signals SMP and SMPL go to a logical low value. A dummy common mode sample (DCMS) phase begins when the common mode sample timing control signal SMPL but not the common mode sample timing control signal SMP go to a logical high value, and ends when the common mode sample timing control signal SMPL goes to a logical low value. An amplify CHP1 phase begins and lasts while the chopper timing control signal CI is at a logical high level, and an amplify CHP2 phase begins and lasts while the chopper timing control signal CIB is at a logical high level. The ADC may take numerous samples during a single CHP1 or CHP2 phase according to a double sample modulator sample timing control signal PSAM, for example, 3, 4, 5, 6, 7, 8, 9, 10, or some other number of samples. The ADC may take a sample during a CHP1 phase while the chopper timing control signal CI is at a logical high level, the de-chopper timing control signal CO is at a logical high level, and the pre-charge ADC timing control signal PQ is at a logical low level. Likewise, the ADC may take a sample during a CHP2 phase while the chopper timing control signal CIB is at a logical high level, the de-chopper timing control signal COB is at a logical high level, and the pre-charge ADC timing control signal PQ is at a logical low level. A buffer enable timing control signal CBUF may be at a logical high level during both the CMS and the DCMS phases, and also into a portion of the amplify CHP1 and CHP2 phases until before the de-chopper timing control signal CO goes to a logical high level in the CHP1 phase, and until before the de-chopper timing control signal COB goes to a logical high level in the CHP2 phase. The buffer enable timing control signal CBUF enables the pre-charge buffer circuits 1112 to pre-charge the input capacitors CIP 1126 and CIN 1127 during an initial portion of the amplify phases in order to reduce input current to the capacitive gain amplifier circuit 1100. Also, according to the timing of the buffer enable timing control signal CBUF, the pre-charge buffer circuits 1112 may not be active at a time when the ADC samples the output voltage of the capacitive gain amplifier circuit 1100.

The capacitive gain amplifier circuit 1100 may complete the auto-zero and input current cancellation processes within a time period less than a single ADC sample period. Most of this time period may be within the time duration of the CMS and DCMS phases, which are configured to occur between two consecutive ADC sample periods. However, some of this time period may encroach into the beginning of the CHP1 and CHP2 phases, thus a logical high level of the control signal CBUF extends beyond the duration of the CMS phase. As a result, the time period available for the ADC to perform sampling after the CMS and DCMS phases may be shorter than at other times.

The control signals CBUF, CI, CIB, SMP, SMPL, CO, COB, and PQ illustrated in FIG. 12 may be generated by a controller in response to an external timing signal, e.g., a clock signal. The controller may include digital circuits and/or may be machine or computer-implemented.

Figure 13:
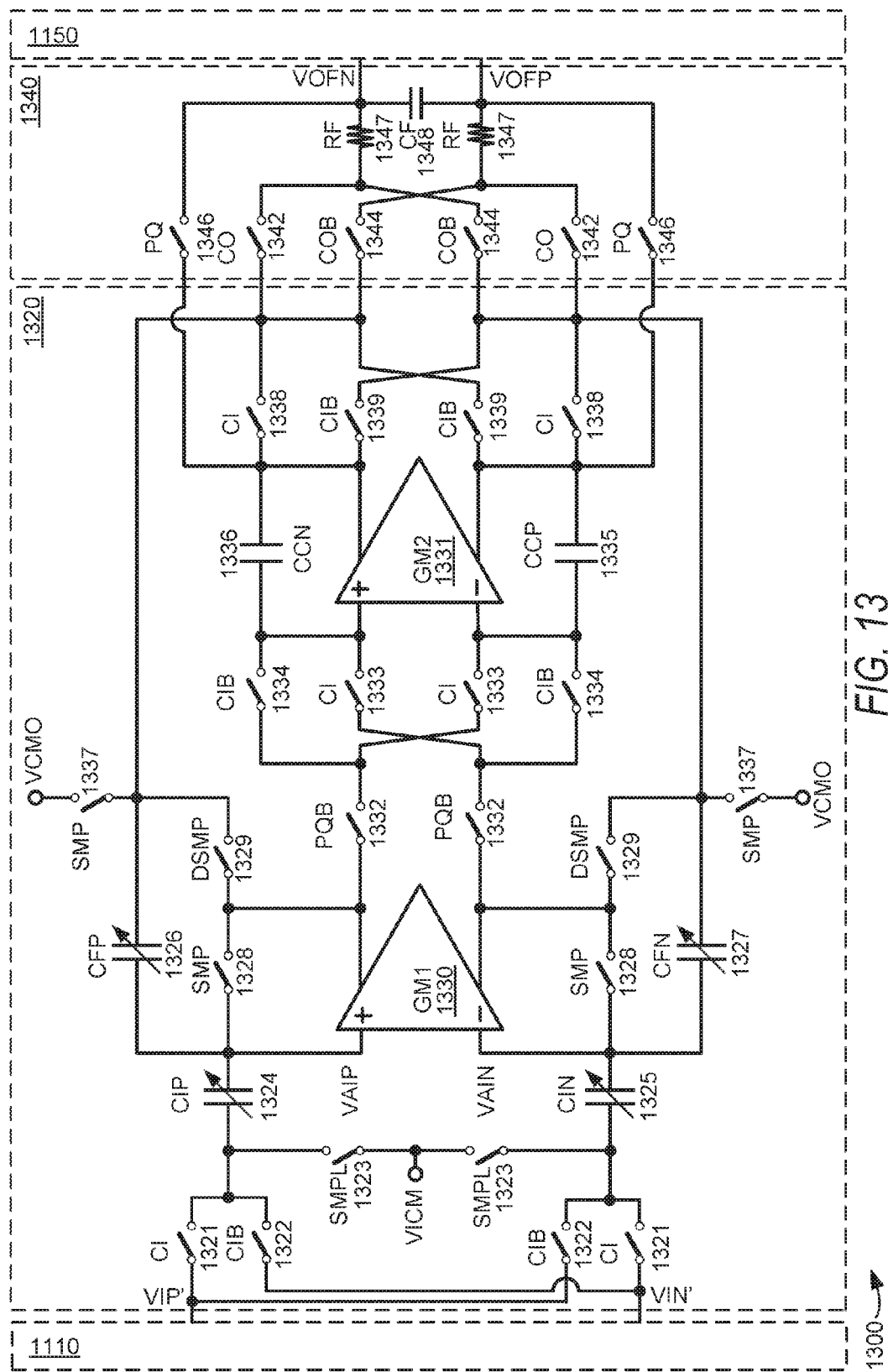
FIG. 13 is a circuit schematic that illustrates a capacitive gain amplifier circuit that may drive an ADC directly without intervening buffer circuits, according to an embodiment.
Figure 14:
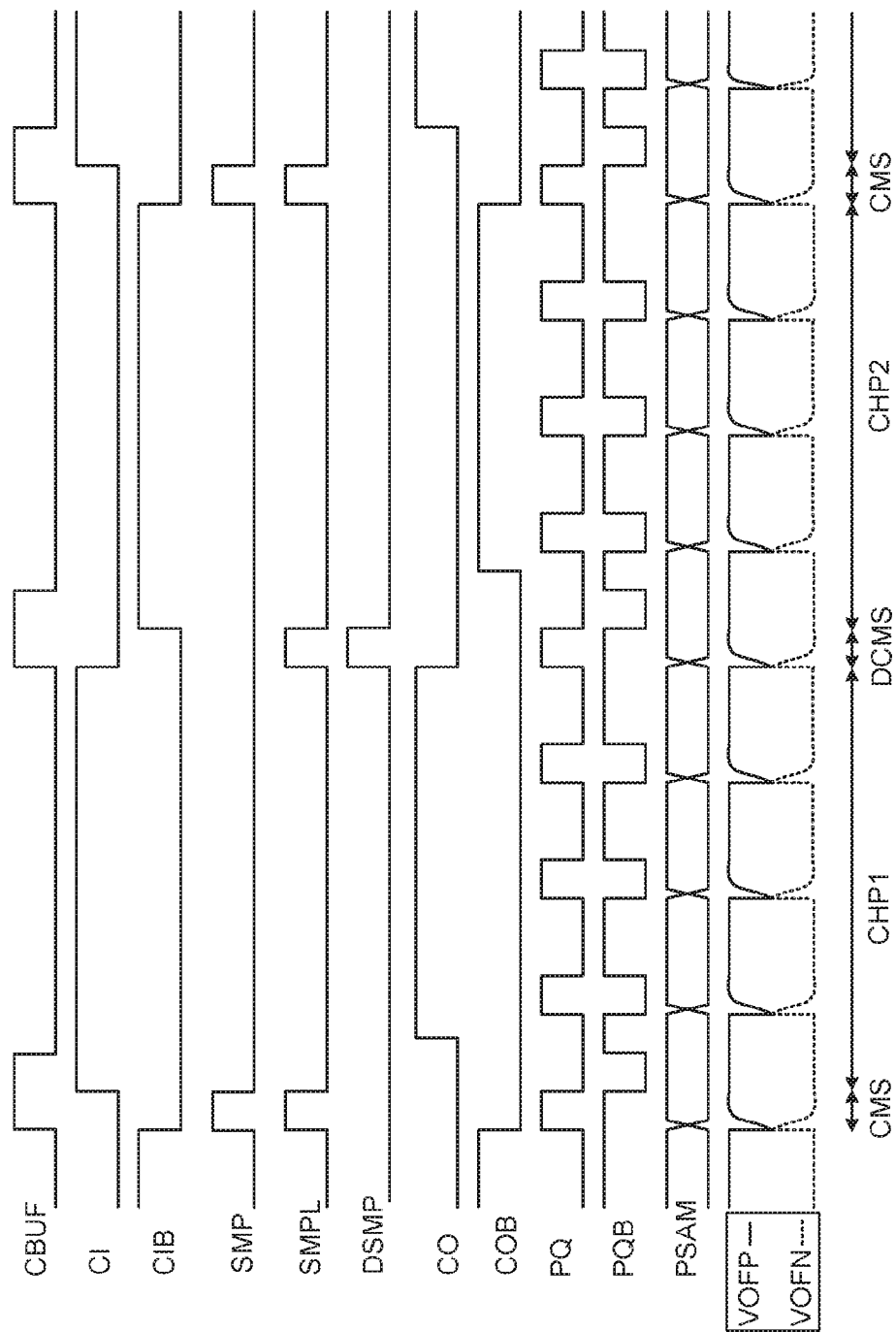
FIG. 14 is a timing diagram illustrating control signal waveforms for controlling the capacitive gain amplifier circuit of FIG. 13, according to an embodiment.

FIG. 13 is a circuit schematic that illustrates a capacitive gain amplifier circuit 1300 that may drive an ADC directly without intervening buffer circuits, according to an embodiment. FIG. 14 is a timing diagram illustrating control signal waveforms for controlling the capacitive gain amplifier circuit 1300 of FIG. 13, according to an embodiment. In the previously discussed embodiments, different sets of Miller capacitors are used for different phases of operation of the capacitive gain amplifier. Also, because of the differential amplifier's configuration as a unity gain buffer during the CMS phase, which is worst case for amplifier stability, the Miller compensation capacitors used during the CMS phase may be much larger than the Miller compensation capacitors used during an amplify phase in the previously discussed embodiments. The capacitive gain amplifier circuit 1300 reduces the number of Miller capacitors used by not using a different set of Miller capacitors in different phases of operation compared to the previously discussed embodiments.

A capacitive gain network autozero and chopping amplifier circuit 1320 may be cascaded with a de-chopper and dynamic AAF circuit 1340, and the combination of the capacitive gain network autozero and chopping amplifier circuit 1320 and de-chopper and dynamic AAF circuit 1340 may replace the chopper and capacitive gain network 1120 and de-chopper and dynamic AAF circuit 1140 illustrated in FIG. 11. The input current cancellation circuit 1110, the capacitive gain network autozero and chopping amplifier circuit 1320, the de-chopper and dynamic AAF circuit 1340, and the ADC double sample capacitor circuit 1150 may be cascaded together, each of which may input and output differential signals.

In the illustrated embodiment, the capacitive gain network autozero and chopping amplifier circuit 1320 includes chopper switches 1321 and 1322 that chop differential input signals received at nodes VIP' and VIN' according to chopper timing control signals CI and CIB, respectively, prior to being provided to input capacitors CIP 1324 and CIN 1325 which couple between respective outputs of the chopper switches 1321 and 1322 and inputs VAIP and VAIN of differential amplifier circuit GM1 1330. When a common mode sample timing control signal SMPL is in a logical low state, the outputs of the chopper switches 1321 and 1322 couple with the input capacitors CIP 1324 and CIN 1325 to drive the capacitive gain network including differential amplifier circuits GM1 1330 and GM2 1331.

The common mode switches 1323 couple the outputs of the chopper switches 1321 and 1322 together with the inputs to the input capacitors CIP 1324 and CIN 1325 to set a common mode voltage VICM at the input side of the input capacitors CIP 1324 and CIN 1325 when the common mode sample timing control signal SMPL is in a logical high state.

Common mode switches 1328 couple respective inputs and outputs of differential amplifier circuit GM1 1330 together while common mode switches 1337 couple the output sides of respective feedback capacitors CFP 1326 and CFN 1327 to a common mode voltage source VCMO when common mode sample timing control signal SMP is in a logical high state, thereby causing the differential amplifier circuit GM1 1330 to behave as a unity gain amplifier during the CMS phase when SMP is in a logical high state. As illustrated in FIG. 14, the chopper timing control signals CI, CIB are all in a logical low state during the CMS phase. Thus, the differential amplifier circuits GM1 1330 and GM2 1331 are decoupled from one another during the CMS phase due to the actions of switches 1333, 1334, 1338, and 1339.

The capacitors CIP 1324, CIN 1325, CFP 1326, and CFN 1327 may be variable capacitors. In various embodiments, each of the capacitors CIP 1324, CIN 1325, CFP 1326, and CFN 1327 may include an array of switched capacitor devices. During operation, the set of input capacitors CIP 1324, CIN 1325 may be set to have equal capacitance to each other, and the set of feedback capacitors CFP 1326, CFN 1327 may be set to have equal capacitance to each other. A ratio of capacitances between the input capacitors CIP 1324, CIN 1325 and the feedback capacitors CFP 1326, CFN 1327 may be controlled by a control signal to provide a programmable gain of the capacitive gain amplifier circuit 1300.

During the DCMS phase when common mode sample timing control signal DSMP is in a logical high state, common mode switches 1329 couple respective outputs of differential amplifier circuit GM1 1330 with an output side of respective feedback capacitors CFP 1326 and CFN 1327. The differential amplifier circuit GM1 1330 may drive the output side of feedback capacitors CFP 1326 and CFN 1327 to a common mode voltage during the DCMS phase since the differential amplifier circuit GM1 1330 does not receive a differential signal from the input capacitors CIP 1324 and CIN 1325 during the DCMS phase.

When the capacitive gain network is in an amplify phase (e.g., when the common mode sample timing control signals SMP, DSMP, and SMPL are in a logical low state, and one of the chopper timing control signals CI and CIB is in a logical high state), one set of the chopper switches 1338 or 1339 couples outputs of the differential amplifier circuit GM2 1331 with respective output sides of feedback capacitors CFP 1326 and CFN 1327.

During a CHP1 phase, the chopper timing control signal CI is at a logical high level, and when the pre-charge timing control signal PQB is also at a logical high level, the chopper switches 1333 couple an input side of the Miller capacitors CCP 1335 and CCN 1336 with respective outputs of the differential amplifier circuit GM1 1330 in an inverted configuration. During a CHP2 phase, the chopper timing control signal CIB is at a logical high level, and when the pre-charge timing control signal PQB is also at a logical high level, the chopper switches 1334 couple the input side of the Miller capacitors CCP 1335 and CCN 1336 with respective outputs of the differential amplifier circuit GM1 1330 in a non-inverted configuration. Thus, the Miller capacitors CCP 1335 and CCN 1336 may not need to be slewed when switching from CHP1 phase to CHP2 phase and vice versa, because they may maintain the correct charge for the signal polarity with which they are connected through both amplify phases.

Figure 18:
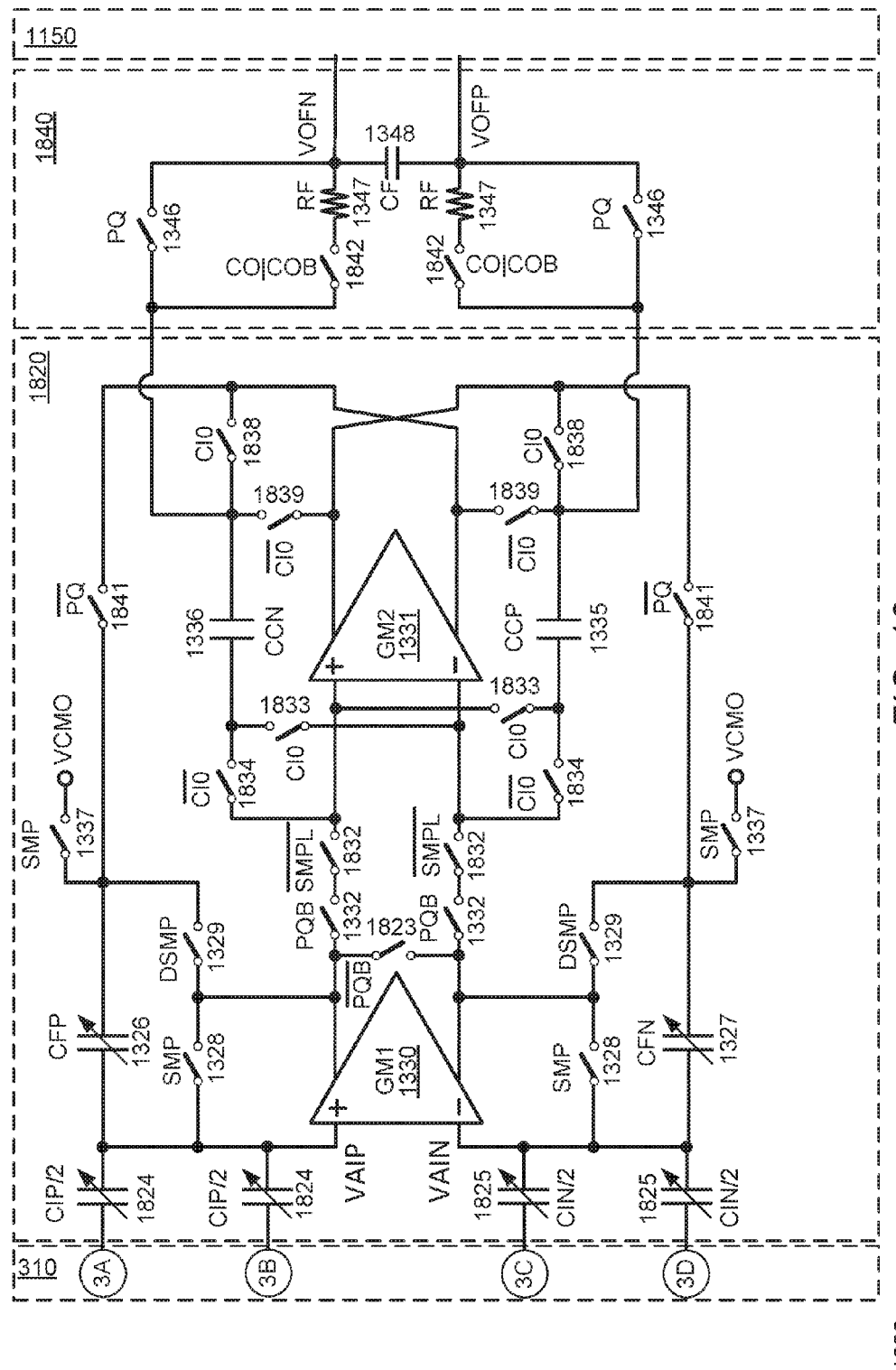
FIG. 18 is a circuit schematic that illustrates a capacitive gain amplifier circuit that may drive an ADC directly without intervening buffer circuits, according to an embodiment.

Although in the illustrated embodiment the Miller capacitors CCP 1335 and CCN 1336 are each fixedly coupled with a single pair of input and output ports of the differential amplifier circuit GM2 1331, this should not be construed as limiting. FIG. 18 illustrates an embodiment in which the Miller capacitors CCP 1335 and CCN 1336 are also swapped with respect to the polarity of the differential amplifier circuit GM1 1330, and the differential amplifier circuit GM2 1331 maintains a same signal polarity relationship with the differential amplifier circuit GM1 1330 even as the Miller capacitors CCP 1335 and CCN 1336 are swapped in relation to the polarity of the differential amplifier circuit GM1 1330.

The de-chopper and dynamic AAF circuit 1340 includes de-chopper switches 1342 and 1344 that de-chop differential output signals provided by the capacitive gain network autozero and chopping amplifier circuit 1320 according to de-chopper timing control signals CO and COB, respectively, prior to being provided to the dynamic AAF circuit that includes an impedance network having resistors RF 1347 and capacitor CF 1348.

When a pre-charge ADC timing control signal PQ is in a low state, the impedance network that includes resistors RF 1347 and capacitor CF 1348 band-limits noise in the differential signal being output from the capacitive gain amplifier circuit 1300 before being input to the ADC double sample capacitor circuit 1150 at differential output nodes VOFP and VOFN. Because the dynamic AAF circuit limits a bandwidth of a signal, the speed by which the ADC double sample capacitor circuit 1150 can be charged by the capacitive gain amplifier circuit 1300 through the dynamic AAF circuit when the pre-charge ADC timing control signal PQ is in a low state is also limited by an RC constant of the impedance network including the resistors RF 1347 and the capacitor CF 1348. When the pre-charge ADC timing control signal PQ is set to a logical high state, the branch of the capacitive gain amplifier circuit 1300 including the differential amplifier circuit GM2 1331 (decoupled from the branch of the capacitive gain amplifier circuit 1300 including the differential amplifier circuit GM1 1330) may rapidly charge the ADC double sample capacitor circuit 1150 by bypassing the impedance network including the resistors RF 1347 and the capacitor CF 1348. After the ADC double sample capacitor circuit 1150 is pre-charged, the ADC may sample the voltage at the ADC double sample capacitor circuit 1150 while the impedance network including the resistors RF 1347 and the capacitor CF 1348 band-limits the noise and the capacitive gain amplifier circuit 1300 outputs a finely settled voltage during a fine settling portion of an amplify phase. A pre-charge ADC timing control signal PQB may be high during the fine settling portion of an amplify phase to couple the output of the differential amplifier circuit GM1 1330 with the input of the differential amplifier circuit GM2 1331. For example, in an amplify CHP1 or CHP2 phase, during the start of an ADC sample period, the AAF may be bypassed when the pre-charge ADC timing control signal PQ is set to a logical high state and the ADC sampling capacitors CSAMP may be charged to a rough value in a short period of time by the differential amplifier circuit GM2 1331. Then, during a later portion of the ADC sample period, the AAF may be placed in circuit again when the pre-charge ADC timing control signal PQ is set to a logical low state and the impedance networking including the resistors RF 1347 and the capacitor CF 1348 band-limits the noise and the capacitive gain amplifier circuit 1300 outputs a finely settled voltage during a fine settling portion of an amplify phase while the pre-charge ADC timing control signal PQB is at a logical high level. The ADC may then sample an accurate voltage on the ADC sample capacitors CSAMP. The ability to rapidly charge the ADC double sample capacitor circuit 1150 enables the capacitive gain amplifier circuit 1300 to drive an ADC directly without buffer amplifiers in between.

The capacitive gain network autozero and chopping amplifier circuit 1320 may decouple the differential amplifier circuit GM1 1330 from the differential amplifier circuit GM2 1331 during CMS and DCMS phases. The differential amplifier circuit GM1 1330 may be configured as a unity gain buffer to setup the common mode voltage for nodes VAIP and VAIN at the inputs of the differential amplifier circuit GM1 1330 during the CMS phase. During the DCMS phase, which is complementary to the CMS phase, the outputs of the differential amplifier circuit GM1 1330 drive the capacitors CFP 1326 and CFN 1327 instead of shorting to nodes VAIP and VAIN. The differential amplifier circuit GM1 1330 may be a single stage amplifier which is very stable and which may have a single pole settling characteristic. The differential amplifier circuit GM1 1330 may not be compensated during the CMS and DCMS phases, thereby saving space in the circuit layout. This contrasts with embodiments in which a Miller capacitor is used to compensate a differential amplifier used during the CMS and DCMS phases, where the Miller capacitor used to compensate the differential amplifier during the CMS and DCMS phases is typically much larger than the Miller capacitor used for high closed loop gain in amplify phases (e.g., CHP1 and CHP2).

In addition, while the Miller capacitors CCP 1335 and CCN 1336 are disconnected from the main differential amplifier circuit GM1 1330 during the CMS and DCMS phases, the Miller capacitors CCP 1335 and CCN 1336 may store the correct voltage used in the last amplify phase which is used by the differential amplifier circuit GM2 1331 to rapidly pre-charge the ADC sample capacitors to a rough voltage that is very close to the correct final value while bypassing the low pass filter of the impedance network including resistors RF 1347 and capacitor CF 1348 when the pre-charge switches 1346 are set to a transmitting state by the pre-charge timing control signal PQ. Therefore, when the CMS and DCMS phases end, the main differential amplifier circuit GM1 1330 coupled with the differential amplifier circuit 1331 only need to charge a small residual error, thereby permitting the low pass filter to be placed in circuit in order to band-limit noise without negatively impacting the speed of the capacitive gain amplifier circuit 1300. Furthermore, the settling time of both the CMS and DCMS phases may also be short, so the first data sampling of the ADC after the CMS/DCMS may be a good accurate value. Furthermore, any small settling errors may be averaged by the low pass filter. An exemplary settling time at the output nodes VOFP and VOFN of the de-chopper and dynamic AAF circuit 1340 is also illustrated in FIG. 14.

At the start of each data sampling period of the ADC (e.g., the start of each PSAM period in FIG. 14) during the CHP1 and CHP2 amplify phases, the differential amplifier circuit GM2 1331 may pre-charge the ADC double sample capacitor circuit 1150 to a roughly correct voltage value within a short time. Then, in a later portion of each data sampling period of the ADC, the differential amplifier circuit GM2 1331 may be coupled together again for fine settling of the output voltage so that the sampled values of the ADC double sample capacitor circuit 1150 to by the ADC may be very accurate.

In embodiments of capacitive gain amplifiers that use unity gain buffers at the input to reduce current, the voltage offset of these unity gain buffers may slow down settling significantly. The capacitive gain amplifier circuit 1300 eliminates this impact of the unity gain buffers by the timing of its timing control signals. For example, when the CMS and DCMS phases end, the differential amplifier circuit GM1 1330 may be disconnected from the gain network capacitors of the capacitive gain network autozero and chopping amplifier circuit 1320. At this time, the differential amplifier circuit GM2 1331 is also still disconnected from the output of the differential amplifier circuit GM1 1330 by switches 1332 according to the pre-charge timing control signal PQB. Therefore, the charge stored on the Miller capacitors CCP 1335 and CCN 1336 is not impacted by the unity gain pre-buffer circuits' offset voltages. The correct charge stored on the Miller capacitors CCP 1335 and CCN 1336 may charge the gain network of the capacitive gain network autozero and chopping amplifier circuit 1320 to the correct state.

The control signals CBUF, CI, CIB, SMP, SMPL, DSMP, CO, COB, PQ, and PQB illustrated in FIG. 14 may be generated by a controller in response to an external timing signal, e.g., a clock signal. The controller may include digital circuits and/or may be machine or computer-implemented.

Figure 15A:
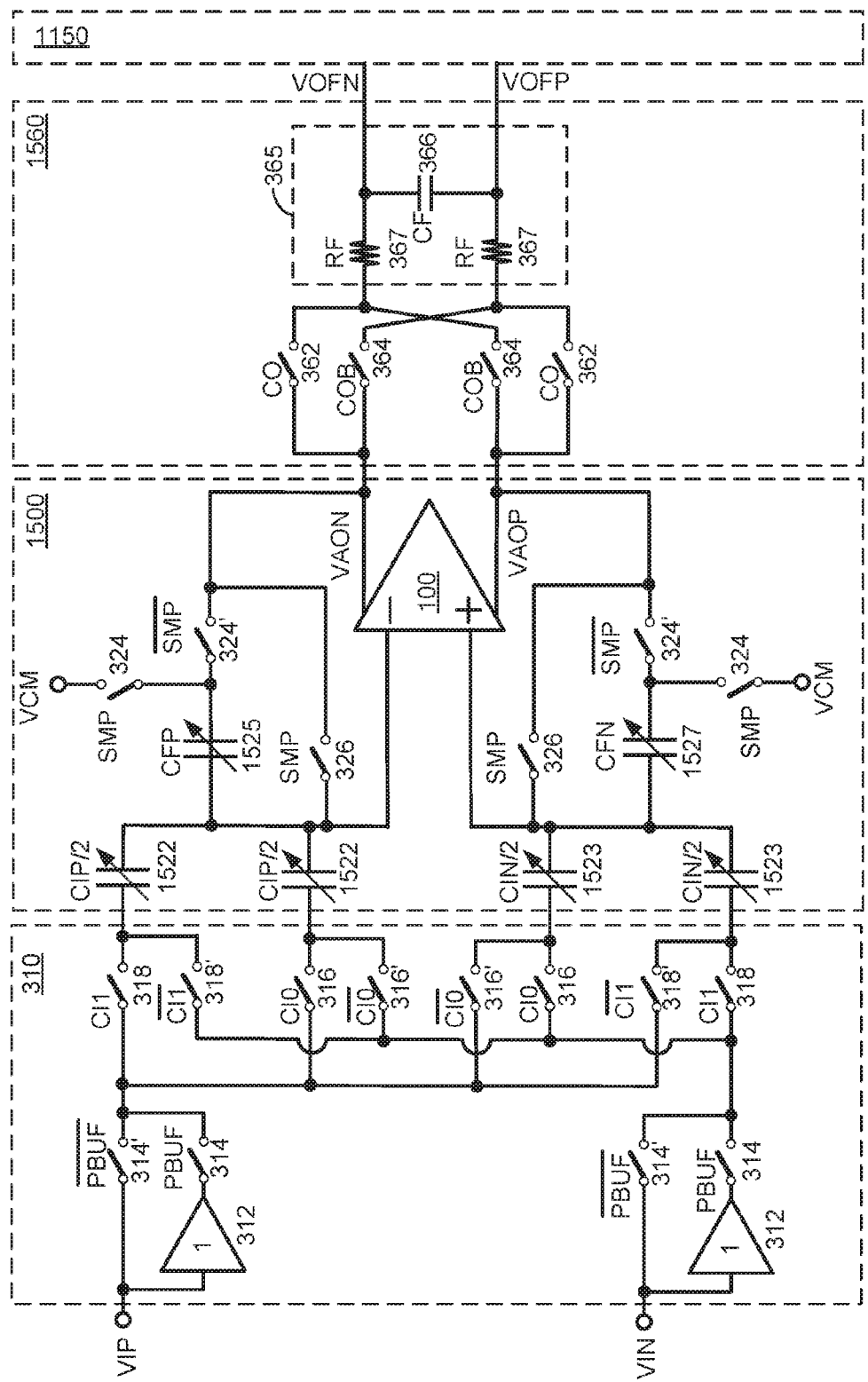
FIG. 15A is a circuit schematic that illustrates a capacitive gain amplifier circuit that combines portions of other embodiments previously described herein, according to an embodiment.

Any feature of any of the embodiments described herein may optionally be used in combination with any other embodiment, as would be understood by one of ordinary skill in the art in view of the teachings herein. Also, any of the embodiments described herein may optionally include any subset of the components or features discussed herein, as would be understood by one of ordinary skill in the art in view of the teachings herein. For example, FIG. 15A is a circuit schematic that illustrates a capacitive gain amplifier circuit 1500 that combines portions of other embodiments previously described herein, according to an embodiment. As illustrated in FIG. 15A, the capacitive gain amplifier circuit 1500 receives input from an embodiment of the input buffer and chopper circuit 310 previously described herein. The capacitive gain amplifier circuit 1500 is similar to the capacitive gain amplifier circuit 300, wherein input capacitors CIP/2 1522 and CIN/2 1523 correspond to input capacitors CIP/2 322 and CIN/2 323, feedback capacitors CFP 1525 and CFN 1527 correspond to feedback capacitors CFP 325 and CFN 327, but the two-stage Miller compensated amplifier circuit 100 replaces the combination of differential amplifier circuit GM1 321 and the split output stage amplifier circuit 330. The capacitive gain amplifier circuit 1500 provides a differential signal output to a de-chopper and AAF circuit 1560, which is similar to the de-chopper and dynamic AAF circuit 360 except that the de-chopper and AAF circuit 1560 does not include switches that bypass the impedance network 365 according to a pre-charge control signal PQ to pre-charge the ADC. The de-chopper and AAF circuit 1560 provides a differential signal VOFN/VOFP to an embodiment of the ADC double sample capacitor circuit 1150.

Figure 15B:
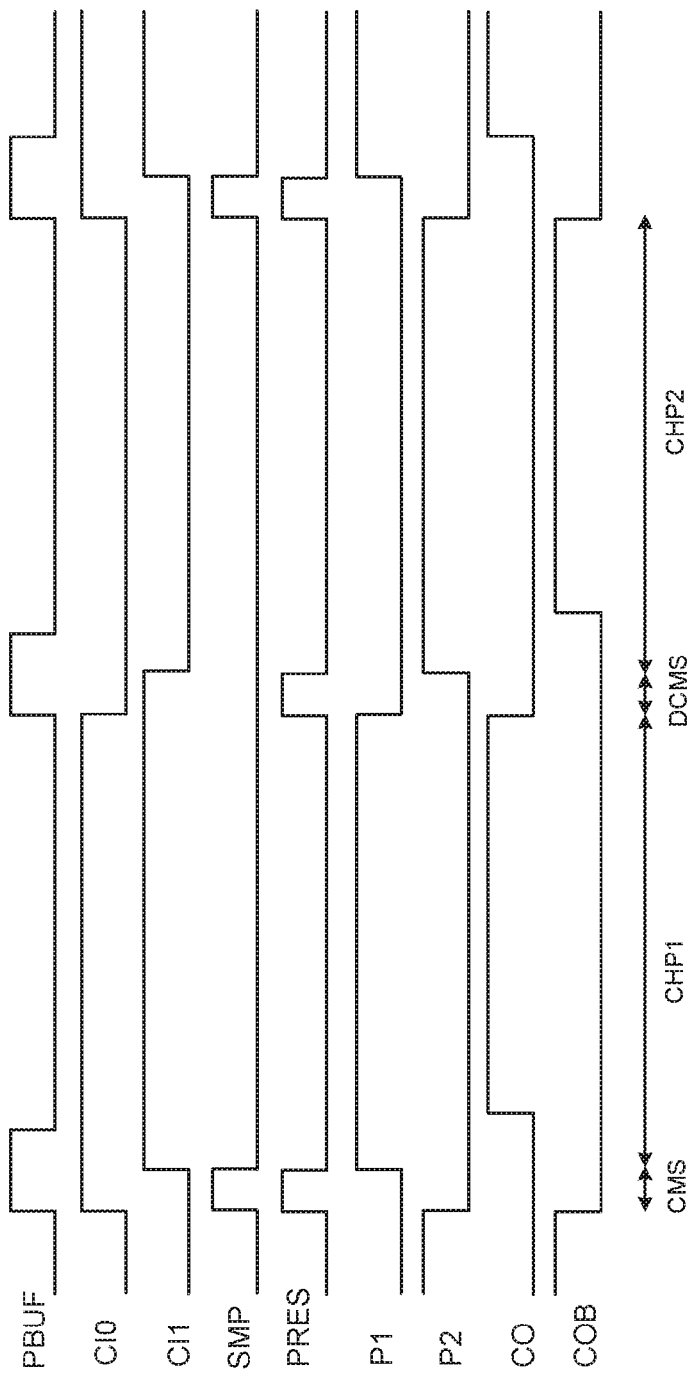
FIG. 15B is a timing diagram illustrating control signal waveforms for controlling the capacitive gain amplifier circuit of FIG. 15A, according to an embodiment.

FIG. 15B is a timing diagram illustrating control signal waveforms for controlling the capacitive gain amplifier circuit of FIG. 15A, according to an embodiment. The timing diagram shown in FIG. 15B is similar to those shown in FIGS. 1 and 4. Note that the signal PRES in FIG. 15B is utilized by the two-stage Miller compensated amplifier circuit 100 shown in more detail in FIG. 1. The control signals PBUF, CI0, CI1, SMP, PRES, P1, P2, CO, and COB illustrated in FIG. 15B may be generated by a controller in response to an external timing signal, e.g., a clock signal. The controller may include digital circuits and/or may be machine or computer-implemented.

Figure 17:
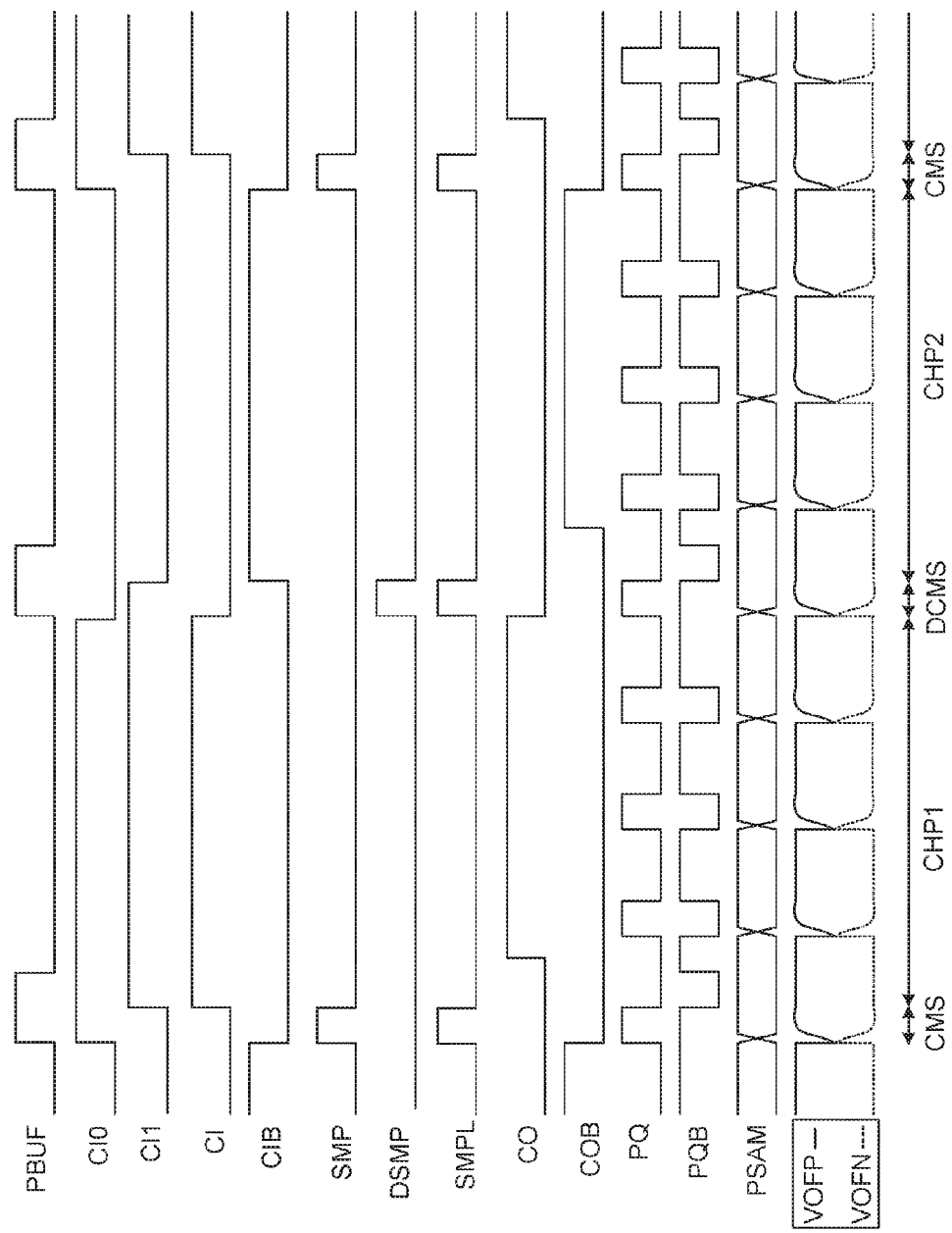
FIG. 17 is a timing diagram illustrating control signal waveforms for controlling the capacitive gain amplifier circuit of FIG. 16, according to an embodiment.

FIG. 16 is a circuit schematic that illustrates a capacitive gain amplifier circuit 1600 having a split output stage and two groups of output stage Miller capacitors, according to an embodiment. FIG. 17 is a timing diagram illustrating control signal waveforms for controlling the capacitive gain amplifier circuit of FIG. 16, according to an embodiment. The capacitive gain amplifier circuit 1600 is similar to the capacitive gain amplifier circuit 300, except that the capacitive gain amplifier circuit 1600 includes split output stage amplifier circuit 1630 including a secondary output stage amplifier branch 1650 that includes a differential amplifier circuit GM2B 1651 in parallel with the differential amplifier circuit GM2A 341 of the primary output stage amplifier branch 340 between the differential input of the split output stage amplifier circuit 1630 and the differential output of the split output stage amplifier circuit 1630. The signal polarity of the differential amplifier circuit GM2B 1651 does not swap relative to the signal polarity of the differential amplifier circuit GM2A 341 in the embodiment of FIG. 16 when the second Miller capacitors CC2A 352 and CC2B 353 swap from one polarity to an opposite polarity of the differential amplifier circuit GM2A 341 of the primary output stage amplifier branch 340.

In the embodiment of FIG. 16, the secondary output stage amplifier branch 1650 is selectively coupled with and decoupled from the primary output stage amplifier branch 340 by a set of switches 1655 controlled according to the logical inverse of the signal SMPL illustrated in the timing diagram of FIG. 17. In addition, the second Miller capacitors CC2A 352 and CC2B 353 are swapped from one polarity to an opposite polarity of the differential amplifier circuit GM2A 341 of the primary output stage amplifier branch 340 by switches 1654, 1656 controlled according to the signal CI0 and switches 1656, 1656' controlled according to the logical inverse of the signal CI0 illustrated in the timing diagram of FIG. 17.

FIG. 18 is a circuit schematic that illustrates a capacitive gain amplifier circuit 1800 that may drive an ADC directly without intervening buffer circuits, according to an embodiment. The capacitive gain amplifier circuit 1800 is controlled by logical signals according to the timing diagram illustrated in FIG. 17. The capacitive gain amplifier circuit 1800 is similar to the capacitive gain amplifier circuit 1300, except for the following differences in the capacitive gain network autozero and chopping amplifier circuit 1820 and the de-chopper and dynamic AAF circuit 1840 relative to their counterparts in the capacitive gain amplifier circuit 1300:

The capacitive gain amplifier circuit 1800 uses a pair of input capacitors CIP/2 1824 instead of a single input capacitor CIP 1324 coupled with the input VAIP of the differential amplifier circuit GM1 1330 and a pair of input capacitors CIN/2 1825 instead of a single input capacitor CIN 1325 coupled with the input VAIN of the differential amplifier circuit GM1 1330.

The capacitive gain amplifier circuit 1800 uses the pairs of input capacitors CIP/2 1824 and CIN/2 1825 to sample a common mode voltage during the common mode sample phase in a manner similar to that of the capacitive gain amplifier circuit 300, rather than using a pair of switches 1323 coupled to a common mode voltage VICM as in the capacitive gain amplifier circuit 1300.

The capacitive gain amplifier circuit 1800 uses a switch 1823 to couple the differential outputs of the differential amplifier circuit GM1 1330 together when the logical signal PQB is low and the differential outputs of the differential amplifier circuit GM1 1330 are separated from the differential inputs of the differential amplifier circuit 1331.

The differential outputs of the differential amplifier circuit GM1 1330 are separated from the differential inputs of the differential amplifier circuit GM2 1331 by the pair of switches 1832 when the logical signal SMPL is low.

The polarity of the differential amplifier circuit GM2 1331 relative to the polarity of the differential amplifier circuit GM1 1330 is not swapped when the Miller capacitors CCP 1335 and CCN 1336 are swapped in relation to the polarity of the differential amplifier circuit GM1 1330 by the switches 1833, 1834, 1838, and 1839 according to the value of the logical signal CI0.

The output ports of the differential amplifier circuit GM2 1331 are disconnected from the feedback capacitors CFP 1326 and CFN 1327 when the logical signal PQ is low by switches 1841.

When either of the logical signals CO and COB are in a high state and the pre-charge ADC timing control signal PQ is in a low state, the impedance network that includes resistors RF 1347 and capacitor CF 1348 band-limits noise in the differential signal being output from the capacitive gain amplifier circuit 1800 before being input to the ADC double sample capacitor circuit 1150 at differential output nodes VOFP and VOFN.

Figure 19:
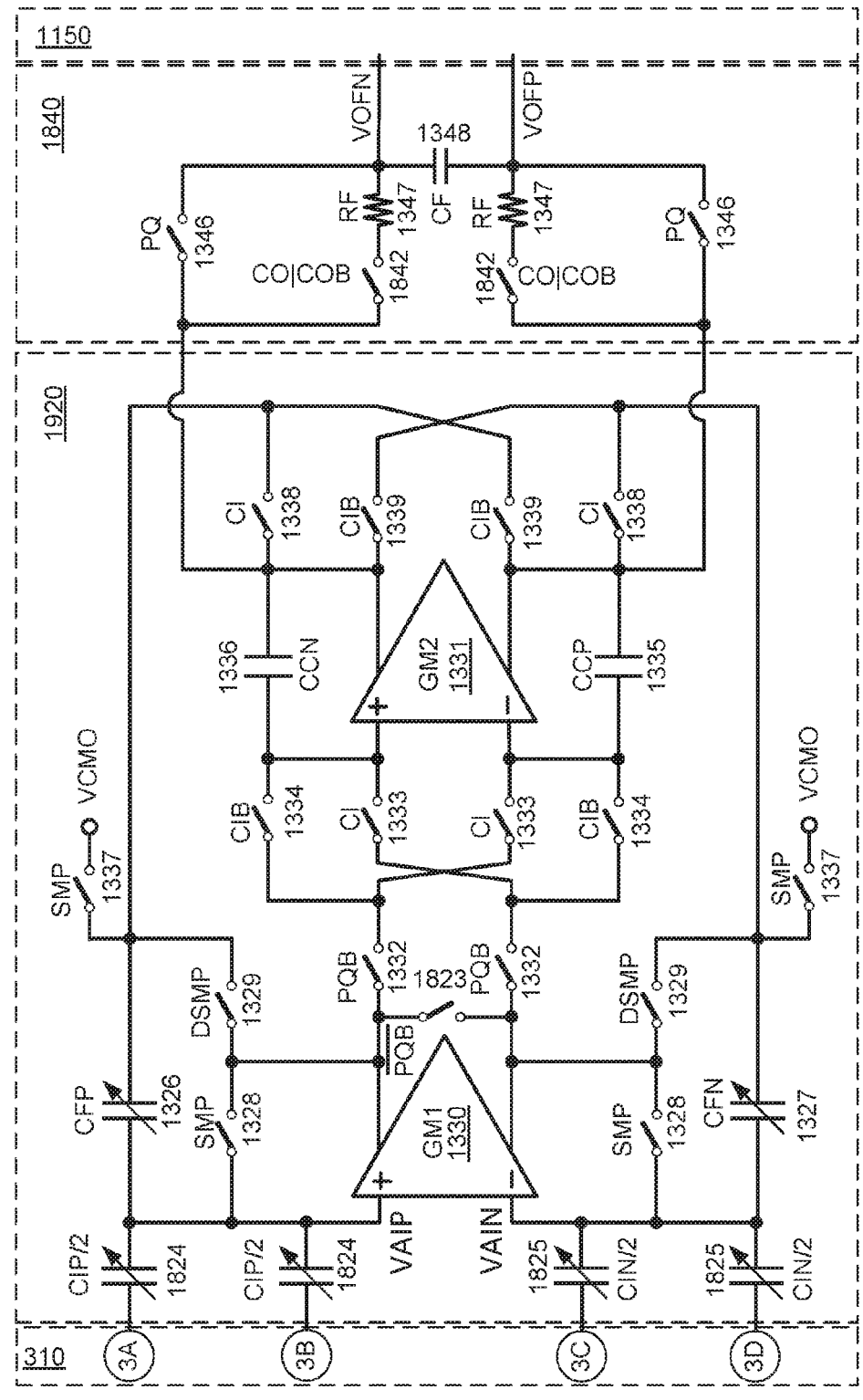
FIG. 19 is a circuit schematic that illustrates a capacitive gain amplifier circuit that may drive an ADC directly without intervening buffer circuits, according to an embodiment.

FIG. 19 is a circuit schematic that illustrates a capacitive gain amplifier circuit 1900 that may drive an ADC directly without intervening buffer circuits, according to an embodiment. The capacitive gain amplifier circuit 1900 is controlled by logical signals according to the timing diagram illustrated in FIG. 17. The capacitive gain amplifier circuit 1900 is similar to the capacitive gain amplifier circuit 1300, except for the following differences in the capacitive gain network autozero and chopping amplifier circuit 1920 and the de-chopper and dynamic AAF circuit 1840 relative to their counterparts in the capacitive gain amplifier circuit 1300:

The capacitive gain amplifier circuit 1900 uses a pair of input capacitors CIP/2 1824 instead of a single input capacitor CIP 1324 coupled with the input VAIP of the differential amplifier circuit GM1 1330 and a pair of input capacitors CIN/2 1825 instead of a single input capacitor CIN 1325 coupled with the input VAIN of the differential amplifier circuit GM1 1330.

The capacitive gain amplifier circuit 1900 uses the pairs of input capacitors CIP/2 1824 and CIN/2 1825 to sample a common mode voltage during the common mode sample phase in a manner similar to that of the capacitive gain amplifier circuit 300, rather than using a pair of switches 1323 coupled to a common mode voltage VICM as in the capacitive gain amplifier circuit 1300.

The capacitive gain amplifier circuit 1900 uses a switch 1823 to couple the differential outputs of the differential amplifier circuit GM1 1330 together when the logical signal PQB is low and the differential outputs of the differential amplifier circuit GM1 1330 are separated from the differential inputs of the differential amplifier circuit 1331.

When either of the logical signals CO and COB are in a high state and the pre-charge ADC timing control signal PQ is in a low state, the impedance network that includes resistors RF 1347 and capacitor CF 1348 band-limits noise in the differential signal being output from the capacitive gain amplifier circuit 1900 before being input to the ADC double sample capacitor circuit 1150 at differential output nodes VOFP and VOFN.

Various Notes & Examples

Each of the non-limiting examples described herein may stand on its own, or may be combined in various permutations or combinations with one or more of the other examples.

Example 1 is a capacitive gain amplifier circuit, comprising: a differential amplifier circuit, including a set of inputs and a set of outputs; a first set of Miller capacitors, selectively switched in between respective outputs and respective inputs of the differential amplifier circuit during a first phase that resets the differential amplifier circuit, and a second set of Miller capacitors, selectively switched in between respective outputs and respective inputs of the differential amplifier circuit during a separate second phase that chops a signal being amplified by the differential amplifier circuit, the second set of Miller capacitors being selectively switched in to alternating inputs of the differential amplifier circuit during successive second phases.

In Example 2, the subject matter of Example 1 optionally includes wherein the first set of Miller capacitors is selectively switched out from respective outputs and respective inputs of the differential amplifier circuit during the second phase to retain electrical charge on the first set of Miller capacitors between successive first phases, and the second set of Miller capacitors is selectively switched out from respective outputs and respective inputs of the differential amplifier circuit during the first phase to retain electrical charge on the second set of Miller capacitors between successive second phases.

In Example 3, the subject matter of Example 2 optionally includes wherein the differential amplifier circuit is a first output stage differential amplifier circuit, and further comprising a second output stage differential amplifier circuit having a set of inputs respectively coupled with the input side of the second set of Miller capacitors and having a set of outputs respectively coupled with a corresponding output side of the second set of Miller capacitors.

In Example 4, the subject matter of any one or more of Examples 2-3 optionally includes an output de-chopper circuit cascaded with the outputs of the differential amplifier circuit, the output de-chopper circuit including: a first set of switches to selectively couple the output side of the second set of Miller capacitors with inputs of an analog to digital converter (ADC) circuit to pre-charge the ADC circuit during the first phase; and a second set of switches to selectively invert a polarity of the outputs of the differential amplifier circuit relative to the inputs of the ADC circuit during alternate successive second phases.

In Example 5, the subject matter of Example 4 optionally includes an impedance network disposed between the second set of switches and the inputs of the ADC circuit.

In Example 6, the subject matter of any one or more of Examples 1-5 optionally includes wherein the differential amplifier circuit is an output stage differential amplifier circuit, and further comprising an input stage differential amplifier circuit cascaded with the output stage differential amplifier circuit to amplify an input differential signal prior to being input to the output stage differential amplifier circuit.

In Example 7, the subject matter of Example 6 optionally includes wherein the inputs of the output stage differential amplifier circuit are selectively coupled with and decoupled from corresponding outputs of the input stage differential amplifier circuit periodically during both the first phase and the second phase.

In Example 8, the subject matter of Example 7 optionally includes an input chopper circuit including: a set of unity gain buffer circuits selectively coupled with respective capacitive gain amplifier circuit inputs, the capacitive gain amplifier circuit inputs collectively forming a differential capacitive gain amplifier circuit input; and a set of chopper switches to selectively communicatively couple an alternative one of each of the unity gain buffer circuits and the respective capacitive gain amplifier circuit inputs with alternating inputs of the input stage differential amplifier circuit during successive second phases.

In Example 9, the subject matter of any one or more of Examples 6-8 optionally includes a set of feedback capacitors, selectively switched in between respective inputs of the input stage differential amplifier circuit and respective outputs of the output stage differential amplifier circuit except during alternating first phases when the set of feedback capacitors is selectively switched out from respective outputs of the output stage differential amplifier circuit.

Example 10 is a method of capacitive gain amplification using a differential amplifier circuit, the method comprising: switching in a first set of Miller capacitors between respective outputs and respective inputs of the differential amplifier circuit during a first phase that resets the differential amplifier circuit; and switching in a second set of Miller capacitors between respective outputs and respective inputs of the differential amplifier circuit during a separate second phase that chops a signal being amplified by the differential amplifier circuit, the switching in of the second set of Miller capacitors being to alternating inputs of the differential amplifier circuit during successive second phases.

In Example 11, the subject matter of Example 10 optionally includes switching out the first set of Miller capacitors from respective outputs and respective inputs of the differential amplifier circuit during the second phase to retain electrical charge on the first set of Miller capacitors between successive first phases; and switching out the second set of Miller capacitors from respective outputs and respective inputs of the differential amplifier circuit during the first phase to retain electrical charge on the second set of Miller capacitors between successive second phases.

In Example 12, the subject matter of Example 11 optionally includes wherein the differential amplifier circuit is a first output stage differential amplifier circuit, and further comprising operating both the first output stage differential amplifier circuit and a second output stage differential amplifier circuit during the second phase, the second output stage differential amplifier circuit having inputs respectively coupled with the input side of the second set of Miller capacitors and having outputs respectively coupled with the output side of the second set of Miller capacitors.

In Example 13, the subject matter of any one or more of Examples 11-12 optionally includes selectively coupling the output side of the second set of Miller capacitors with respective inputs of an analog to digital converter (ADC) circuit by a first set of switches of an output de-chopper circuit to pre-charge the ADC circuit during the first phase, the de-chopper circuit cascaded with the differential amplifier circuit; and selectively inverting a polarity of the outputs of the differential amplifier circuit relative to the inputs of the ADC circuit during alternate successive second phases by a second set of switches of the output de-chopper circuit.

In Example 14, the subject matter of Example 13 optionally includes wherein the differential amplifier circuit is a first output stage differential amplifier circuit, and further comprising selectively coupling outputs of a second output stage differential amplifier circuit with respective inputs of the ADC circuit, the second output stage differential amplifier circuit having inputs respectively coupled with the input side of the second set of Miller capacitors and having outputs respectively coupled with a corresponding output side of the second set of Miller capacitors; pre-charging the ADC circuit by the second output stage differential amplifier circuit during a pre-charge portion of the second phase; and decoupling the outputs of the second output stage differential amplifier circuit from the inputs of the ADC circuit during a settling portion of the second phase.

In Example 15, the subject matter of any one or more of Examples 10-14 optionally includes wherein the differential amplifier circuit is an output stage differential amplifier circuit, and further comprising amplifying an input differential signal prior to being input to the output stage differential amplifier circuit by an input stage differential amplifier circuit cascaded with the output stage differential amplifier circuit.

In Example 16, the subject matter of Example 15 optionally includes coupling inputs of the output stage differential amplifier circuit with respective outputs of the input stage differential amplifier circuit during a fine settling portion of the second phase; and decoupling the inputs of the output stage differential amplifier circuit from the outputs of the input stage differential amplifier circuit during the first phase.

In Example 17, the subject matter of Example 16 optionally includes selectively coupling a set of input capacitors between respective inputs of the input stage differential circuit and respective outputs of unity gain buffer circuits during the first phase, the unity gain buffer circuits receiving input from respective capacitive gain amplifier circuit inputs collectively forming a differential capacitive gain amplifier circuit input; charging the set of input capacitors by the respective unity gain buffer circuits during the first phase; and selectively communicatively coupling an alternative one of the unity gain buffer circuits and the respective capacitive gain amplifier circuit inputs with alternating inputs of the input stage differential amplifier circuit during successive second phases by a set of chopper switches.

In Example 18, the subject matter of any one or more of Examples 15-17 optionally includes selectively switching in a set of feedback capacitors between respective inputs of the input stage differential amplifier circuit and respective outputs of the output stage differential amplifier circuit except during alternating first phases; and during the alternating first phases, selectively switching out the set of feedback capacitors from respective outputs of the output stage differential amplifier circuit.

In Example 19, the subject matter of Example 18 optionally includes wherein the output stage differential amplifier circuit is a first output stage differential amplifier circuit, and further comprising: decoupling the outputs of the first output stage differential amplifier circuit from an analog to digital converter (ADC) circuit and pre-charging the ADC circuit by a second output stage differential amplifier circuit during the first phase, the second output stage differential amplifier circuit having inputs respectively coupled with the input side of the second set of Miller capacitors and having outputs respectively coupled with a corresponding output side of the second set of Miller capacitors during the first phase; and coupling the outputs of the first output stage differential amplifier circuit with an impedance network at an input of the ADC circuit and decoupling the second output stage differential amplifier circuit from the ADC circuit during the second phase.

Example 20 is a capacitive gain amplifier circuit, comprising: a differential amplifier circuit, including a pair of inputs and a pair of outputs; a first pair of Miller capacitors, selectively switched in between respective outputs and respective inputs of the differential amplifier circuit during a first phase that resets the differential amplifier circuit, and selectively switched out from respective outputs and respective inputs of the differential amplifier circuit during a second phase to retain electrical charge on the first pair of Miller capacitors between successive first phases; and a second pair of Miller capacitors, selectively switched in between respective outputs and respective inputs of the differential amplifier circuit during a separate second phase that chops a signal being amplified by the differential amplifier circuit, the second pair of Miller capacitors being selectively switched in to alternating inputs of the differential amplifier circuit during successive second phases in correspondence with the chopping of the signal being amplified by the differential amplifier circuit, and selectively switched out from respective outputs and respective inputs of the differential amplifier circuit during the first phase to retain electrical charge on the second pair of Miller capacitors between successive second phases.

Example 21 is a capacitive gain amplifier circuit to amplify an input signal by a pair of differential amplifier circuits coupled in parallel, the capacitive gain amplifier circuit comprising: a first output stage differential amplifier circuit, including a set of inputs and a set of outputs; a first set of Miller capacitors, selectively switched in between respective outputs and respective inputs of the first output stage differential amplifier circuit during a first phase that resets the first output stage differential amplifier circuit; a second set of Miller capacitors, selectively switched in between respective outputs and respective inputs of the first output stage differential amplifier circuit during a second phase that chops a signal being amplified by the first output stage differential amplifier circuit, the second set of Miller capacitors being selectively switched in to alternating inputs of the first output stage differential amplifier circuit during successive second phases; and a second output stage differential amplifier circuit, including a set of inputs selectively coupled with the inputs of the first output stage differential amplifier circuit and a set of outputs selectively coupled with the outputs of the first output stage differential amplifier circuit during the second phase.

In Example 22, the subject matter of Example 21 optionally includes wherein: the second set of Miller capacitors is selectively switched out from respective outputs and respective inputs of the first output stage differential amplifier circuit during the first phase to retain electrical charge on the second set of Miller capacitors between successive second phases; and the first set of Miller capacitors is selectively switched out from respective outputs and respective inputs of the first output stage differential amplifier circuit during the second phase to retain electrical charge on the first set of Miller capacitors between successive first phases.

In Example 23, the subject matter of Example 22 optionally includes an output de-chopper circuit cascaded with the outputs of the first output stage differential amplifier circuit, the output de-chopper circuit including: a first set of switches to selectively couple the output sides of the second set of Miller capacitors and the second output stage differential amplifier circuit with inputs of an analog to digital converter (ADC) circuit to pre-charge the ADC circuit during the first phase; and a second set of switches to selectively invert a polarity of the outputs of the first output stage differential amplifier circuit relative to the inputs of the ADC circuit during alternate successive second phases.

In Example 24, the subject matter of any one or more of Examples 21-23 optionally include an input stage differential amplifier circuit cascaded with the first output stage differential amplifier circuit to amplify an input differential signal prior to being input to the first output stage differential amplifier circuit.

In Example 25, the subject matter of Example 24 optionally includes wherein the inputs of the first output stage differential amplifier circuit are selectively coupled with and decoupled from corresponding outputs of the input stage differential amplifier circuit periodically during both the first phase and the second phase.

In Example 26, the subject matter of Example 25 optionally includes an input chopper circuit including: a set of unity gain buffer circuits selectively coupled with respective capacitive gain amplifier circuit inputs, the capacitive gain amplifier circuit inputs collectively forming a differential capacitive gain amplifier circuit input; and a set of chopper switches to selectively communicatively couple an alternative one of each of the unity gain buffer circuits and the respective capacitive gain amplifier circuit inputs with alternating inputs of the input stage differential amplifier circuit during successive second phases.

In Example 27, the subject matter of any one or more of Examples 24-26 optionally include a set of feedback capacitors, selectively switched in between respective inputs of the input stage differential amplifier circuit and respective outputs of the first output stage differential amplifier circuit except during alternating first phases when the set of feedback capacitors is selectively switched out from respective outputs of the first output stage differential amplifier circuit.

In Example 28, the subject matter of any one or more of Examples 24-27 optionally include a first pair of input capacitors having an output end coupled with a first of a set of inputs of the input stage differential amplifier circuit; a second pair of input capacitors having an output end coupled with a second of the set of inputs of the input stage differential amplifier circuit; and a third set of switches to selectively couple an input end of a first of each of the first and second pairs of input capacitors with one differential input of the capacitive gain amplifier circuit and to selectively couple an input end of a second of each of the first and second pairs of input capacitors with another differential input of the capacitive gain amplifier circuit to sample a common mode input voltage by the set of inputs of the input stage differential amplifier circuit during the first phase, and to selectively couple the input end of both of the first pair of input capacitors with one differential input of the capacitive gain amplifier circuit and to selectively couple the input end of both of the second pair of input capacitors with another differential input of the capacitive gain amplifier circuit during the second phase.

Example 29 is a method of capacitive gain amplification to amplify an input signal by a pair of differential amplifier circuits coupled in parallel, the method comprising: switching in a first set of Miller capacitors between respective outputs and respective inputs of the first output stage differential amplifier circuit during a first phase that resets the first output stage differential amplifier circuit, switching in a second set of Miller capacitors between respective outputs and respective inputs of the first output stage differential amplifier circuit during a second phase that chops a signal being amplified by the first output stage differential amplifier circuit, the switching in of the second set of Miller capacitors being to alternating inputs of the first output stage differential amplifier circuit during successive second phases; and operating both the first output stage differential amplifier circuit and the second output stage differential amplifier circuit during the second phase, the second output stage differential amplifier circuit having inputs selectively coupled with the inputs of the first output stage differential amplifier circuit and a set of outputs selectively coupled with the outputs of the first output stage differential amplifier circuit during the second phase.

In Example 30, the subject matter of Example 29 optionally includes switching out the second set of Miller capacitors from respective outputs and respective inputs of the first output stage differential amplifier circuit during the first phase to retain electrical charge on the second set of Miller capacitors between successive second phases; and switching out the first set of Miller capacitors from respective outputs and respective inputs of the first output stage differential amplifier circuit during the second phase to retain electrical charge on the first set of Miller capacitors between successive first phases.

In Example 31, the subject matter of Example 30 optionally includes selectively coupling the output sides of the second set of Miller capacitors and the second output stage differential amplifier circuit with respective inputs of an analog to digital converter (ADC) circuit by a first set of switches of an output de-chopper circuit while the second set of Miller capacitors is coupled between respective inputs and outputs of the second output stage differential amplifier circuit to pre-charge the ADC circuit during the first phase, the output de-chopper circuit cascaded with the first output stage differential amplifier circuit; and selectively inverting a polarity of the outputs of the first output stage differential amplifier circuit relative to the inputs of the ADC circuit during alternate successive second phases by a second set of switches of the output de-chopper circuit.

In Example 32, the subject matter of Example 31 optionally includes selectively coupling outputs of the second output stage differential amplifier circuit with respective inputs of the ADC circuit; pre-charging the ADC circuit by the second output stage differential amplifier circuit during a pre-charge portion of the second phase; and decoupling the outputs of the second output stage differential amplifier circuit from the inputs of the ADC circuit during a settling portion of the second phase.

In Example 33, the subject matter of any one or more of Examples 29-32 optionally include amplifying an input differential signal prior to being input to the output stage differential amplifier circuit by an input stage differential amplifier circuit cascaded with the output stage differential amplifier circuit.

In Example 34, the subject matter of Example 33 optionally includes coupling inputs of the first output stage differential amplifier circuit with respective outputs of the input stage differential amplifier circuit during a fine settling portion of the second phase; and decoupling the inputs of the first output stage differential amplifier circuit from the outputs of the input stage differential amplifier circuit during the first phase.

In Example 35, the subject matter of Example 34 optionally includes selectively coupling a set of input capacitors between respective inputs of the input stage differential circuit and respective outputs of unity gain buffer circuits during the first phase, the unity gain buffer circuits receiving input from respective capacitive gain amplifier circuit inputs collectively forming a differential capacitive gain amplifier circuit input; charging the set of input capacitors by the respective unity gain buffer circuits during the first phase; and selectively communicatively coupling an alternative one of the unity gain buffer circuits and the respective capacitive gain amplifier circuit inputs with alternating inputs of the input stage differential amplifier circuit during successive second phases by a set of chopper switches.

In Example 36, the subject matter of any one or more of Examples 34-35 optionally include selectively switching in a set of feedback capacitors between respective inputs of the input stage differential amplifier circuit and respective outputs of the first output stage differential amplifier circuit except during alternating first phases; and during the alternating first phases, selectively switching out the set of feedback capacitors from respective outputs of the first output stage differential amplifier circuit.

In Example 37, the subject matter of Example 36 optionally includes decoupling the outputs of the first output stage differential amplifier circuit from an analog to digital converter (ADC) circuit and pre-charging the ADC circuit by a second output stage differential amplifier circuit during the first phase, the second output stage differential amplifier circuit having inputs respectively coupled with the input side of the second set of Miller capacitors and having outputs respectively coupled with a corresponding output side of the second set of Miller capacitors during the first phase; and coupling the outputs of the first output stage differential amplifier circuit with an impedance network at an input of the ADC circuit and decoupling the second output stage differential amplifier circuit from the ADC circuit during the second phase.

In Example 38, the subject matter of any one or more of Examples 33-37 optionally include selectively coupling an input end of a first of each of a first pair of input capacitors and a second pair of input capacitors with one differential input of the capacitive gain amplifier circuit and selectively coupling an input end of a second of each of the first and second pairs of input capacitors with another differential input of the capacitive gain amplifier circuit to sample a common mode input voltage by the set of inputs of the input stage differential amplifier circuit during the first phase; and selectively coupling the input end of both of the first pair of input capacitors with one differential input of the capacitive gain amplifier circuit and selectively coupling the input end of both of the second pair of input capacitors with another differential input of the capacitive gain amplifier circuit during the second phase.

Example 39 is a capacitive gain amplifier circuit, comprising: a first output stage differential amplifier circuit, including a pair of inputs and a pair of outputs; a first pair of Miller capacitors, selectively switched in between respective outputs and respective inputs of the first output stage differential amplifier circuit during a first phase that resets the first output stage differential amplifier circuit, and selectively switched out from respective outputs and respective inputs of the first output stage differential amplifier circuit during a second phase to retain electrical charge on the first pair of Miller capacitors between successive first phases; a second pair of Miller capacitors, selectively switched in between respective outputs and respective inputs of the first output stage differential amplifier circuit during a separate second phase that chops a signal being amplified by the first output stage differential amplifier circuit, the second pair of Miller capacitors being selectively switched in to alternating inputs of the first output stage differential amplifier circuit during successive second phases in correspondence with the chopping of the signal being amplified by the first output stage differential amplifier circuit, and selectively switched out from respective outputs and respective inputs of the first output stage differential amplifier circuit during the first phase to retain electrical charge on the second pair of Miller capacitors between successive second phases; and a second output stage differential amplifier circuit, including a set of inputs selectively coupled with the inputs of the first output stage differential amplifier circuit and a set of outputs selectively coupled with the outputs of the first output stage differential amplifier circuit during the second phase.

In Example 40, the subject matter of Example 39 optionally includes an output de-chopper circuit cascaded with the outputs of the first output stage differential amplifier circuit, the output de-chopper circuit including: a first set of switches to selectively couple the output sides of the second pair of Miller capacitors and the second output stage differential amplifier circuit with inputs of an analog to digital converter (ADC) circuit to pre-charge the ADC circuit during the first phase; and a second pair of switches to selectively invert a polarity of the outputs of the first output stage differential amplifier circuit relative to the inputs of the ADC circuit during alternate successive second phases.

Example 41 is a capacitive gain amplifier circuit using a first output stage differential amplifier circuit and a second output stage differential amplifier circuit, the capacitive gain amplifier circuit comprising: a first output stage differential amplifier circuit, including a set of inputs and a set of outputs; a first set of Miller capacitors, selectively switched in between respective outputs and respective inputs of the first output stage differential amplifier circuit during a first phase that resets the first output stage differential amplifier circuit; a second set of Miller capacitors, selectively switched in between respective outputs and respective inputs of the first output stage differential amplifier circuit during a second phase that chops a signal being amplified by the first output stage differential amplifier circuit, the second set of Miller capacitors being selectively switched in to alternating inputs of the first output stage differential amplifier circuit during successive second phases; and a second output stage differential amplifier circuit, including a set of inputs selectively coupled with the inputs of the first output stage differential amplifier circuit and a set of outputs selectively coupled with the outputs of the first output stage differential amplifier circuit during the second phase.

In Example 42, the subject matter of Example 41 optionally includes wherein: the second set of Miller capacitors is selectively switched out from respective outputs and respective inputs of the first output stage differential amplifier circuit during the first phase to retain electrical charge on the second set of Miller capacitors between successive second phases; and the first set of Miller capacitors is selectively switched out from respective outputs and respective inputs of the first output stage differential amplifier circuit during the second phase to retain electrical charge on the first set of Miller capacitors between successive first phases.

In Example 43, the subject matter of Example 42 optionally includes an output de-chopper circuit cascaded with the outputs of the first output stage differential amplifier circuit, the output de-chopper circuit including: a first set of switches to selectively couple the output sides of the second set of Miller capacitors and the second output stage differential amplifier circuit with inputs of an analog to digital converter (ADC) circuit to pre-charge the ADC circuit during the first phase; and a second set of switches to selectively invert a polarity of the outputs of the first output stage differential amplifier circuit relative to the inputs of the ADC circuit during alternate successive second phases.

In Example 44, the subject matter of any one or more of Examples 41-43 optionally include an input stage differential amplifier circuit cascaded with the first output stage differential amplifier circuit to amplify an input differential signal prior to being input to the first output stage differential amplifier circuit.

In Example 45, the subject matter of Example 44 optionally includes wherein the inputs of the first output stage differential amplifier circuit are selectively coupled with and decoupled from corresponding outputs of the input stage differential amplifier circuit periodically during both the first phase and the second phase.

In Example 46, the subject matter of Example 45 optionally includes an input chopper circuit including: a set of unity gain buffer circuits selectively coupled with respective capacitive gain amplifier circuit inputs, the capacitive gain amplifier circuit inputs collectively forming a differential capacitive gain amplifier circuit input: and a set of chopper switches to selectively communicatively couple an alternative one of each of the unity gain buffer circuits and the respective capacitive gain amplifier circuit inputs with alternating inputs of the input stage differential amplifier circuit during successive second phases.

In Example 47, the subject matter of any one or more of Examples 44-46 optionally include a set of feedback capacitors, selectively switched in between respective inputs of the input stage differential amplifier circuit and respective outputs of the first output stage differential amplifier circuit except during alternating first phases when the set of feedback capacitors is selectively switched out from respective outputs of the first output stage differential amplifier circuit.

In Example 48, the subject matter of any one or more of Examples 44-47 optionally include a first pair of input capacitors having an output end coupled with a first of a set of inputs of the input stage differential amplifier circuit; a second pair of input capacitors having an output end coupled with a second of the set of inputs of the input stage differential amplifier circuit; and a third set of switches to selectively couple an input end of a first of each of the first and second pairs of input capacitors with one differential input of the capacitive gain amplifier circuit and to selectively couple an input end of a second of each of the first and second pairs of input capacitors with another differential input of the capacitive gain amplifier circuit to sample a common mode input voltage by the set of inputs of the input stage differential amplifier circuit during the first phase, and to selectively couple the input end of both of the first pair of input capacitors with one differential input of the capacitive gain amplifier circuit and to selectively couple the input end of both of the second pair of input capacitors with another differential input of the capacitive gain amplifier circuit during the second phase.

Example 49 is a method of capacitive gain amplification using a first output stage differential amplifier circuit and a second output stage differential amplifier circuit, the method comprising: switching in a first set of Miller capacitors between respective outputs and respective inputs of the first output stage differential amplifier circuit during a first phase that resets the first output stage differential amplifier circuit; switching in a second set of Miller capacitors between respective outputs and respective inputs of the first output stage differential amplifier circuit during a second phase that chops a signal being amplified by the first output stage differential amplifier circuit, the switching in of the second set of Miller capacitors being to alternating inputs of the first output stage differential amplifier circuit during successive second phases; and operating both the first output stage differential amplifier circuit and the second output stage differential amplifier circuit during the second phase, the second output stage differential amplifier circuit having inputs selectively coupled with the inputs of the first output stage differential amplifier circuit and a set of outputs selectively coupled with the outputs of the first output stage differential amplifier circuit during the second phase.

In Example 50, the subject matter of Example 49 optionally includes switching out the second set of Miller capacitors from respective outputs and respective inputs of the first output stage differential amplifier circuit during the first phase to retain electrical charge on the second set of Miller capacitors between successive second phases; and switching out the first set of Miller capacitors from respective outputs and respective inputs of the first output stage differential amplifier circuit during the second phase to retain electrical charge on the first set of Miller capacitors between successive first phases.

In Example 51, the subject matter of Example 50 optionally includes selectively coupling the output sides of the second set of Miller capacitors and the second output stage differential amplifier circuit with respective inputs of an analog to digital converter (ADC) circuit by a first set of switches of an output de-chopper circuit while the second set of Miller capacitors is coupled between respective inputs and outputs of the second output stage differential amplifier circuit to pre-charge the ADC circuit during the first phase, the output de-chopper circuit cascaded with the first output stage differential amplifier circuit; and selectively inverting a polarity of the outputs of the first output stage differential amplifier circuit relative to the inputs of the ADC circuit during alternate successive second phases by a second set of switches of the output de-chopper circuit.

In Example 52, the subject matter of Example 51 optionally includes selectively coupling outputs of the second output stage differential amplifier circuit with respective inputs of the ADC circuit; pre-charging the ADC circuit by the second output stage differential amplifier circuit during a pre-charge portion of the second phase; and decoupling the outputs of the second output stage differential amplifier circuit from the inputs of the ADC circuit during a settling portion of the second phase.

In Example 53, the subject matter of any one or more of Examples 49-52 optionally include amplifying an input differential signal prior to being input to the output stage differential amplifier circuit by an input stage differential amplifier circuit cascaded with the output stage differential amplifier circuit.

In Example 54, the subject matter of Example 53 optionally includes coupling inputs of the first output stage differential amplifier circuit with respective outputs of the input stage differential amplifier circuit during a fine settling portion of the second phase; and decoupling the inputs of the first output stage differential amplifier circuit from the outputs of the input stage differential amplifier circuit during the first phase.

In Example 55, the subject matter of Example 54 optionally includes selectively coupling a set of input capacitors between respective inputs of the input stage differential circuit and respective outputs of unity gain buffer circuits during the first phase, the unity gain buffer circuits receiving input from respective capacitive gain amplifier circuit inputs collectively forming a differential capacitive gain amplifier circuit input; charging the set of input capacitors by the respective unity gain buffer circuits during the first phase; and selectively communicatively coupling an alternative one of the unity gain buffer circuits and the respective capacitive gain amplifier circuit inputs with alternating inputs of the input stage differential amplifier circuit during successive second phases by a set of chopper switches.

In Example 56, the subject matter of any one or more of Examples 54-55 optionally include selectively switching in a set of feedback capacitors between respective inputs of the input stage differential amplifier circuit and respective outputs of the first output stage differential amplifier circuit except during alternating first phases; and during the alternating first phases, selectively switching out the set of feedback capacitors from respective outputs of the first output stage differential amplifier circuit.

In Example 57, the subject matter of Example 56 optionally includes decoupling the outputs of the first output stage differential amplifier circuit from an analog to digital converter (ADC) circuit and pre-charging the ADC circuit by a second output stage differential amplifier circuit during the first phase, the second output stage differential amplifier circuit having inputs respectively coupled with the input side of the second set of Miller capacitors and having outputs respectively coupled with a corresponding output side of the second set of Miller capacitors during the first phase; and coupling the outputs of the first output stage differential amplifier circuit with an impedance network at an input of the ADC circuit and decoupling the second output stage differential amplifier circuit from the ADC circuit during the second phase.

In Example 58, the subject matter of any one or more of Examples 53-57 optionally include selectively coupling an input end of a first of each of a first pair of input capacitors and a second pair of input capacitors with one differential input of the capacitive gain amplifier circuit and selectively coupling an input end of a second of each of the first and second pairs of input capacitors with another differential input of the capacitive gain amplifier circuit to sample a common mode input voltage by the set of inputs of the input stage differential amplifier circuit during the first phase; and selectively coupling the input end of both of the first pair of input capacitors with one differential input of the capacitive gain amplifier circuit and selectively coupling the input end of both of the second pair of input capacitors with another differential input of the capacitive gain amplifier circuit during the second phase.

Example 59 is a capacitive gain amplifier circuit, comprising: a first output stage differential amplifier circuit, including a pair of inputs and a pair of outputs; a first pair of Miller capacitors, selectively switched in between respective outputs and respective inputs of the first output stage differential amplifier circuit during a first phase that resets the first output stage differential amplifier circuit, and selectively switched out from respective outputs and respective inputs of the first output stage differential amplifier circuit during a second phase to retain electrical charge on the first pair of Miller capacitors between successive first phases; a second pair of Miller capacitors, selectively switched in between respective outputs and respective inputs of the first output stage differential amplifier circuit during a separate second phase that chops a signal being amplified by the first output stage differential amplifier circuit, the second pair of Miller capacitors being selectively switched in to alternating inputs of the first output stage differential amplifier circuit during successive second phases in correspondence with the chopping of the signal being amplified by the first output stage differential amplifier circuit, and selectively switched out from respective outputs and respective inputs of the first output stage differential amplifier circuit during the first phase to retain electrical charge on the second pair of Miller capacitors between successive second phases; and a second output stage differential amplifier circuit, including a set of inputs selectively coupled with the inputs of the first output stage differential amplifier circuit and a set of outputs selectively coupled with the outputs of the first output stage differential amplifier circuit during the second phase.

In Example 60, the subject matter of Example 59 optionally includes an output de-chopper circuit cascaded with the outputs of the first output stage differential amplifier circuit, the output de-chopper circuit including: a first set of switches to selectively couple the output sides of the second pair of Miller capacitors and the second output stage differential amplifier circuit with inputs of an analog to digital converter (ADC) circuit to pre-charge the ADC circuit during the first phase; and a second pair of switches to selectively invert a polarity of the outputs of the first output stage differential amplifier circuit relative to the inputs of the ADC circuit during alternate successive second phases.

Example 61 is a capacitive gain amplifier circuit to amplify an input signal by a pair of differential amplifier circuits coupled in series, the capacitive gain amplifier comprising: a first differential amplifier circuit, including a set of inputs and a set of outputs; a second differential amplifier circuit, including a set of inputs and a set of outputs; a first set of switches to selectively disconnect the second differential amplifier circuit from the first differential amplifier circuit during a first phase that resets the first differential amplifier circuit, and selectively connect the second differential amplifier circuit with the first differential amplifier circuit in series during a second phase that amplifies a signal by the first differential amplifier circuit and the second differential amplifier circuit together in series; and a set of feedback capacitors, selectively switched in between respective outputs of the second differential amplifier circuit and respective inputs of the first differential amplifier circuit during the second phase.

In Example 62, the subject matter of Example 61 optionally includes a second set of switches to couple the set of outputs of the second differential amplifier circuit with a set of inputs of an ADC circuit to at least partially charge the set of inputs of the ADC circuit during the first phase.

In Example 63, the subject matter of any one or more of Examples 61-62 optionally include a set of input capacitors; and a third set of switches to selectively switch the set of input capacitors in between respective inputs of the first differential amplifier circuit and respective inputs of the capacitive gain amplifier circuit during the second phase, and selectively switch the set of input capacitors in between the respective inputs of the first differential amplifier circuit and a common-mode input voltage source during the first phase.

In Example 64, the subject matter of any one or more of Examples 61-63 optionally include a first pair of input capacitors having an output end coupled with a first of the set of inputs of the first differential amplifier circuit; a second pair of input capacitors having an output end coupled with a second of the set of inputs of the first differential amplifier circuit; and a third set of switches to selectively couple an input end of a first of each of the first and second pairs of input capacitors with one differential input of the capacitive gain amplifier circuit and to selectively couple an input end of a second of each of the first and second pairs of input capacitors with another differential input of the capacitive gain amplifier circuit to sample a common mode input voltage by the set of inputs of the first differential amplifier circuit during the first phase, and to selectively couple the input end of both of the first pair of input capacitors with one differential input of the capacitive gain amplifier circuit and to selectively couple the input end of both of the second pair of input capacitors with another differential input of the capacitive gain amplifier circuit during the second phase.

In Example 65, the subject matter of any one or more of Examples 61-64 optionally include a set of Miller capacitors configured to couple between respective outputs and respective inputs of the second differential amplifier circuit.

In Example 66, the subject matter of Example 65 optionally includes a first chopper circuit coupled between the set of outputs of the first differential amplifier circuit and an input side of the set of Miller capacitors; and a second chopper circuit coupled between an output side of the set of Miller capacitors and respective output sides of the set of feedback capacitors.

In Example 67, the subject matter of Example 66 optionally includes a fourth set of switches to connect an output side of the set of feedback capacitors to a common-mode output voltage source instead of the respective output sides of the set of Miller capacitors during the first phase.

In Example 68, the subject matter of any one or more of Examples 61-67 optionally include an impedance network disposed between the set of outputs of the second differential amplifier circuit and corresponding inputs of an ADC circuit during the second phase.

In Example 69, the subject matter of any one or more of Examples 61-68 optionally include a fifth set of switches to respectively couple the set of outputs of the first differential amplifier circuit with the set of inputs of the first differential amplifier circuit to configure the first differential amplifier circuit as a unity gain amplifier during the first phase.

In Example 70, the subject matter of any one or more of Examples 61-69 optionally include a third chopper circuit coupled between a set of inputs of the capacitive gain amplifier circuit and the set of inputs of the first differential amplifier circuit; and a fourth chopper circuit coupled between the respective output sides of the set of feedback capacitors and a set of inputs of an ADC circuit; wherein the third chopper circuit and the fourth chopper circuit are configured to alternate a differential signal polarity of the capacitive gain amplifier circuit relative to the ADC circuit during alternating second phases.

Example 71 is a method of capacitive gain amplification using a first differential amplifier circuit selectively coupled in series with a second differential amplifier circuit, the method comprising: selectively disconnecting the second differential amplifier circuit from the first differential amplifier circuit by a first set of switches during a first phase that resets the first differential amplifier circuit; selectively connecting the second differential amplifier circuit with the first differential amplifier circuit in series by the first set of switches during a second phase that amplifies a signal by the first differential amplifier circuit and the second differential amplifier circuit together in series; and selectively switching in a set of feedback capacitors between respective outputs of the second differential amplifier circuit and respective inputs of the first differential amplifier circuit during the second phase.

In Example 72, the subject matter of Example 71 optionally includes at least partially charging a set of inputs of an analog to digital converter (ADC) circuit during the first phase by coupling the outputs of the second differential amplifier circuit with the inputs of the ADC circuit by a second set of switches.

In Example 73, the subject matter of any one or more of Examples 71-72 optionally include selectively switching inputs to a set of input capacitors coupled with respective inputs of the first differential amplifier circuit to provide a common mode input voltage to the inputs of the first differential amplifier circuit during the first phase and to provide a differential input voltage from respective inputs of the capacitive gain amplifier circuit to the inputs of the first differential amplifier circuit during the second phase.

In Example 74, the subject matter of any one or more of Examples 71-73 optionally include wherein the second differential amplifier circuit includes a set of Miller capacitors configured to couple between respective outputs and respective inputs of the second differential amplifier circuit, further comprising swapping the set of Miller capacitors relative to a differential signal polarity of the first differential amplifier circuit during alternating second phases by a first chopper circuit coupled between the outputs of the first differential amplifier circuit and an input side of the set of Miller capacitors and a second chopper circuit coupled between the outputs of the second differential amplifier circuit and an output side of the set of Miller capacitors.

In Example 75, the subject matter of Example 74 optionally includes connecting an output side of the set of feedback capacitors to a common-mode output voltage source instead of the respective outputs of the second differential amplifier circuit by a fourth set of switches during the first phase.

In Example 76, the subject matter of any one or more of Examples 71-75 optionally include band-limiting noise output from the second differential amplifier circuit by an impedance network disposed between the second differential amplifier circuit and inputs of an ADC circuit during the second phase.

In Example 77, the subject matter of any one or more of Examples 71-76 optionally include configuring the first differential amplifier circuit as a unity gain amplifier by a fifth set of switches to respectively couple the set of outputs of the first differential amplifier circuit with the set of inputs of the first differential amplifier circuit during the first phase.

Example 78 is a capacitive gain amplifier circuit to amplify an input signal by a pair of differential amplifier circuits coupled in series, the capacitive gain amplifier circuit comprising: a first differential amplifier circuit, including a set of inputs and a set of outputs; a second differential amplifier circuit, including a set of inputs and a set of outputs; a set of input capacitors coupled with respective inputs of the first differential amplifier circuit, the set of input capacitors having inputs selectively switched to provide a common mode input voltage to the set of inputs of the first differential amplifier circuit during a first phase that resets the first differential amplifier circuit, and to provide a differential input voltage from respective inputs of the capacitive gain amplifier circuit to the set of inputs of the first differential amplifier circuit during a second phase that amplifies a signal by the first differential amplifier circuit and the second differential amplifier circuit together in series; a set of feedback capacitors, selectively switched in between respective outputs of the second differential amplifier circuit and respective inputs of the first differential amplifier circuit during the second phase; a set of Miller capacitors configured to couple between respective outputs and respective inputs of the second differential amplifier circuit; a first chopper circuit coupled between the set of outputs of the first differential amplifier circuit and an input side of the set of Miller capacitors to: selectively disconnect the set of inputs of the second differential amplifier circuit from the set of outputs of the first differential amplifier circuit during the first phase; selectively connect the set of inputs of the second differential amplifier circuit with the set of outputs of the first differential amplifier circuit during the second phase; and swap the set of Miller capacitors relative to a differential signal polarity of the first differential amplifier circuit during alternating second phases; a second chopper circuit coupled between an output side of the set of Miller capacitors and respective output sides of the set of feedback capacitors to: selectively disconnect the set of outputs of the second differential amplifier circuit from the respective output sides of the set of feedback capacitors during the first phase; selectively connect the set of outputs of the second differential amplifier circuit with the respective output sides of the set of feedback capacitors during the second phase; and swap the set of Miller capacitors relative to a differential signal polarity of the first differential amplifier circuit during alternating second phases; and a set of first switches to couple the set of outputs of the second differential amplifier circuit with a set of inputs of an analog to digital converter (ADC) circuit to at least partially charge the set of inputs of the ADC circuit during the first phase.

In Example 79, the subject matter of Example 78 optionally includes a switchable feedback path to respectively couple the set of outputs of the first differential amplifier circuit with the set of inputs of the first differential amplifier circuit to configure the first differential amplifier circuit as a unity gain amplifier during the first phase.

In Example 80, the subject matter of any one or more of Examples 78-79 optionally include a set of second switches to connect an output side of the set of feedback capacitors to a common-mode output voltage source instead of the respective outputs of the second differential amplifier circuit during the first phase.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A capacitive gain amplifier circuit to amplify an input signal by a pair of differential amplifier circuits coupled in parallel, the capacitive gain amplifier circuit comprising:
    a first output stage differential amplifier circuit, including a set of inputs and a set of outputs;
    a first set of Miller capacitors, selectively switched in between respective outputs and respective inputs of the first output stage differential amplifier circuit during a first phase that resets the first output stage differential amplifier circuit;
    a second set of Miller capacitors, selectively switched in between respective outputs and respective inputs of the first output stage differential amplifier circuit during a second phase that chops a signal being amplified by the first output stage differential amplifier circuit, the second set of Miller capacitors being selectively switched in to alternating inputs of the first output stage differential amplifier circuit during successive second phases; and
    a second output stage differential amplifier circuit, including a set of inputs selectively coupled with the inputs of the first output stage differential amplifier circuit and a set of outputs selectively coupled with the outputs of the first output stage differential amplifier circuit during the second phase.

2. The capacitive gain amplifier circuit of claim 1, wherein:
the second set of Miller capacitors is selectively switched out from respective outputs and respective inputs of the first output stage differential amplifier circuit during the first phase to retain electrical charge on the second set of Miller capacitors between successive second phases; and
the first set of Miller capacitors is selectively switched out from respective outputs and respective inputs of the first output stage differential amplifier circuit during the second phase to retain electrical charge on the first set of Miller capacitors between successive first phases.

3. The capacitive gain amplifier circuit of claim 2, further comprising an output de-chopper circuit cascaded with the outputs of the first output stage differential amplifier circuit, the output de-chopper circuit including:
a first set of switches to selectively couple the output sides of the second set of Miller capacitors and the second output stage differential amplifier circuit with inputs of an analog to digital converter (ADC) circuit to pre-charge the ADC circuit during the first phase; and
a second set of switches to selectively invert a polarity of the outputs of the first output stage differential amplifier circuit relative to the inputs of the ADC circuit during alternate successive second phases.

4. The capacitive gain amplifier circuit of claim 1, further comprising an input stage differential amplifier circuit cascaded with the first output stage differential amplifier circuit to amplify an input differential signal prior to being input to the first output stage differential amplifier circuit.

5. The capacitive gain amplifier circuit of claim 4, wherein the inputs of the first output stage differential amplifier circuit are selectively coupled with and decoupled from corresponding outputs of the input stage differential amplifier circuit periodically during both the first phase and the second phase.

6. The capacitive gain amplifier circuit of claim 5, further comprising an input chopper circuit including:
a set of unity gain buffer circuits selectively coupled with respective capacitive gain amplifier circuit inputs, the capacitive gain amplifier circuit inputs collectively forming a differential capacitive gain amplifier circuit input; and
a set of chopper switches to selectively communicatively couple an alternative one of each of the unity gain buffer circuits and the respective capacitive gain amplifier circuit inputs with alternating inputs of the input stage differential amplifier circuit during successive second phases.

7. The capacitive gain amplifier circuit of claim 4, further comprising a set of feedback capacitors, selectively switched in between respective inputs of the input stage differential amplifier circuit and respective outputs of the first output stage differential amplifier circuit except during alternating first phases when the set of feedback capacitors is selectively switched out from respective outputs of the first output stage differential amplifier circuit.

8. The capacitive gain amplifier circuit of claim 4, further comprising:
a first pair of input capacitors having an output end coupled with a first of a set of inputs of the input stage differential amplifier circuit;
a second pair of input capacitors having an output end coupled with a second of the set of inputs of the input stage differential amplifier circuit; and
a third set of switches to selectively couple an input end of a first of each of the first and second pairs of input capacitors with one differential input of the capacitive gain amplifier circuit and to selectively couple an input end of a second of each of the first and second pairs of input capacitors with another differential input of the capacitive gain amplifier circuit to sample a common mode input voltage by the set of inputs of the input stage differential amplifier circuit during the first phase, and to selectively couple the input end of both of the first pair of input capacitors with one differential input of the capacitive gain amplifier circuit and to selectively couple the input end of both of the second pair of input capacitors with another differential input of the capacitive gain amplifier circuit during the second phase.

9. A method of capacitive gain amplification to amplify an input signal by a pair of differential amplifier circuits coupled in parallel, the method comprising:
switching in a first set of Miller capacitors between respective outputs and respective inputs of the first output stage differential amplifier circuit during a first phase that resets the first output stage differential amplifier circuit;
switching in a second set of Miller capacitors between respective outputs and respective inputs of the first output stage differential amplifier circuit during a second phase that chops a signal being amplified by the first output stage differential amplifier circuit, the switching in of the second set of Miller capacitors being to alternating inputs of the first output stage differential amplifier circuit during successive second phases; and
operating both the first output stage differential amplifier circuit and the second output stage differential amplifier circuit during the second phase, the second output stage differential amplifier circuit having inputs selectively coupled with the inputs of the first output stage differential amplifier circuit and a set of outputs selectively coupled with the outputs of the first output stage differential amplifier circuit during the second phase.

10. The method of claim 9, further comprising:
switching out the second set of Miller capacitors from respective outputs and respective inputs of the first output stage differential amplifier circuit during the first phase to retain electrical charge on the second set of Miller capacitors between successive second phases; and
switching out the first set of Miller capacitors from respective outputs and respective inputs of the first output stage differential amplifier circuit during the second phase to retain electrical charge on the first set of Miller capacitors between successive first phases.

11. The method of claim 10, further comprising:
selectively coupling the output sides of the second set of Miller capacitors and the second output stage differential amplifier circuit with respective inputs of an analog to digital converter (ADC) circuit by a first set of switches of an output de-chopper circuit while the second set of Miller capacitors is coupled between respective inputs and outputs of the second output stage differential amplifier circuit to pre-charge the ADC circuit during the first phase, the output de-chopper circuit cascaded with the first output stage differential amplifier circuit; and selectively inverting a polarity of the outputs of the first output stage differential amplifier circuit relative to the inputs of the ADC circuit during alternate successive second phases by a second set of switches of the output de-chopper circuit.

12. The method of claim 11, further comprising:

selectively coupling outputs of the second output stage differential amplifier circuit with respective inputs of the ADC circuit;

pre-charging the ADC circuit by the second output stage differential amplifier circuit during a pre-charge portion of the second phase; and decoupling the outputs of the second output stage differential amplifier circuit from the inputs of the ADC circuit during a settling portion of the second phase.

13. The method of claim 9, further comprising amplifying an input differential signal prior to being input to the output stage differential amplifier circuit by an input stage differential amplifier circuit cascaded with the output stage differential amplifier circuit.

14. The method of claim 13, further comprising:

coupling inputs of the first output stage differential amplifier circuit with respective outputs of the input stage differential amplifier circuit during a fine settling portion of the second phase; and decoupling the inputs of the first output stage differential amplifier circuit from the outputs of the input stage differential amplifier circuit during the first phase.

15. The method of claim 14, further comprising:

selectively coupling a set of input capacitors between respective inputs of the input stage differential circuit and respective outputs of unity gain buffer circuits during the first phase, the unity gain buffer circuits receiving input from respective capacitive gain amplifier circuit inputs collectively forming a differential capacitive gain amplifier circuit input;

charging the set of input capacitors by the respective unity gain buffer circuits during the first phase; and selectively communicatively coupling an alternative one of the unity gain buffer circuits and the respective capacitive gain amplifier circuit inputs with alternating inputs of the input stage differential amplifier circuit during successive second phases by a set of chopper switches.

16. The method of claim 14, further comprising:

selectively switching in a set of feedback capacitors between respective inputs of the input stage differential amplifier circuit and respective outputs of the first output stage differential amplifier circuit except during alternating first phases; and during the alternating first phases, selectively switching out the set of feedback capacitors from respective outputs of the first output stage differential amplifier circuit.

17. The method of claim 16, further comprising:

decoupling the outputs of the first output stage differential amplifier circuit from an analog to digital converter (ADC) circuit and pre-charging the ADC circuit by a second output stage differential amplifier circuit during the first phase, the second output stage differential amplifier circuit having inputs respectively coupled with the input side of the second set of Miller capacitors and having outputs respectively coupled with a corresponding output side of the second set of Miller capacitors during the first phase; and coupling the outputs of the first output stage differential amplifier circuit with an impedance network at an input of the ADC circuit and decoupling the second output stage differential amplifier circuit from the ADC circuit during the second phase.

18. The method of claim 13, further comprising:

selectively coupling an input end of a first of each of a first pair of input capacitors and a second pair of input capacitors with one differential input of the capacitive gain amplifier circuit and selectively coupling an input end of a second of each of the first and second pairs of input capacitors with another differential input of the capacitive gain amplifier circuit to sample a common mode input voltage by the set of inputs of the input stage differential amplifier circuit during the first phase; and selectively coupling the input end of both of the first pair of input capacitors with one differential input of the capacitive gain amplifier circuit and selectively coupling the input end of both of the second pair of input capacitors with another differential input of the capacitive gain amplifier circuit during the second phase.

19. A capacitive gain amplifier circuit, comprising:

a first output stage differential amplifier circuit, including a pair of inputs and a pair of outputs;

a first pair of Miller capacitors, selectively switched in between respective outputs and respective inputs of the first output stage differential amplifier circuit during a first phase that resets the first output stage differential amplifier circuit, and selectively switched out from respective outputs and respective inputs of the first output stage differential amplifier circuit during a second phase to retain electrical charge on the first pair of Miller capacitors between successive first phases;

a second pair of Miller capacitors, selectively switched in between respective outputs and respective inputs of the first output stage differential amplifier circuit during a separate second phase that chops a signal being amplified by the first output stage differential amplifier circuit, the second pair of Miller capacitors being selectively switched in to alternating inputs of the first output stage differential amplifier circuit during successive second phases in correspondence with the chopping of the signal being amplified by the first output stage differential amplifier circuit, and selectively switched out from respective outputs and respective inputs of the first output stage differential amplifier circuit during the first phase to retain electrical charge on the second pair of Miller capacitors between successive second phases; and a second output stage differential amplifier circuit, including a set of inputs selectively coupled with the inputs of the first output stage differential amplifier circuit and a set of outputs selectively coupled with the outputs of the first output stage differential amplifier circuit during the second phase.

20. The capacitive gain amplifier circuit of claim 19, further comprising an output de-chopper circuit cascaded with the outputs of the first output stage differential amplifier circuit, the output de-chopper circuit including:

a first set of switches to selectively couple the output sides of the second pair of Miller capacitors and the second output stage differential amplifier circuit with inputs of an analog to digital converter (ADC) circuit to pre-charge the ADC circuit during the first phase; and a second pair of switches to selectively invert a polarity of the outputs of the first output stage differential amplifier circuit relative to the inputs of the ADC circuit during alternate successive second phases.

* * * * *